US012707883B2

(12) United States Patent
Kim et al.

(10) Patent No.: US 12,707,883 B2
(45) Date of Patent: Aug. 11, 2026

(54) POLYCYCLIC COMPOUND, LIGHT EMITTING ELEMENT INCLUDING THE SAME, AND DISPLAY DEVICE INCLUDING THE SAME

(71) Applicant: Samsung Display Co., Ltd., Yongin-si (KR)

(72) Inventors: Seulong Kim, Cheonan-si (KR); Hajin Song, Hwaseong-si (KR); Jihwan Yoon, Yongin-si (KR); Jina Hur, Suwon-si (KR); Jaehoon Hwang, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 1015 days.

(21) Appl. No.: 17/901,519

(22) Filed: Sep. 1, 2022

(65) Prior Publication Data

US 2023/0189633 A1 Jun. 15, 2023

(30) Foreign Application Priority Data

Dec. 14, 2021 (KR) ........................ 10-2021-0178924

(51) Int. Cl.
*H10K 85/40* (2023.01)
*C07F 7/08* (2006.01)
(Continued)

(52) U.S. Cl.
CPC ............. *H10K 85/40* (2023.02); *C07F 7/081* (2013.01); *C07F 7/0814* (2013.01); *C09K 11/06* (2013.01);
(Continued)

(58) Field of Classification Search
None
See application file for complete search history.

(56) References Cited

U.S. PATENT DOCUMENTS 8,697,255 B2 4/2014 Langer et al.
9,780,317 B2 10/2017 Fuchiwaki et al.
(Continued)

FOREIGN PATENT DOCUMENTS

KR 10-2015-0090021 A 8/2015
KR 10-1558623 B1 10/2015
(Continued)

*Primary Examiner* — Gregory D Clark
(74) *Attorney, Agent, or Firm* — Womble Bond Dickinson (US) LLP

(57) ABSTRACT

A light emitting element that includes a first electrode, a first hole transport region on the first electrode, a first emission layer on the first hole transport region, a first electron transport region on the first emission layer, and a second electrode on the first electron transport region is provided. The first hole transport region includes a polycyclic compound represented by Formula 1 and a compound represented by Formula H-1:

Formula 1

(Continued)

-continued

Formula H-1

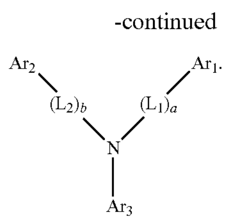

24 Claims, 11 Drawing Sheets

(51) Int. Cl.

| | |
|---|---|
| ***C09K 11/06*** | (2006.01) |
| *H10K 50/15* | (2023.01) |
| *H10K 85/60* | (2023.01) |
| *H10K 102/00* | (2023.01) |

(52) U.S. Cl.

CPC .... *C09K 2211/1018* (2013.01); *H10K 50/156* (2023.02); *H10K 85/615* (2023.02); *H10K 85/631* (2023.02); *H10K 85/6572* (2023.02); *H10K 2102/351* (2023.02)

(56) References Cited

U.S. PATENT DOCUMENTS

| | | | | |
|---|---|---|---|---|
| 10,777,747 | B2 | 9/2020 | Itoi et al. | |
| 11,818,953 | B2 | 11/2023 | Pak et al. | |
| 2003/0170491 | A1* | 9/2003 | Liao ....................... | H05B 45/60 257/88 |
| 2015/0270502 | A1* | 9/2015 | Fuchiwaki ............ | C07F 7/0812 548/445 |
| 2017/0330919 | A1* | 11/2017 | Lee ........................ | H10K 50/15 |
| 2021/0005814 | A1 | 1/2021 | Watabe et al. | |

FOREIGN PATENT DOCUMENTS

| | | | |
|---|---|---|---|
| KR | 10-2018-0064609 | A | 6/2018 |
| KR | 10-2021-0004874 | A | 1/2021 |
| KR | 20210107959 | A | 9/2021 |

* cited by examiner

POLYCYCLIC COMPOUND, LIGHT EMITTING ELEMENT INCLUDING THE SAME, AND DISPLAY DEVICE INCLUDING THE SAME

CROSS-REFERENCE TO RELATED APPLICATION

This application claims priority to and the benefit of Korean Patent Application No. 10-2021-0178924, filed on Dec. 14, 2021, the entire content of which is hereby incorporated by reference.

BACKGROUND

1. Field

Aspects of one or more embodiments of the present disclosure relate to a polycyclic compound, a light emitting element including the same, and a display device including the same, and for example, to a light emitting element including a plurality of materials such as a novel polycyclic compound utilized as a hole transport layer material.

2. Description of the Related Art

Recently, the development of an electroluminescence display device as an image display device is being actively conducted. Unlike a liquid crystal display device, etc., the luminescence display is a self-luminescent display in which holes and electrons injected from a first electrode and a second electrode recombine in an emission layer, and thus a luminescent material including an organic compound in the emission layer emits light to attain display.

In the application of a light emitting element to a display device, there is a desired for a light emitting element having low driving voltage, high luminous efficiency, and a long service life, and development of materials for a light emitting element capable of stably attaining such characteristics is being continuously sought.

For example, to develop a light emitting element having high efficiency and a long service life, development on materials for a hole transport region is being carried out.

SUMMARY

An aspect of one or more embodiments of the present disclosure is directed toward a light emitting element in which luminous efficiency and an element service life are improved (increased).

An aspect of one or more embodiments of the present disclosure is directed toward a novel polycyclic compound capable of improving luminous efficiency and an element service life of a light emitting element.

Additional aspects will be set forth in part in the description which follows and, in part, will be apparent from the description, or may be learned by practice of the presented embodiments of the disclosure.

An embodiment of the present disclosure provides a light emitting element including: a first electrode; a first hole transport region on the first electrode; a first emission layer disposed on the first hole transport region; a first electron transport region on the first emission layer; and a second electrode on the first electron transport region, wherein the first hole transport region includes a polycyclic compound represented by Formula 1 and a compound represented by Formula H-1:

Formula 1

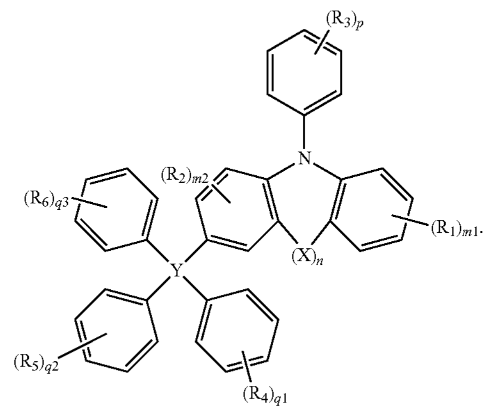

In Formula 1, X is a direct linkage, Y is C or Si, $R_1$ to $R_6$ may each independently be a hydrogen atom, a deuterium atom, a halogen atom, a substituted or unsubstituted silyl group, a substituted or unsubstituted amine group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, and/or are bonded to an adjacent group to form a ring, at least one $R_3$ may be a hydrogen atom or a saturated aliphatic hydrocarbon group having 1 to 20 carbon atoms, n may be 0 or 1, m1 may be an integer from 0 to 5, when m1+n is 5 or less, m2 may be an integer from 0 to 4, when m2+n is 4 or less, p may be an integer from 0 to 5, q1 to q3 may each independently be an integer from 0 to 5, when n is 1, Y may be Si, and each of $R_2$ and $R_4$ to $R_6$ may be a hydrogen atom, and when $R_1$ is an unsubstituted triphenylsilyl group, the embodiment in which $R_3$ is a hydrogen atom is excluded.

Formula H-1

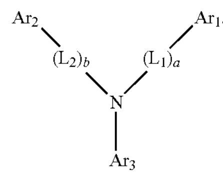

In Formula H-1, $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms, $Ar_3$ may be a substituted or unsubstituted aryl group having 6 to 30 ring-forming carbon atoms, $L_1$ and $L_2$ may each independently be a direct linkage, a substituted or unsubstituted arylene group having 6 to 30 ring-forming carbon atoms, or a substituted or unsubstituted heteroarylene group having 2 to 30 ring-forming carbon atoms, and a and b may each independently be an integer from 0 to 10.

In an embodiment, $R_3$ may be a hydrogen atom, a substituted or unsubstituted t-butyl group, a substituted or unsubstituted cycloalkyl group having 1 to 20 carbon atoms, or a substituted or unsubstituted adamantyl group.

In an embodiment, the polycyclic compound represented by Formula 1 may be represented by Formula 2:

Formula 2

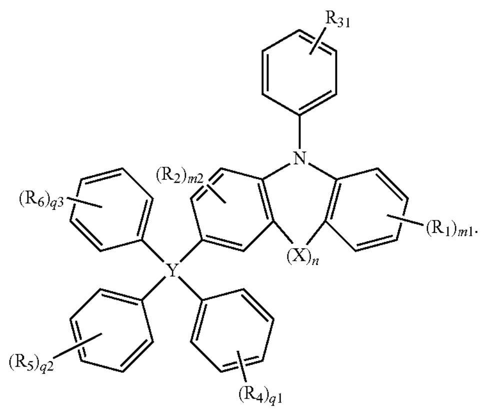

In Formula 2, $R_{31}$ may be a hydrogen atom or a saturated aliphatic hydrocarbon group having 1 to 20 carbon atoms, and in Formula 2, X, Y, $R_1$, $R_2$, $R_4$ to $R_6$, n, m1, m2, and q1 to q3 may each independently be the same as defined in Formula 1.

In an embodiment, the polycyclic compound represented by Formula 2 may be represented by Formula 2-1:

Formula 2-1

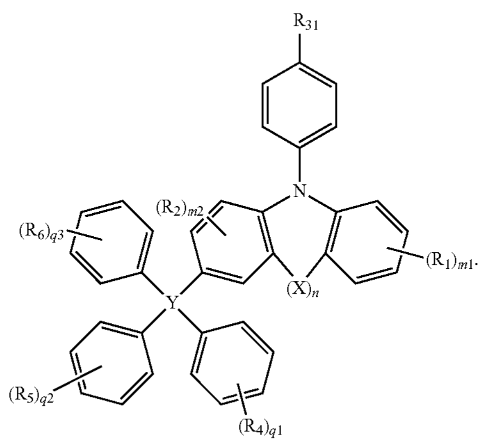

In Formula 2-1, X, Y, $R_1$, $R_2$, $R_4$ to $R_6$, n, m1, m2, and q1 to q3 may each independently be the same as defined in Formula 1, and $R_{31}$ may be the same as defined in Formula 2.

In an embodiment, $R_{31}$ may be a hydrogen atom, a substituted or unsubstituted t-butyl group, a substituted or unsubstituted cyclohexyl group, or a substituted or unsubstituted adamantyl group.

In an embodiment, the polycyclic compound represented by Formula 1 may be represented by Formula 3-1 or Formula 3-2:

Formula 3-1

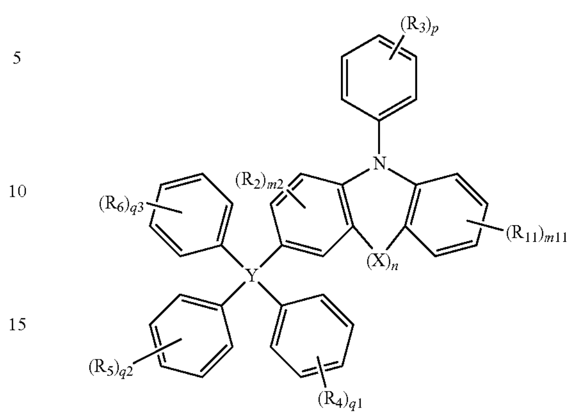

Formula 3-2

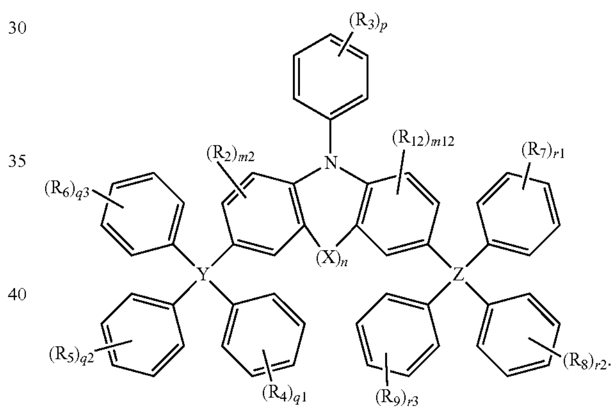

In Formula 3-1 and Formula 3-2, Z may be C or Si, $R_{11}$ and $R_{12}$ may each independently be a hydrogen atom or a saturated aliphatic hydrocarbon group having 1 to 20 carbon atoms, $R_7$ to $R_9$ may each independently be a hydrogen atom, a deuterium atom, a halogen atom, a substituted or unsubstituted silyl group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or are bonded to an adjacent group to form a ring, m11 may be an integer from 0 to 5, when m11+n is 5 or less, m12 may be an integer from 0 to 4, when m12+n is 4 or less, r1 to r3 may each independently be an integer from 0 to 5, and in Formula 3-1 and Formula 3-2, X, Y, $R_2$ to $R_6$, n, m2, p, and q1 to q3 may each independently be the same as defined in Formula 1.

In an embodiment, the polycyclic compound represented by Formula 1 may be represented by any one selected from among Formula 4-1 to Formula 4-6:

Formula 4-1

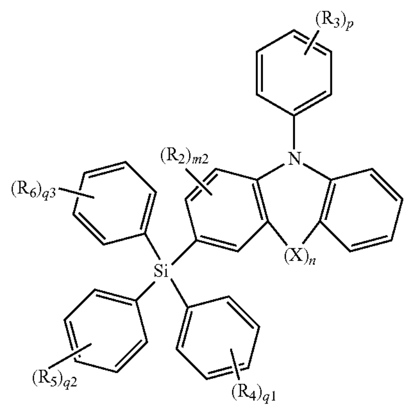

Fomrula 4-2

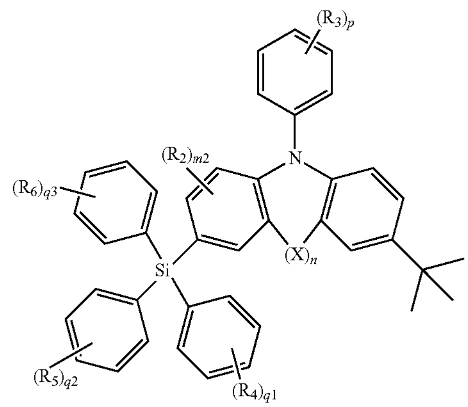

Formula 4-3

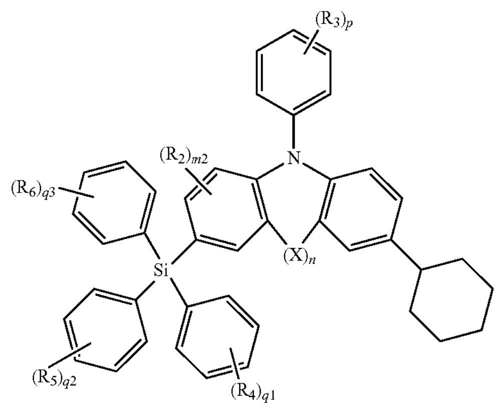

-continued

Formula 4-4

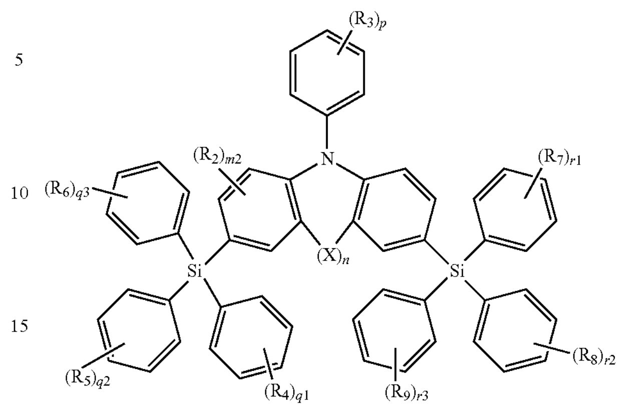

Formula 4-5

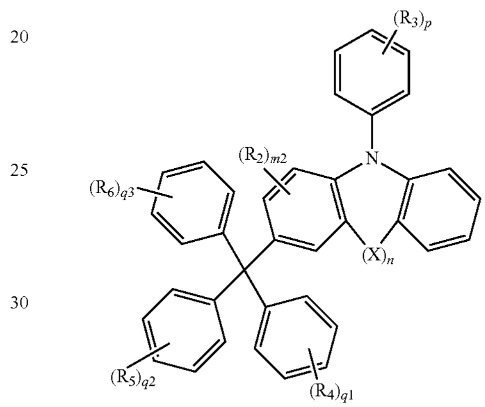

Formula 4-6

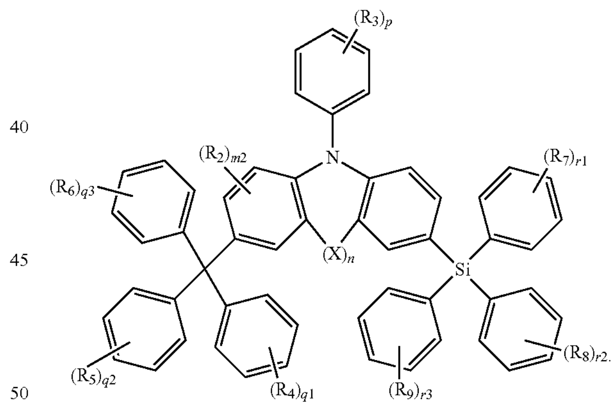

In Formula 4-1 to Formula 4-6, X, $R_2$ to $R_9$, n, m2, p, q1 to q3, and r1 to r3 may each independently be the same as defined in Formula 1, Formula 3-1, and Formula 3-2.

In an embodiment, each of $R_2$ to $R_9$ may be a hydrogen atom.

In an embodiment, the first hole transport layer may include a hole injection layer on the first electrode, a hole transport layer on the hole injection layer, and an electron blocking layer on the hole transport layer, and the hole transport layer may include the polycyclic compound represented by Formula 1.

In an embodiment, the hole transport layer may have a thickness of about 250 Å or more.

In an embodiment, the hole transport layer may have a refractive index of less than about 1.8.

In an embodiment, the emission layer may emit light having a center wavelength of about 430 nm to about 470 nm.

In an embodiment, the light emitting element may further include a second hole transport region between the first electron transport region and the second electrode, a second emission layer between the second hole transport region and the second electrode, and a second electron transport region between the second emission layer and the second electrode, and the second hole transport region may include the polycyclic compound represented by Formula 1.

In an embodiment, the second hole transport region may further include a compound represented by Formula H-1:

Formula H-1

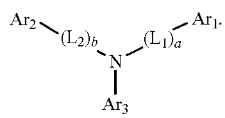

In Formula H-1, $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms, $Ar_3$ may be a substituted or unsubstituted aryl group having 6 to 30 ring-forming carbon atoms, $L_1$ and $L_2$ may each independently be a direct linkage, a substituted or unsubstituted arylene group having 6 to 30 ring-forming carbon atoms, or a substituted or unsubstituted heteroarylene group having 2 to 30 ring-forming carbon atoms, and a and b may each independently be an integer from 0 to 10.

In an embodiment of the present disclosure, a polycyclic compound may be represented by Formula 1:

Formula 1

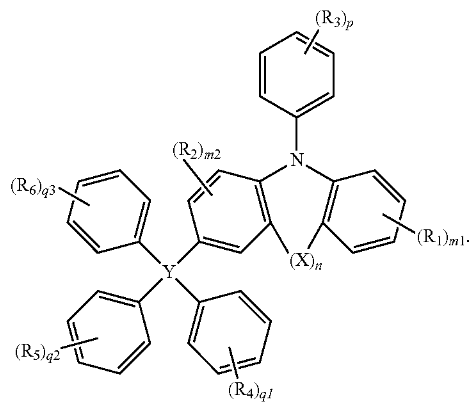

In Formula 1, X may be a direct linkage, Y may be C or Si, $R_1$ to $R_6$ may each independently be a hydrogen atom, a deuterium atom, a halogen atom, a substituted or unsubstituted silyl group, a substituted or unsubstituted amine group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, and/or are bonded to an adjacent group to form a ring, at least one $R_3$ may be a hydrogen atom or a saturated aliphatic hydrocarbon group having 1 to 20 carbon atoms, n may be 0 or 1, m1 may be an integer from 0 to 5, when m1+n is 5 or less, m2 may be an integer from 0 to 4, when m2+n is 4 or less, p is an integer from 0 to 5, q1 to q3 may each independently be an integer from 0 to 5, when n is 1, Y may be Si, and each of $R_2$ and $R_4$ to $R_6$ may be a hydrogen atom, and when $R_1$ is an unsubstituted triphenylsilyl group, the embodiment in which $R_3$ is a hydrogen atom is excluded.

In an embodiment of the present disclosure, a display device includes a plurality of light emitting elements, wherein each of the plurality of light emitting elements includes: a first electrode; a hole transport region on the first electrode; an emission layer on the hole transport region; an electron transport region disposed on the emission layer; and a second electrode disposed on the electron transport region, and the electron transport region includes a polycyclic compound represented by Formula 1 and a compound represented by Formula H-1:

Formula 1

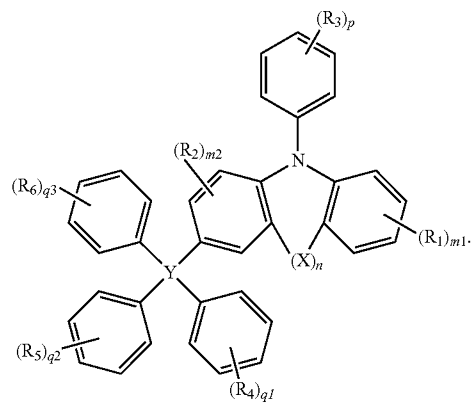

In Formula 1, X may be a direct linkage, Y may be C or Si, $R_1$ to $R_6$ may each independently be a hydrogen atom, a deuterium atom, a halogen atom, a substituted or unsubstituted silyl group, a substituted or unsubstituted amine group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, and/or are bonded to an adjacent group to form a ring, at least one $R_3$ may be a hydrogen atom or a saturated aliphatic hydrocarbon group having 1 to 20 carbon atoms, n may be 0 or 1, m1 may be an integer from 0 to 5, when m1+n is 5 or less, m2 may be an integer from 0 to 4, when m2+n is 4 or less, p may be an integer from 0 to 5, q1 to q3 may each independently be an integer from 0 to 5, when n is 1, Y may be Si, and each of $R_2$ and $R_4$ to $R_6$ may be a hydrogen atom, and when $R_1$ is an unsubstituted triphenylsilyl group, the embodiment in which $R_3$ is a hydrogen atom is excluded.

Formula H-1

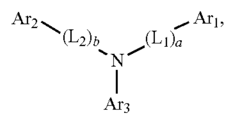

wherein, in Formula H-1, $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms, and $Ar_3$ may be a substituted or unsubstituted aryl group having 6 to 30 ring-forming carbon atoms, $L_1$ and $L_2$ may each independently be a direct linkage, a substituted or unsubstituted arylene group having 6 to 30 ring-forming carbon atoms, or a substituted or unsubstituted heteroarylene group having 2 to 30 ring-forming carbon atoms, a and b may each independently be an integer from 0 to 10.

BRIEF DESCRIPTION OF THE DRAWINGS

The accompanying drawings are included to provide a further understanding of the present disclosure, and are incorporated in and constitute a part of this specification. The drawings illustrate example embodiments of the present disclosure and, together with the description, serve to explain principles of the present disclosure. In the drawings.

DETAILED DESCRIPTION

Figure 1:
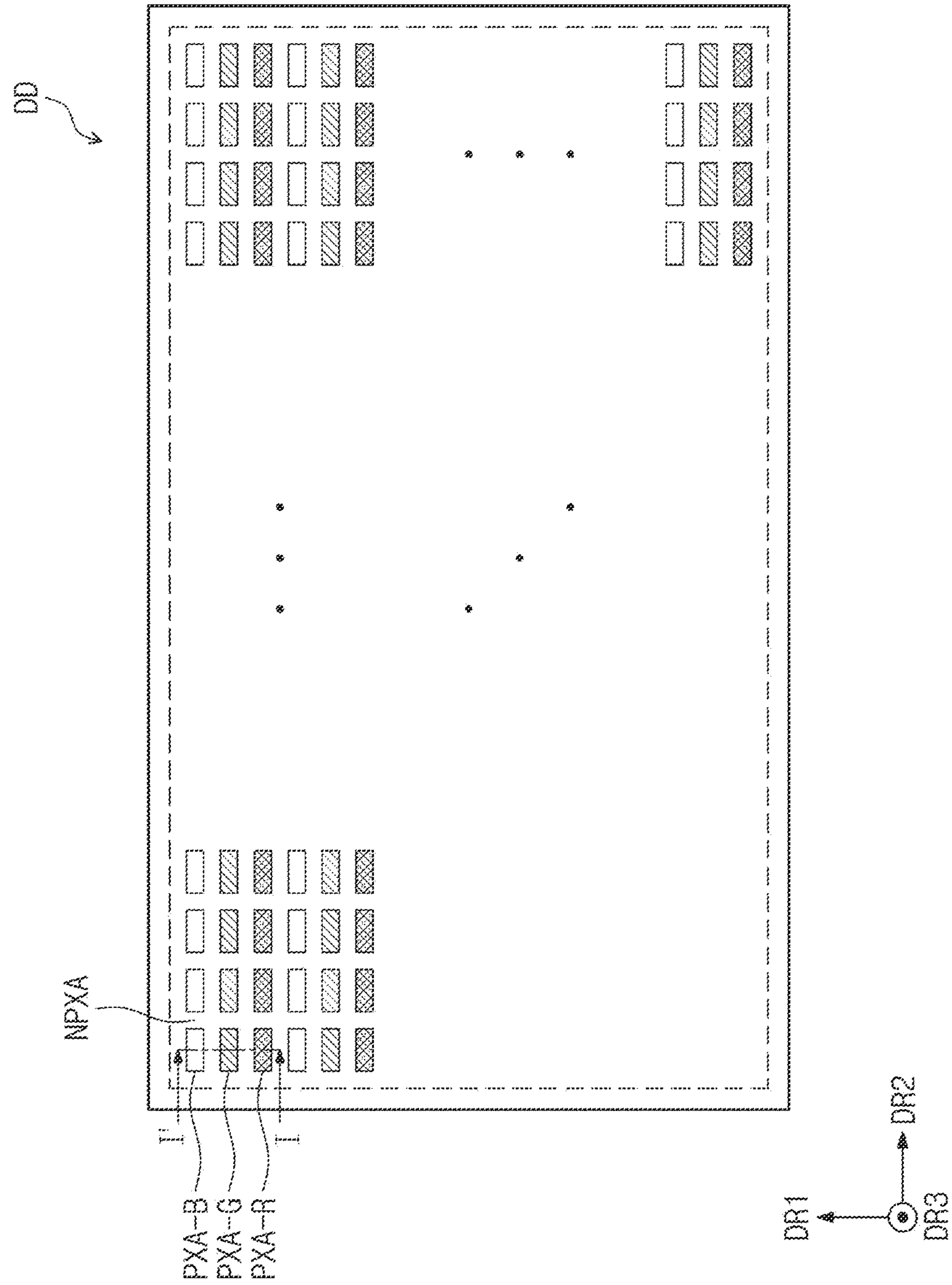
FIG. 1 is a plan view illustrating a display device according to an embodiment.

The present disclosure may be modified in many alternate forms, and thus specific embodiments will be exemplified in the drawings and described in more detail. It should be understood, however, that it is not intended to limit the present disclosure to the particular forms disclosed, but rather, is intended to cover all modifications, equivalents, and alternatives falling within the spirit and scope of the present disclosure.

When explaining each of drawings, like reference numerals are utilized for referring to like elements. In the accompanying drawings, the dimensions of each structure may be exaggeratingly illustrated for clarity of the present disclosure. It will be understood that, although the terms "first", "second", etc. may be utilized herein to describe one or more suitable components, these components should not be limited by these terms. These terms are only utilized to distinguish one component from another. For example, a first component could be termed a second component, and, similarly, a second component could be termed a first component, without departing from the scope of the present disclosure. As utilized herein, the singular forms, "a," "an," and "the" are intended to include the plural forms as well, unless the context clearly indicates otherwise.

In the present disclosure, it will be understood that the meaning of "comprise", "include" or "have" specifies the presence of a feature, a fixed number, a step, a process, an element, a component, or a combination thereof disclosed in the specification, but does not exclude the possibility of presence or addition of one or more other features, fixed numbers, steps, processes, elements, components, or combination thereof.

In the present disclosure, when a layer, a film, a region, or a plate is referred to as being "above" or "in an upper portion" another layer, film, region, or plate, it can be not only directly on the layer, film, region, or plate, but intervening layers, films, regions, or plates may also be present. In contrast, when a part such as a layer, a film, a region, or a plate is referred to as being "under" or "below" another part, it can be directly under the other part, or an intervening part may also be present. In some embodiments, in the disclosure, it will be understood that when a part is referred to as being disposed "on" another part, it may be disposed on an upper portion of the another part, or disposed on a lower portion of the another part as well.

In the disclosure, the term "substituted or unsubstituted" may refer to substituted or unsubstituted with at least one substituent selected from the group including (e.g., consisting of) a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkynyl group, an alkoxy group, a hydrocarbon ring group, an aryl group, and a heterocyclic group. In some embodiments, each of the substituents exemplified above may be substituted or unsubstituted. For example, a biphenyl group may be interpreted as an aryl group or a phenyl group substituted with a phenyl group.

In the disclosure, the phrase "bonded to an adjacent group to form a ring" may indicate that one is bonded to an adjacent group to form a substituted or unsubstituted hydrocarbon ring, or a substituted or unsubstituted heterocycle. The hydrocarbon ring may include an aliphatic hydrocarbon ring and an aromatic hydrocarbon ring. The heterocycle may include an aliphatic heterocycle and an aromatic heterocycle. The hydrocarbon ring and the heterocycle may be monocyclic or polycyclic. In some embodiments, the rings formed by being bonded to each other may be connected to another ring to form a spiro structure.

In the disclosure, the term "adjacent group" may refer to a substituent substituted for an atom which is directly linked to an atom substituted with a corresponding substituent, another substituent substituted for an atom which is substituted with a corresponding substituent, or a substituent sterically positioned at the nearest position to a corresponding substituent. For example, two methyl groups in 1,2-dimethylbenzene may be interpreted as "adjacent groups" to each other and two ethyl groups in 1,1-diethylcyclopentane may be interpreted as "adjacent groups" to each other. In some embodiments, two vinyl groups in 1,2-divinylbenzene may be interpreted as "adjacent groups" to each other.

In the disclosure, an aliphatic compound refers to a hydrocarbon compound except for an aromatic compound. The aliphatic compound may be a linear, branched, or cyclic type or kind. The aliphatic compound may include a saturated aliphatic compound and an unsaturated aliphatic compound.

In the disclosure, examples of the halogen atom may include a fluorine atom, a chlorine atom, a bromine atom, or an iodine atom.

In the disclosure, the alkyl group may be a linear, branched or cyclic type or kind. The number of carbons in the alkyl group is 1 to 50, 1 to 30, 1 to 20, 1 to 10, or 1 to 6. Examples of the alkyl group may include a methyl group, an ethyl group, an n-propyl group, an isopropyl group, an n-butyl group, an s-butyl group, a t-butyl group, an i-butyl group, a 2-ethylbutyl group, a 3,3-dimethylbutyl group, an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, a cyclohexyl group, a 4-methylcyclohexyl group, a 4-t-butylcyclohexyl group, an n-heptyl group, a 1-methylheptyl group, a 2,2-dimethylheptyl group, a 2-ethylheptyl group, a 2-butylheptyl group, an n-octyl group, a t-octyl group, a 2-ethyloctyl group, a 2-butyloctyl group, a 2-hexyloctyl group, a 3,7-dimethyloctyl group, a cyclooctyl group, an n-nonyl group, an n-decyl group, an adamantyl group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldocecyl group, a 2-octyldodecyl group, an n-tridecyl group, an n-tetradecyl group, an n-pentadecyl group, an n-hexadecyl group, a 2-ethylhexadecyl group, a 2-butylhexadecyl group, a 2-hexylhexadecyl group, a 2-octylhexadecyl group, an n-heptadecyl group, an n-octadecyl group, an n-nonadecyl group, an n-eicosyl group, a 2-ethyleicosyl group, a 2-butyleicosyl group, a 2-hexyleicosyl group, a 2-octyleicosyl group, an n-henicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, an n-triacontyl group, etc., but the embodiment of the present disclosure is not limited thereto.

In the disclosure, a cycloalkyl group may refer to a cyclic alkyl group. The number of carbons in the cycloalkyl group is 3 to 50, 3 to 30, 3 to 20, or 3 to 10. Examples of the cycloalkyl group may include a cyclopropyl group, a cyclobutyl group, a cyclopentyl group, a cyclohexyl group, a 4-methylcyclohexyl group, a 4-t-butylcyclohexyl group, a cycloheptyl group, a cyclooctyl group, a cyclononyl group, a cyclodecyl group, a norbornyl group, a 1-adamantyl group, a 2-adamantyl group, an isobornyl group, a bicycloheptyl group, etc., but the embodiment of the present disclosure is not limited thereto.

In the disclosure, the alkyl group may include an aryl alkyl group. The aryl alkyl group may refer to that an aryl group is bonded to the alkyl group defined above. Examples of the aryl alkyl group may include a toluyl group, a chrysyl group, a cumenyl group, a mesityl group, a benzyl group, a phenethyl group, a styryl group, etc., but the embodiment of the present disclosure is not limited thereto.

In the disclosure, an alkenyl group refers to a hydrocarbon group including at least one carbon double bond in the middle or terminal of an alkyl group having 2 or more carbon atoms. The alkenyl group may be linear or branched. The carbon number is not limited, but is 2 to 30, 2 to 20 or 2 to 10. Examples of the alkenyl group include a vinyl group, a 1-butenyl group, a 1-pentenyl group, a 1,3-butadienyl aryl group, a styrenyl group, a styrylvinyl group, etc., without limitation.

In the disclosure, an alkynyl group refers to a hydrocarbon group including at least one carbon triple bond in the middle or terminal of an alkyl group having 2 or more carbon atoms. The alkynyl group may be linear or branched. The carbon number is not limited, but is 2 to 30, 2 to 20 or 2 to 10. Examples of the alkynyl group include an ethynyl group, a propynyl group, etc., without limitation.

The hydrocarbon ring group herein refers to any functional group or substituent derived from an aliphatic hydrocarbon ring. The hydrocarbon ring group may be a saturated hydrocarbon ring group having 5 to 20 ring-forming carbon atoms.

In the disclosure, an aryl group refers to any functional group or substituent derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Examples of the aryl group may include a phenyl group, a naphthyl group, a fluorenyl group, an anthracenyl group, a phenanthryl group, a biphenyl group, a terphenyl group, a quaterphenyl group, a quinquephenyl group, a sexiphenyl group, a triphenylenyl group, a pyrenyl group, a benzofluoranthenyl group, a chrysenyl group, etc., but the embodiment of the present disclosure is not limited thereto.

In the disclosure, the fluorenyl group may be substituted, and two substituents may be bonded to each other to form a spiro structure. Examples of embodiments in which the fluorenyl group is substituted are as follows. However, the embodiment of the present disclosure is not limited thereto.

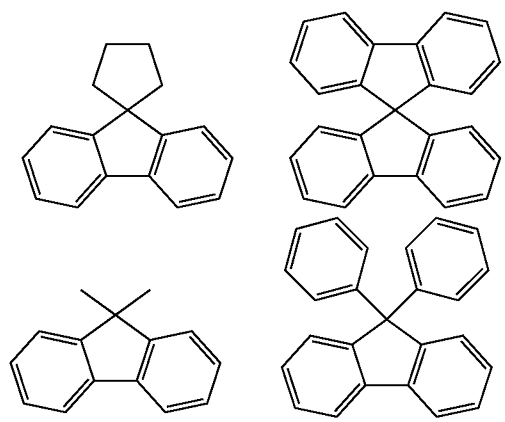

The heterocyclic group herein refers to any functional group or substituent derived from a ring including at least one of B, O, N, P, Si, or Se as a heteroatom. The heterocyclic group includes an aliphatic heterocyclic group and an aromatic heterocyclic group. The aromatic heterocyclic group may be a heteroaryl group. The aliphatic heterocycle and the aromatic heterocycle may be monocyclic or polycyclic.

In the disclosure, the heterocyclic group may include at least one of B, O, N, P, Si or S as a heteroatom. When the heterocyclic group includes two or more heteroatoms, the two or more heteroatoms may be the same as or different from each other. The heterocyclic group may be a monocyclic heterocyclic group or a polycyclic heterocyclic group and has the concept including (e.g., may include) a heteroaryl group. The number of ring-forming carbon atoms in the heterocyclic group may be 2 to 30, 2 to 20, or 2 to 10.

In the disclosure, the aliphatic heterocyclic group may include one or more selected from among B, O, N, P, Si, and S as a heteroatom. The number of ring-forming carbon atoms in the aliphatic heterocyclic group may be 2 to 30, 2 to 20, or 2 to 10. Examples of the aliphatic heterocyclic group may include an oxirane group, a thiirane group, a pyrrolidine group, a piperidine group, a tetrahydrofuran group, a tetrahydrothiophene group, a thiane group, a tetrahydropyran group, a 1,4-dioxane group, etc., but the embodiment of the present disclosure is not limited thereto.

The heteroaryl group herein may include at least one of B, O, N, P, Si, or S as a heteroatom. When the heteroaryl group contains two or more heteroatoms, the two or more heteroatoms may be the same as or different from each other. The heteroaryl group may be a monocyclic heteroaryl group or polycyclic heteroaryl group. The number of ring-forming carbon atoms in the heteroaryl group may be 2 to 30, 2 to 20, or 2 to 10. Examples of the heteroaryl group may include a thiophene group, a furan group, a pyrrole group, an imidazole group, a pyridine group, a bipyridine group, a triazine group, a triazole group, an acridyl group, a pyridazine group, a pyrazinyl group, a quinoline group, a quinazoline group, a quinoxaline group, a phenoxazine group, a phthalazine group, a pyrido pyridine group, a pyrido pyrazine group, a pyrazino pyrazine group, an isoquinoline group, an indole group, a carbazole group, an N-arylcarbazole group, an N-heteroarylcarbazole group, an N-alkylcarbazole group, a benzoxazole group, a benzimidazole group, a benzothiazole group, a benzocarbazole group, a benzothiophene group, a dibenzothiophene group, a thienothiophene group, a benzofuran group, a phenanthroline group, a thiazole group, an isoxazole group, an oxazole group, an oxadiazole group, a thiadiazole group, a phenothiazine group, a dibenzosilole group, a dibenzofuran group, etc., but the embodiment of the present disclosure is not limited thereto.

In the disclosure, the above description of the aryl group may be applied to an arylene group except that the arylene group is a divalent group. The above description of the heteroaryl group may be applied to a heteroarylene group except that the heteroarylene group is a divalent group.

In the description, the silyl group includes an alkylsilyl group and an arylsilyl group. Examples of the silyl group may include a trimethylsilyl group, a triethylsilyl group, a t-butyldimethylsilyl group, a triisopropylsilyl group, a vinyldimethylsilyl group, a propyldimethylsilyl group, a triphenylsilyl group, a diphenylsilyl group, a phenylsilyl group, etc., but the embodiment of the present disclosure is not limited thereto.

In the disclosure, a thiol group may include an alkyl thiol group and an aryl thiol group. The thiol group may refer to that a sulfur atom is bonded to the alkyl group or the aryl group as defined above. Examples of the thiol group may include a methylthiol group, an ethylthiol group, a propylthiol group, a pentylthiol group, a hexylthiol group, an octylthiol group, a dodecylthiol group, a cyclopentylthiol group, a cyclohexylthiol group, a phenylthiol group, a naphthylthiol group, but the embodiment of the present disclosure is not limited thereto.

In the disclosure, an oxy group may refer to that an oxygen atom is bonded to the alkyl group or the aryl group as defined above. The oxy group may include an alkoxy group and an aryl oxy group. The alkoxy group may be a linear chain, a branched chain or a ring chain. The number of carbon atoms in the alkoxy group is not limited, but may be, for example, 1 to 20 or 1 to 10. The number of ring-forming carbon atoms in the aryloxy group is not limited, but may be, for example, 6 to 30, 6 to 20, or 6 to 15. Examples of the oxy group may include methoxy, ethoxy, n-propoxy, isopropoxy, butoxy, pentyloxy, hexyloxy, octyloxy, nonyloxy, decyloxy, phenoxy, benzyloxy, etc., but the embodiment of the present disclosure is not limited thereto.

The boron group herein may refer to that a boron atom is bonded to the alkyl group or the aryl group as defined above. The boron group includes an alkyl boron group and an aryl boron group. Examples of the boron group may include a trimethylboron group, a triethylboron group, a t-butyldimethylboron group, a triphenylboron group, a diphenylboron group, a phenylboron group, etc., but the embodiment of the present disclosure is not limited thereto.

In the disclosure, the number of carbon atoms in an amine group is not limited, but may be 1 to 30. The amine group may include an alkyl amine group and an aryl amine group. Examples of the amine group may include a methylamine group, a dimethylamine group, a phenylamine group, a diphenylamine group, a naphthylamine group, a 9-methyl-anthracenylamine group, a triphenylamine group, etc., but the embodiment of the present disclosure is not limited thereto.

In the disclosure, the alkyl group selected from among an alkylthiol group, an alkylsulfoxy group, an alkylaryl group, an alkylamino group, an alkyl boron group, an alkyl silyl group, and an alkyl amine group is the same as the examples of the alkyl group described above.

In the disclosure, the aryl group, selected from among an aryloxy group, an arylthiol group, an arylsulfoxy group, an arylamino group, an aryl boron group, an aryl silyl group, an aryl amine group and an aryl alkyl group, is the same as the examples of the aryl group described above.

In the disclosure, a direct linkage may refer to a single bond.

In some embodiments,

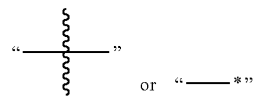

herein refers to a position to be connected.

Hereinafter, embodiments of the present disclosure will be described with reference to the accompanying drawings.

Figure 2:
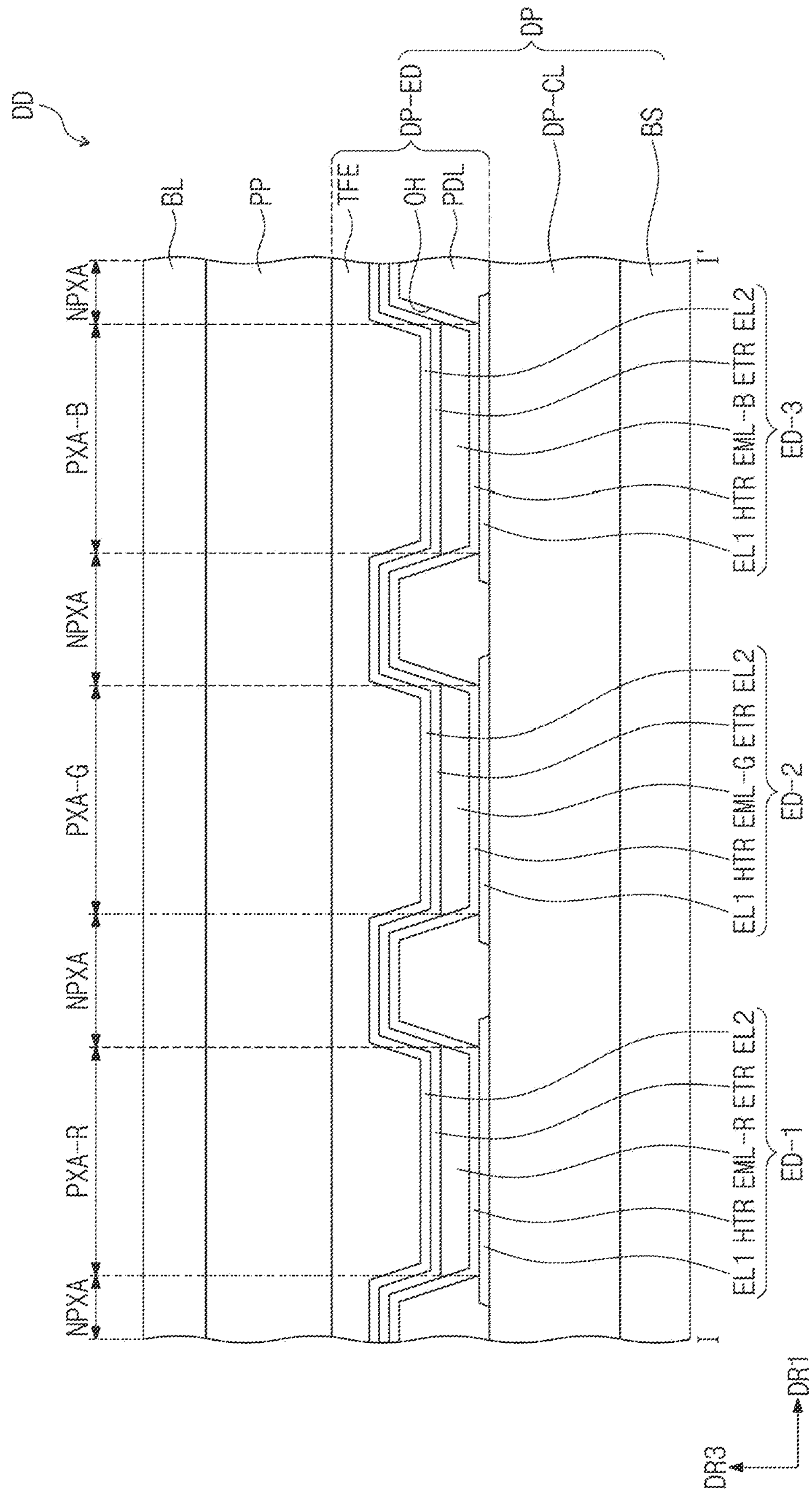
FIG. 2 is a cross-sectional view of a display device according to an embodiment.

FIG. 1 is a plan view illustrating an embodiment of a display device DD. FIG. 2 is a cross-sectional view of the display device DD of the embodiment. FIG. 2 is a cross-sectional view illustrating a part taken along line I-I' of FIG. 1.

The display device DD may include a display panel DP and an optical layer PP disposed on the display panel DP. The display panel DP includes light emitting elements ED-1, ED-2, and ED-3. The display device DD may include a plurality of light emitting elements ED-1, ED-2, and ED-3. The optical layer PP may be disposed on the display panel DP and control reflected light in the display panel DP due to external light. The optical layer PP may include, for example, a polarization layer or a color filter layer. In some embodiments, unlike the configuration illustrated in the drawing, the optical layer PP may not be provided from the display device DD of an embodiment.

A base substrate BL may be disposed on the optical layer PP. The base substrate BL may be a member which provides a base surface on which the optical layer PP disposed. The base substrate BL may be a glass substrate, a metal substrate, a plastic substrate, etc. However, the embodiment of the present disclosure is not limited thereto, and the base substrate BL may be an inorganic layer, an organic layer, or a composite material layer. In some embodiments, unlike the configuration illustrated, in an embodiment, the base substrate BL may not be provided.

The display device DD according to an embodiment may further include a filling layer. The filling layer may be between a display element layer DP-ED and the base substrate BL. The filling layer may be an organic material layer. The filling layer may include at least one of an acrylic-based resin, a silicone-based resin, or an epoxy-based resin.

The display panel DP may include a base layer BS, a circuit layer DP-CL provided on the base layer BS, and the display element layer DP-ED. The display element layer DP-ED may include a pixel defining film PDL, the light emitting elements ED-1, ED-2, and ED-3 between portions of the pixel defining film PDL, and an encapsulation layer TFE on the light emitting elements ED-1, ED-2, and ED-3.

The base layer BS may be a member which provides a base surface on which the display element layer DP-ED is disposed. The base layer BS may be a glass substrate, a metal substrate, a plastic substrate, etc. However, the embodiment is not limited thereto, and the base layer BS may be an inorganic layer, an organic layer, or a composite material layer.

In an embodiment, the circuit layer DP-CL is on the base layer BS, and the circuit layer DP-CL may include a plurality of transistors. Each of the transistors may include a control electrode, an input electrode, and an output electrode. For example, the circuit layer DP-CL may include a switching transistor and a driving transistor for driving the light emitting elements ED-1, ED-2, and ED-3 of the display element layer DP-ED.

Each of the light emitting elements ED-1, ED-2, and ED-3 may have a structure of a light emitting element ED of an embodiment according to FIGS. 3 to 7, which will be described in more detail. Each of the light emitting elements ED-1, ED-2 and ED-3 may include a first electrode EL1, a hole transport region HTR, emission layers EML-R, EML-G and EML-B, an electron transport region ETR, and a second electrode EL2.

FIG. 2 illustrates an embodiment in which the emission layers EML-R, EML-G, and EML-B of the light emitting elements ED-1, ED-2, and ED-3 are in openings OH defined in the pixel defining film PDL, and the hole transport region HTR, the electron transport region ETR, and the second electrode EL2 are provided as a common layer in the entire light emitting elements ED-1, ED-2, and ED-3. However, the embodiment of the present disclosure is not limited thereto, and the hole transport region HTR and the electron transport region ETR in an embodiment may be provided by being patterned inside the openings OH defined in the pixel defining film PDL. For example, the hole transport region HTR, the emission layers EML-R, EML-G, and EML-B, and the electron transport region ETR of the light emitting elements ED-1, ED-2, and ED-3 in an embodiment may be provided by being patterned in an inkjet printing method.

The encapsulation layer TFE may cover the light emitting elements ED-1, ED-2 and ED-3. The encapsulation layer TFE may seal the display element layer DP-ED. The encapsulation layer TFE may be a thin film encapsulation layer. The encapsulation layer TFE may be formed by laminating one layer or a plurality of layers. The encapsulation layer TFE includes at least one insulation layer. The encapsulation layer TFE according to an embodiment may include at least one inorganic film (hereinafter, an encapsulation-inorganic film). The encapsulation layer TFE according to an embodiment may also include at least one organic film (hereinafter, an encapsulation-organic film) and at least one encapsulation-inorganic film.

The encapsulation-inorganic film protects (reduces) the display device layer DP-ED from moisture/oxygen, and the encapsulation-organic film protects (reduces) the display device layer DP-ED from foreign substances such as dust particles. The encapsulation-inorganic film may include silicon nitride, silicon oxynitride, silicon oxide, titanium oxide, aluminum oxide, and/or the like, but the embodiment of the present disclosure is not limited thereto. The encapsulation-organic film may include an acrylic-based compound, an epoxy-based compound, and/or the like. The encapsulation-organic film may include a photopolymerizable organic material, but the embodiment of the present disclosure is not limited thereto.

The encapsulation layer TFE may be on the second electrode EL2 and may be disposed filling the opening OH.

Referring to FIGS. 1 and 2, the display device DD may include a non-light emitting region NPXA and light emitting regions PXA-R, PXA-G and PXA-B. The light emitting regions PXA-R, PXA-G and PXA-B may be regions in which light generated by the respective light emitting elements ED-1, ED-2 and ED-3 is emitted. The light emitting regions PXA-R, PXA-G, and PXA-B may be spaced apart from each other on a plane (e.g., in a plan view).

Each of the light emitting regions PXA-R, PXA-G, and PXA-B may be a region divided by the pixel defining film PDL. The non-light emitting regions NPXA may be regions between the adjacent light emitting regions PXA-R, PXA-G, and PXA-B, which correspond to portions of the pixel defining film PDL. In some embodiments, in the disclosure, the light emitting regions PXA-R, PXA-G, and PXA-B may respectively correspond to pixels. The pixel defining film PDL may divide the light emitting elements ED-1, ED-2, and ED-3. The emission layers EML-R, EML-G and EML-B of the light emitting elements ED-1, ED-2 and ED-3 may be disposed in openings OH defined in the pixel defining film PDL and separated from each other.

The light emitting regions PXA-R, PXA-G and PXA-B may be divided into a plurality of groups according to the color of light generated from the light emitting elements ED-1, ED-2 and ED-3. In the display device DD of an embodiment shown in FIGS. 1 and 2, three light emitting regions PXA-R, PXA-G, and PXA-B which emit red light, green light, and blue light, respectively are illustrated as an example. For example, the display device DD of an embodiment may include the red light emitting region PXA-R, the green light emitting region PXA-G, and the blue light emitting region PXA-B that are separated from each other.

In the display device DD according to an embodiment, the plurality of light emitting elements ED-1, ED-2 and ED-3 may be to emit light beams having wavelengths different from each other. For example, in an embodiment, the display device DD may include a first light emitting element ED-1 that emits red light, a second light emitting element ED-2 that emits green light, and a third light emitting element ED-3 that emits blue light. For example, the red light emitting region PXA-R, the green light emitting region PXA-G, and the blue light emitting region PXA-B of the display device DD may correspond to the first light emitting element ED-1, the second light emitting element ED-2, and the third light emitting element ED-3, respectively.

However, the embodiment of the present disclosure is not limited thereto, and the first to third light emitting elements ED-1, ED-2, and ED-3 may emit light beams in substantially the same wavelength range or at least one light emitting element may emit a light beam in a wavelength range different from the others. For example, the first to third light emitting elements ED-1, ED-2, and ED-3 may all emit blue light.

The light emitting regions PXA-R, PXA-G, and PXA-B in the display device DD according to an embodiment may be arranged in a stripe form. Referring to FIG. 1, the plurality of red light emitting regions PXA-R may be arranged with each other along a second direction axis DR2, the plurality of green light emitting regions PXA-G may be arranged with each other along the second direction axis DR2, and the plurality of blue light emitting regions PXA-B may be arranged with each other along the second direction axis DR2. In some embodiments, the red light emitting region PXA-R, the green light emitting region PXA-G, and the blue light emitting region PXA-B may be alternately arranged in this order along the first direction axis DR1. (DR3 is a third direction which is normal or perpendicular to the plane defined by the first direction DR1 and the second direction DR2).

FIGS. 1 and 2 illustrate that all the light emitting regions PXA-R, PXA-G, and PXA-B have a substantially similar area, but the embodiment of the present disclosure is not limited thereto. Thus, the light emitting regions PXA-R, PXA-G, and PXA-B may have different areas from each other according to the wavelength range of the emitted light. In this case, the areas of the light emitting regions PXA-R, PXA-G, and PXA-B may refer to areas when viewed in a plane defined by the first direction axis DR1 and the second direction axis DR2.

In some embodiments, an arrangement form of the light emitting regions PXA-R, PXA-G, and PXA-B is not limited to the feature illustrated in FIG. 1, and the order in which the red light emitting region PXA-R, the green light emitting region PXA-G, and the blue light emitting region PXA-B are arranged may be provided in one or more suitable combinations according to the characteristics of display quality required in the display device DD. For example, the arrangement form of the light emitting regions PXA-R, PXA-G, and PXA-B may be a pentile (PENTILE®) arrangement form (for example, an RGBG matrix, an RGBG structure, or RGBG matrix structure) or a diamond arrangement form (e.g., a display (e.g., an OLED display) containing red, blue, and green (RGB) light emitting regions arranged in the shape of diamonds). PENTILE® is a duly registered trademark of Samsung Display Co., Ltd.

In some embodiments, the areas of the light emitting regions PXA-R, PXA-G, and PXA-B may be different from each other. For example, in an embodiment, the area of the green light emitting region PXA-G may be smaller than that of the blue light emitting region PXA-B, but the embodiment of the present disclosure is not limited thereto.

Hereinafter, FIGS. 3 to 7 are cross-sectional views schematically illustrating light emitting elements according to embodiments. The light emitting elements ED according to embodiments each may include a first electrode EL1, a second electrode EL2, and at least one functional layer between the first electrode EL1 and the second electrode EL2. For example, each of the light emitting elements ED according to embodiments may include a first electrode EL1, a hole transport region HTR, an emission layer EML, an electron transport region ETR, and a second electrode EL2 that are sequentially stacked.

Figure 3:
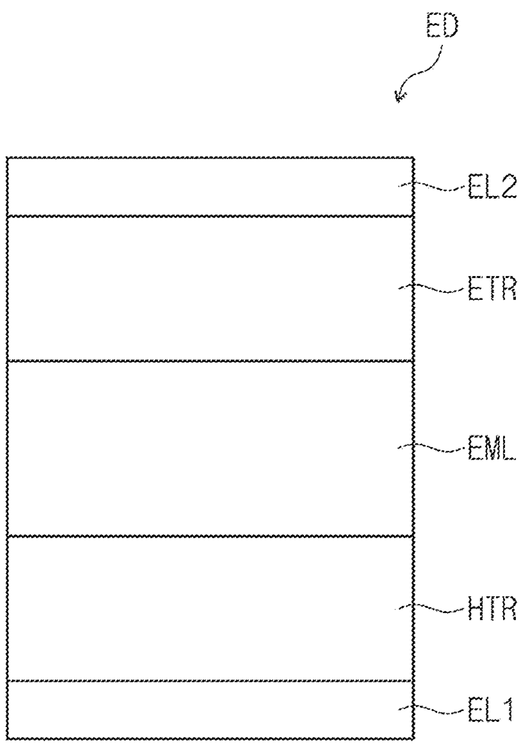
FIG. 3 is a cross-sectional view schematically illustrating a light emitting element according to an embodiment.
Figure 4:
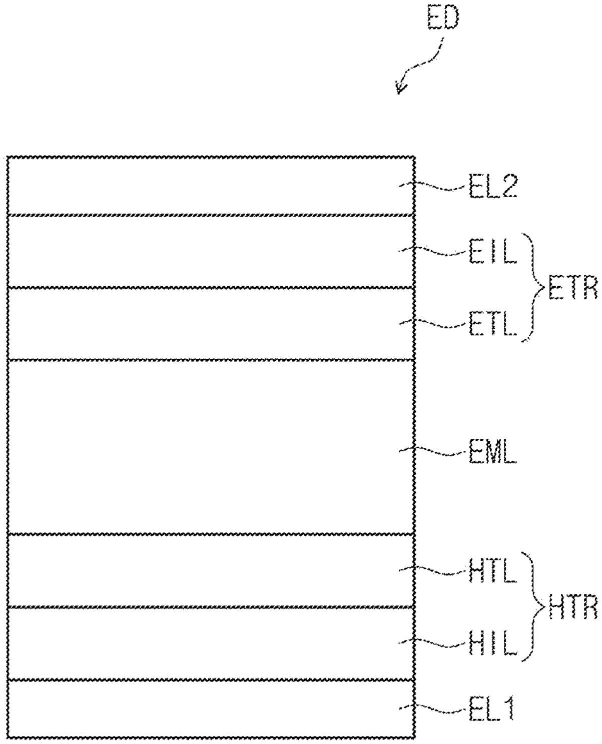
FIG. 4 is a cross-sectional view schematically illustrating a light emitting element according to an embodiment.
Figure 5:
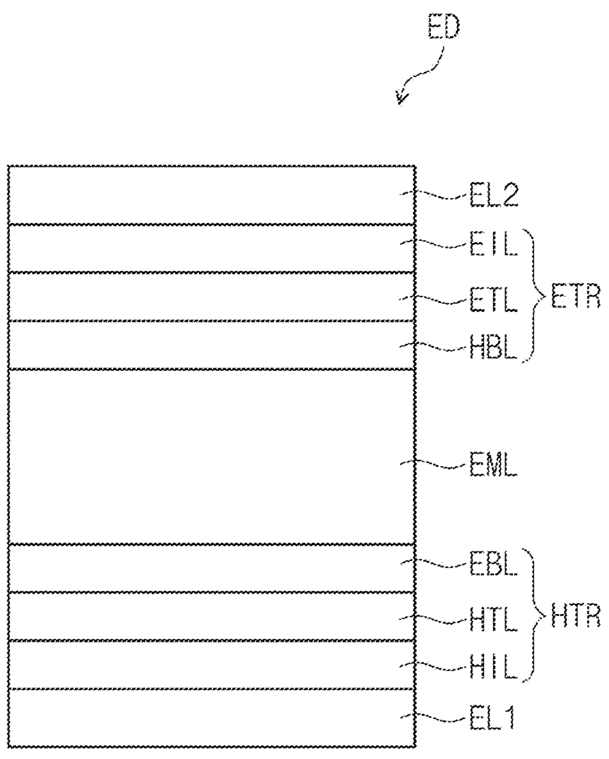
FIG. 5 is a cross-sectional view schematically illustrating a light emitting element according to an embodiment.
Figure 6:
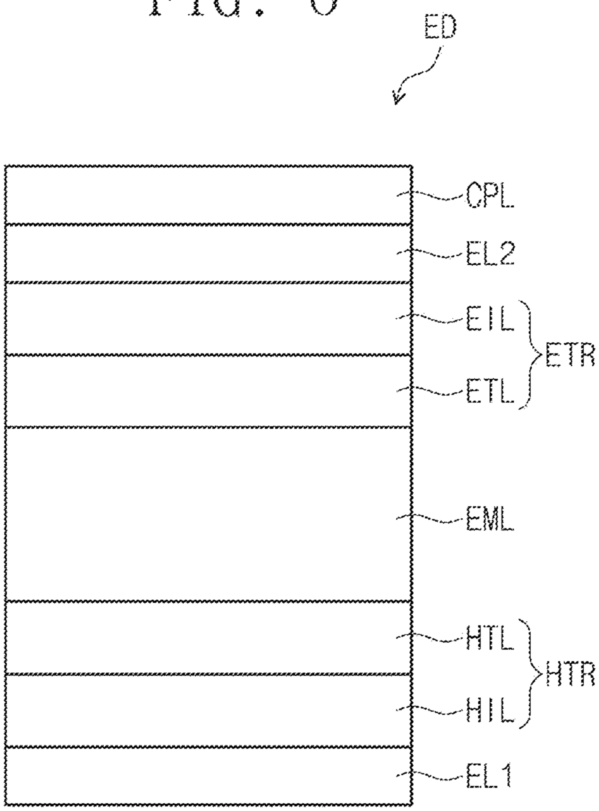
FIG. 6 is a cross-sectional view schematically illustrating a light emitting element according to an embodiment.
Figure 7:
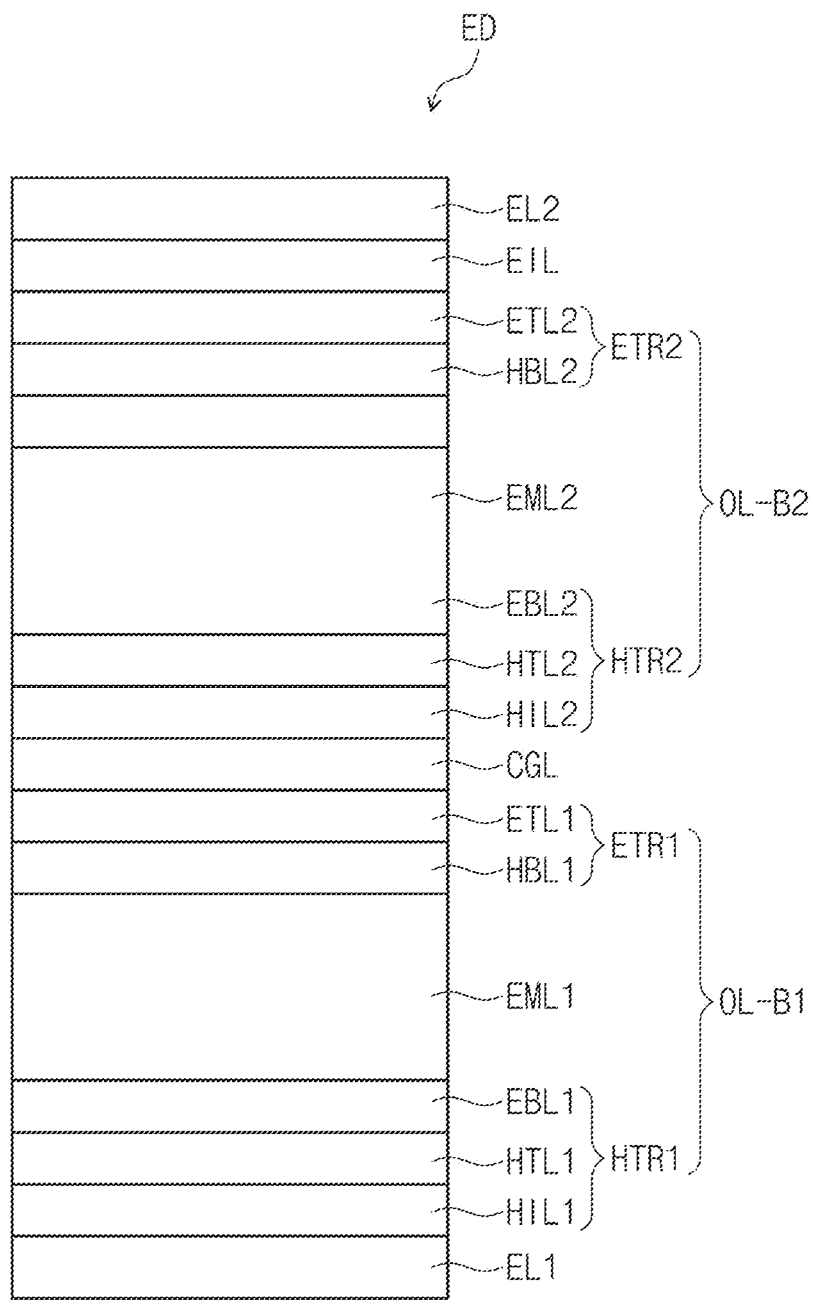
FIG. 7 is a cross-sectional view schematically illustrating a light emitting element according to an embodiment.

Compared with FIG. 3, FIG. 4 illustrates a cross-sectional view of a light emitting element ED of an embodiment, in which a hole transport region HTR includes a hole injection layer HIL and a hole transport layer HTL, and an electron transport region ETR includes an electron injection layer EIL and an electron transport layer ETL. In some embodiments, compared with FIG. 3, FIG. 5 illustrates a cross-sectional view of a light emitting element ED of an embodiment, in which a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. Compared with FIG. 4, FIG. 6 illustrates a cross-sectional view of a light emitting element ED of an embodiment including a capping layer CPL disposed on a second electrode EL2. Compared with FIG. 5, FIG. 7 illustrates that a light emitting element ED may include a plurality of light emitting structures OL-B1 and OL-B2. The plurality of light emitting structures OL-B1 and OL-B2 may include a first light emitting structure OL-B1 and a second light emitting structure OL-B2. Each of the first light emitting structure OL-B1 and the second light emitting structure OL-B2 may include hole transport regions HTR1 and HTR2, emission layers EML1 and EML2, and electron transport regions ETR1 and ETR2. The hole transport regions HTR1 and HTR2 may include hole injection layers HIL1 and HIL2, hole transport layers HTL1 and HTL2, and electron blocking layers EBL1 and EBL2, and the electron transport regions ETR1 and ETR2 may include electron injection layers EIL1 and EIL2, electron transport layers ETL1 and ETL2, and hole blocking layers HBL1 and HBL2.

In the light emitting element ED according to an embodiment, the first electrode EL1 has conductivity (e.g., is a conductor). The first electrode EL1 may be formed of a metal material, a metal alloy, or a conductive compound. The first electrode EL1 may be an anode or a cathode. However, the embodiment of the present disclosure is not limited thereto. In some embodiments, the first electrode EL1 may be a pixel electrode. The first electrode EL1 may be a transmissive electrode, a transflective electrode, or a reflective electrode. The first electrode EU may include at least one selected from among Ag, Mg, Cu, Al, Pt, Pd, Au, Ni, Nd, Ir, Cr, Li, Ca, LiF, Mo, Ti, W, In, Sn, Zn, compounds comprising one or more of the foregoing elements, combinations of two or more of the foregoing elements or compounds, mixtures of two or more of the foregoing elements or compounds, and/or oxides thereof.

When the first electrode EL1 is the transmissive electrode, the first electrode EL1 may include a transparent metal oxide such as indium tin oxide (ITO), indium zinc oxide (IZO), zinc oxide (ZnO), and/or indium tin zinc oxide (ITZO). When the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca (a stacked structure of LiF and Ca), LiF/Al (a stacked structure of LiF and Al), Mo, Ti, W, and/or a compound or mixture thereof (e.g., a mixture of Ag and Mg). In some embodiments, the first electrode EU may have a multilayer structure including a reflective film or a transflective film formed of the above-described materials, and a transparent conductive film formed of ITO, IZO, ZnO, ITZO, etc. For example, the first electrode EL1 may have a three-layer structure of ITO/Ag/ITO, but the embodiment of the present disclosure is not limited thereto. In some embodiments, the embodiment of the present disclosure is not limited thereto, and the first electrode EL1 may include the above-described metal materials, combinations of at least two metal materials of the above-described metal materials, oxides of the above-described metal materials, and/or the like. The thickness of the first electrode EL1 may be from about 700 Å to about 10,000 Å. For example, the thickness of the first electrode EL1 may be from about 1,000 Å to about 3,000 Å.

The hole transport region HTR is provided on the first electrode EL1. The hole transport region HTR may have a single layer formed of a single material, a single layer formed of a plurality of different materials, or a multilayer structure including a plurality of layers formed of a plurality of different materials.

The hole transport region HTR may include at least one of a hole injection layer HIL, a hole transport layer HTL, a buffer layer or an emission-auxiliary layer, or an electron blocking layer EBL.

For example, the hole transport region HTR may have a single layer structure of the hole injection layer HIL or the hole transport layer HTL, or may have a single layer structure formed of a hole injection material and a hole transport material. In some embodiments, the hole transport region HTR may have a single layer structure formed of a plurality of different materials, or a structure in which a hole injection layer HIL/hole transport layer HTL, a hole injection layer HIL/hole transport layer HTL/buffer layer, a hole injection layer HIL/buffer layer, a hole transport layer HTL/buffer layer, or a hole injection layer HIL/hole transport layer HTL/electron blocking layer EBL are stacked in order from the first electrode EL1, but the embodiment of the present disclosure is not limited thereto.

The thickness of the hole transport region HTR may be, for example, from about 50 Å to about 15,000 Å. The hole transport region HTR may be formed utilizing one or more suitable methods such as a vacuum deposition method, a spin coating method, a cast method, a Langmuir-Blodgett (LB) method, an inkjet printing method, a laser printing method, and/or a laser induced thermal imaging (LITI) method.

In an embodiment, the hole transport region HTR includes the polycyclic compound represented by Formula 1.

Formula 1

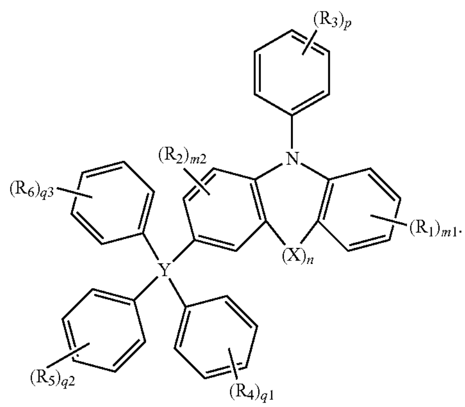

In Formula 1, X may be a direct linkage, and n may be 0 or 1. When n is 0, two benezene rings linked to X in Formula 1 may not be linked to each other. For example, when n is 0, the polycyclic compound represented by Formula 1 may include an amine compound to which three substituted or unsubstituted phenyl groups are linked. When n is 1, two benezene rings linked to X in Formula 1 may be linked via a direct linkage. For example, when n is 1, the polycyclic compound represented by Formula 1 may include a substituted or unsubstituted carbazole derivative.

Y may be C or Si. For example, the polycyclic compound represented by Formula 1 may include a substituted or unsubstituted triphenylmethyl group or a substituted or unsubstituted triphenylsilyl group as a substituent.

$R_1$ to $R_6$ may each independently be a hydrogen atom, a deuterium atom, a halogen atom, a substituted or unsubstituted silyl group, a substituted or unsubstituted amine group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, and/or are bonded to an adjacent group to form a ring. However, at least one $R_3$ is a hydrogen atom or a saturated aliphatic compound having 1 to 20 carbon atoms. For example, $R_1$ may be a hydrogen atom, a substituted or unsubstituted t-butyl group, a substituted or unsubstituted cyclohexyl group, a substituted or unsubstituted triphenylmethyl group, or a substituted or unsubstituted triphenylsilyl group. For example, $R_2$, and $R_4$ to $R_6$ may be hydrogen atoms. For example, $R_3$ may be a hydrogen atom, a substituted or unsubstituted t-butyl group, a substituted or unsubstituted cycloalkyl group having 1 to 20 carbon atoms, or a substituted or unsubstituted adamantyl group.

m1 may be an integer from 0 to 5 when m1+n is 5 or less. For example, when n is 0, m1 is an integer from 0 to 5, and when n is 1, m1 is an integer from 0 to 4. m1 may be 0 or 1. The embodiment in which m1 is 0 may be the same as the embodiment in which n is 0, m1 is 5, and $R_1$s are hydrogen atoms. In addition, the embodiment in which m1 is 0 may be the same as the embodiment in which n is 1, m1 is 4, and $R_1$s are hydrogen atoms. When m1 is 0, the polycyclic compound represented by Formula 1 may not be substituted with $R_1$.

m2 may be an integer from 0 to 4 when m2+n is 4 or less. For example, when n is 0, m2 may be an integer from 0 to 4, and when n is 1, m2 may be an integer from 0 to 3. m2 may be 0 or 1. The embodiment in which m2 is 0 may be the same as the embodiment in which n is 0, m2 is 4, and $R_2$s are hydrogen atoms. In addition, the embodiment in which m2 is 0 may be the same as the embodiment in which n is 1, m2 is 3, and $R_2$s are hydrogen atoms. When m2 is 0, the polycyclic compound represented by Formula 1 may not be substituted with $R_2$.

p may be an integer from 0 to 5. For example, p may be 0 or 1. The embodiment in which p is 0 may be the same as the embodiment in which p is 5 and $R_3$s are hydrogen atoms. The structure in which p is 0 may be a structure in which the polycyclic compound represented by Formula 1 is not substituted with $R_3$.

q1 to q3 may each independently be an integer from 0 to 5. For example, each of q1 to q3 may be 0. The structure in which q1 is 0 may be the same as the embodiment in which q1 is 5 and $R_4$s are hydrogen atoms. The structure in which q2 is 0 may be the same as the embodiment in which q2 is 5 and $R_5$s are hydrogen atoms. The structure in which q3 is 0 may be the same as the embodiment in which q3 is 5 and $R_6$s are hydrogen atoms. When q1 to q3 are 0, the polycyclic compound represented by Formula 1 may not be substituted with $R_4$, $R_5$, and $R_6$.

However, in Formula 1 when n is 1, Y may be Si, each of $R_2$ and $R_4$ to $R_6$ may be a hydrogen atom, and $R_1$ may be an unsubstituted triphenylsilyl group, the embodiment in which $R_3$ may be a hydrogen atom is excluded in the present disclosure.

In an embodiment, the polycyclic compound represented by Formula 1 satisfies a refractive index of about 1.75 or less.

In an embodiment, the polycyclic compound represented by Formula 1 may be represented by Formula 1-1 or Formula 1-2:

Formula 1-1

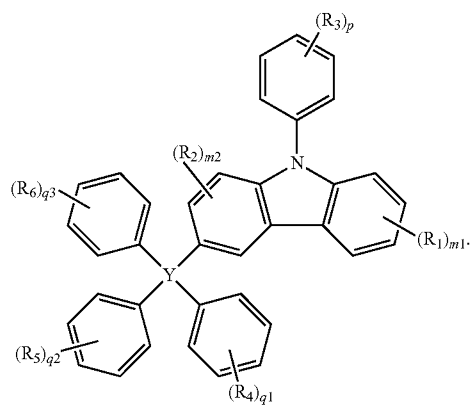

Formula 1-2

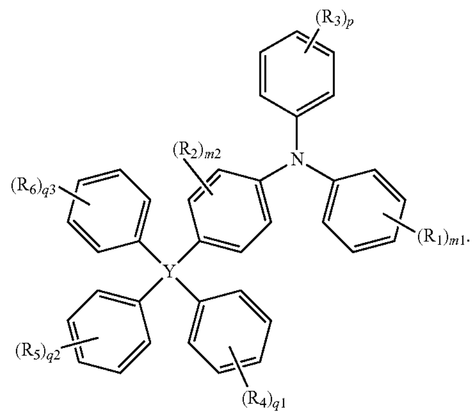

Formula 1-1 is the embodiment in which n is 1 in Formula 1. Formula 1-2 is the embodiment in which n is 0 in Formula 1.

The polycyclic compound represented by Formula 1-1 may include a substituted or unsubstituted carbazole derivative.

The polycyclic compound represented by Formula 1-2 may include an amine compound.

In Formula 1-1 and Formula 1-2, Y, $R_1$ to $R_6$, n, m1, m2, p, and q1 to q3 may each independently be the same as defined in Formula 1.

In an embodiment, the polycyclic compound represented by Formula 1 may be represented by Formula 2:

Formula 2

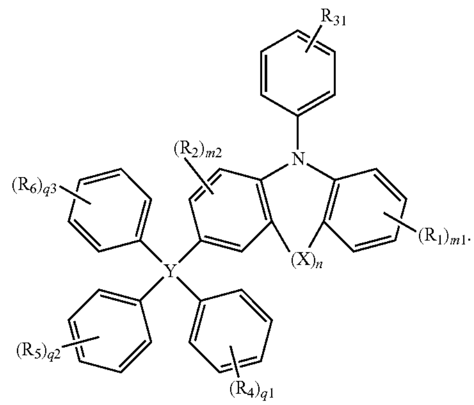

Formula 2 is the embodiment in which in Formula 1, p may be 1 and $R_3$ may be $R_{31}$.

$R_{31}$ may be a hydrogen atom or a saturated aliphatic hydrocarbon group having 1 to 20 carbon atoms. For example, $R_{31}$ may be a hydrogen atom, a substituted or unsubstituted t-butyl group, a substituted or unsubstituted cyclohexyl group, or a substituted or unsubstituted adamantyl group.

In Formula 2, X, Y, $R_1$, $R_2$, $R_4$ to $R_6$, n, m1, m2, and q1 to q3 may each independently be the same as defined in Formula 1.

In an embodiment, the polycyclic compound represented by Formula 2 may be represented by Formula 2-1:

Formula 2-1

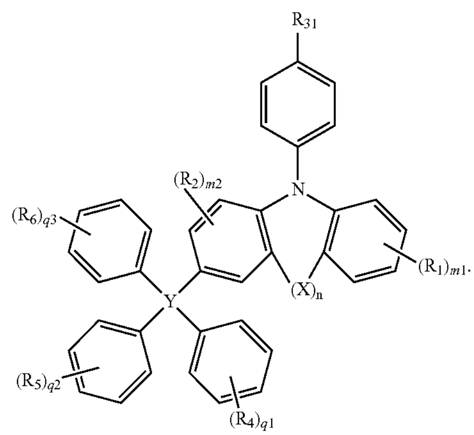

Formula 2-1 is the embodiment in which a position at which $R_{31}$ in Formula 2 is linked to a benzene ring is specified.

In an embodiment, $R_{31}$ may be substituted at the para-position with the nitrogen atom. However, the embodiment of the present disclosure is not limited thereto.

In Formula 2-1, X, Y, $R_1$, $R_2$, $R_4$ to $R_6$, n, m1, m2, and q1 to q3 may each independently be the same as defined in Formula 1, and $R_{31}$ may be the same as defined in Formula 2.

In an embodiment, the polycyclic compound represented by Formula 1 may be represented by Formula 3-1 or Formula 3-2:

Formula 3-1

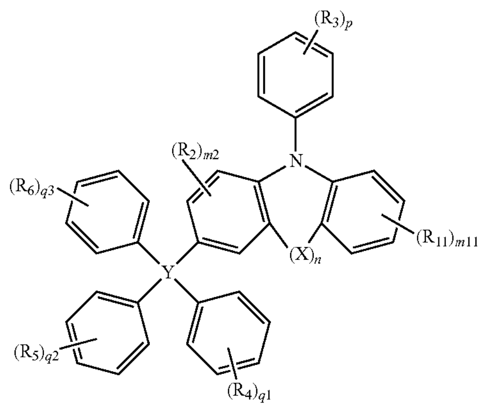

Formula 3-2

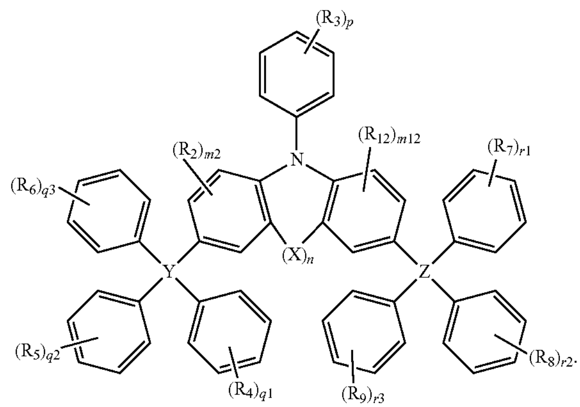

Formula 3-1 and Formula 3-2 are the embodiments in which $R_1$ is specified in Formula 1. For example, Formula 3-1 is the embodiment in which $R_1$ in Formula 1 is specified as $R_{(11)m11}$. Formula 3-2 is the embodiment in which $R_1$ in Formula 1 above is specified as $R_{(12)m12}$ and

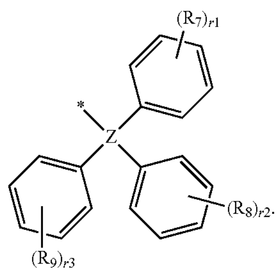

In Formula 3-1, $R_{11}$ may be a hydrogen atom or a saturated aliphatic hydrocarbon group having 1 to 20 carbon atoms. For example, $R_{11}$ may be a hydrogen atom, a substituted or unsubstituted t-butyl group, or a substituted or unsubstituted cyclohexyl group. However, the embodiment of the present disclosure is not limited thereto.

m11 may be an integer from 0 to 5 when m11+n is 5 or less. For example, when n is 0, m11 may be an integer from 0 to 5, and when n is 1, m11 may be an integer from 0 to 4. m11 may be 0 or 1. The embodiment in which m11 is 0 may be the same as the embodiment in which n is 0, m11 is 5, and $R_{11}$s are hydrogen atoms. In addition, the embodiment in which m11 is 0 may be the same as the embodiment in which n is 1, m11 is 4, and $R_{11}$s are hydrogen atoms. When m11 is 0, the polycyclic compound represented by Formula 3-1 may not be substituted with $R_{11}$.

In Formula 3-2, Z may be C or Si. For example, the polycyclic compound represented by Formula 3-2 may include, as substituents, any two selected from among a substituted or unsubstituted triphenylmethyl group and a substituted or unsubstituted triphenylsilyl group.

m12 may be an integer from 0 to 4 when m12+n is 4 or less. For example, when n is 0, m12 may be an integer from 0 to 4, and when n is 1, m12 may be an integer from 0 to 3. m12 may be 0 or 1. The embodiment in which m12 is 0 may be the same as the embodiment in which n is 0, m12 is 4, and $R_2$s are hydrogen atoms. In addition, the embodiment in which m12 is 0 may be the same as the embodiment in which n is 1, m12 is 3, and $R_2$s are hydrogen atoms. When m12 is 0, the polycyclic compound represented by Formula 3-2 may not be substituted with $R_2$.

$R_{12}$ may be a hydrogen atom or a saturated aliphatic hydrocarbon group having 1 to 20 carbon atoms. For example, $R_{12}$ may be a hydrogen atom.

$R_7$ to $R_9$ may each independently be a hydrogen atom, a deuterium atom, a halogen atom, a substituted or unsubstituted silyl group, a substituted or unsubstituted amine group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring. For example, each of $R_7$ to $R_9$ may be a hydrogen atom.

r1 to r3 may each independently be an integer from 0 to 5. For example, each of r1 to r3 may be 0. The structure in which r1 is 0 may be the same as the embodiment in which r1 is 5 and $R_7$s are hydrogen atoms. The structure in which r2 is 0 may be the same as the embodiment in which r2 is 5 and $R_8$s are hydrogen atoms. The structure in which r3 is 0 may be the same as the embodiment in which r3 is 5 and $R_9$s are hydrogen atoms. When r1 to r3 are 0, the polycyclic compound represented by Formula 3-2 may not be substituted with $R_7$, $R_8$, and $R_9$.

In Formula 3-1 and Formula 3-2, X, Y, $R_1$ to $R_6$, n, m2, p, and q1 to q3 may each independently be the same as defined in Formula 1.

In an embodiment, the polycyclic compound represented by Formula 1 may be represented by any one selected from among Formula 4-1 to Formula 4-6:

Formula 4-1

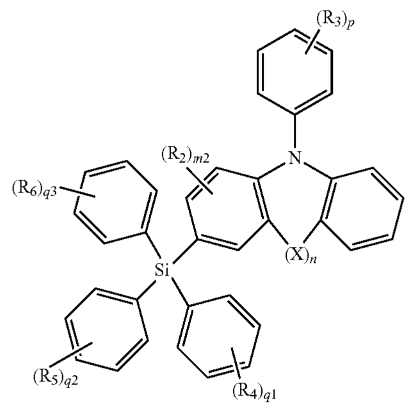

-continued

Fomrula 4-2

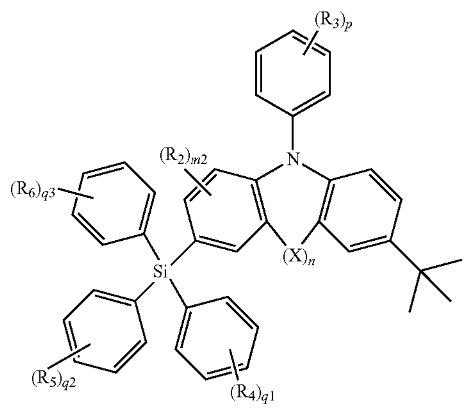

Formula 4-3

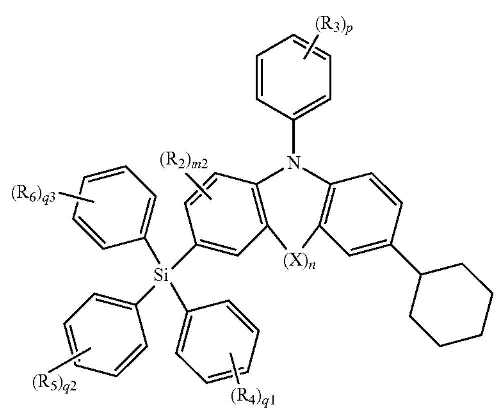

Formula 4-4

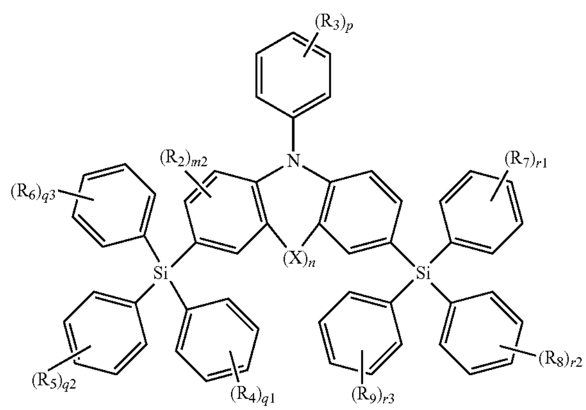

-continued

Formula 4-5

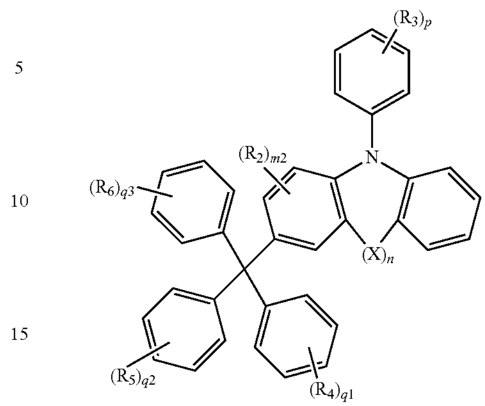

Formula 4-6

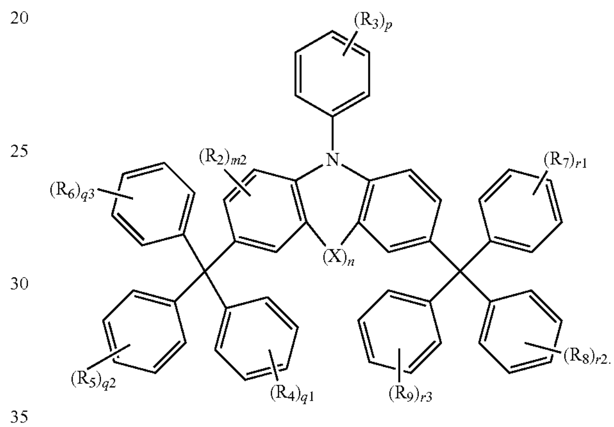

Formula 4-1 to Formula 4-6 are the embodiments in which $R_{11}$, $R_{12}$, Z, m11, and m12 are specified in Formula 3-1 and Formula 3-2.

In Formula 4-1 to Formula 4-6, X, $R_2$ to $R_9$, n, m2, p, q1 to q3, and r1 to r3 may each independently be the same as defined in Formula 1, Formula 3-1, and Formula 3-2.

In an embodiment, the polycyclic compound represented by Formula 1 may include at least one selected from among the compounds represented by Compound Group 1:

Compound Group 1

1

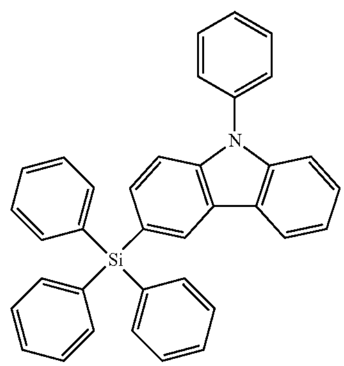

-continued
2
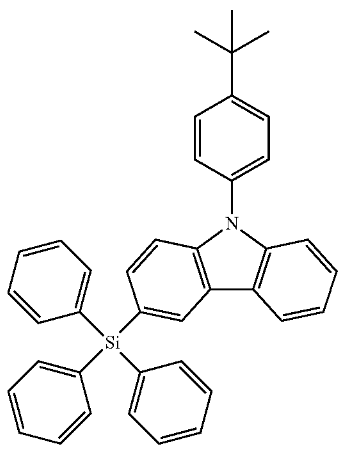
3
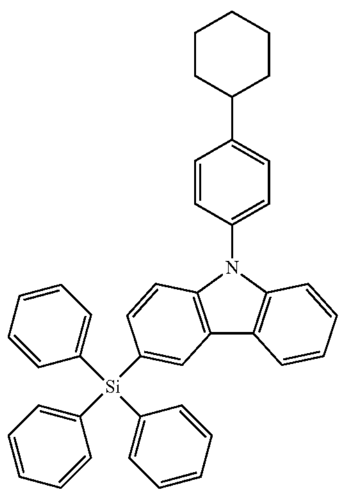
4
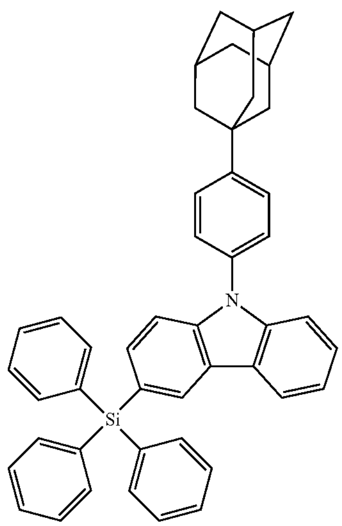
-continued
5
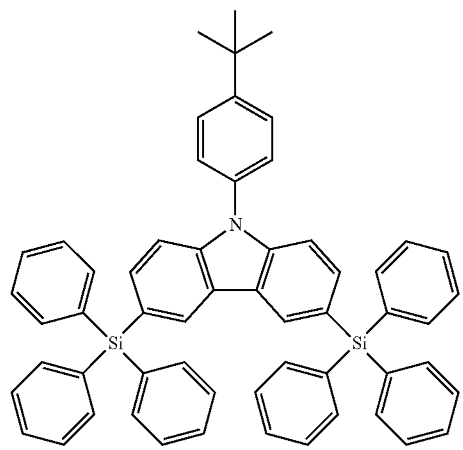
6
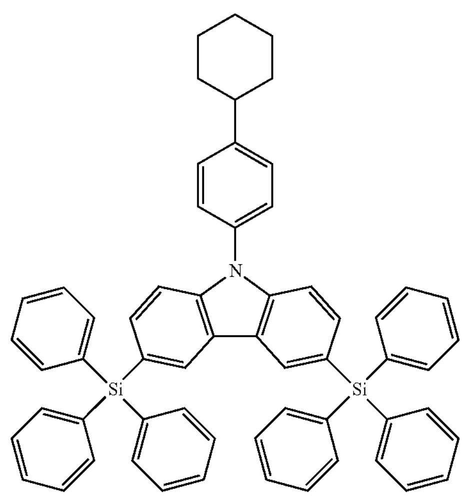
7
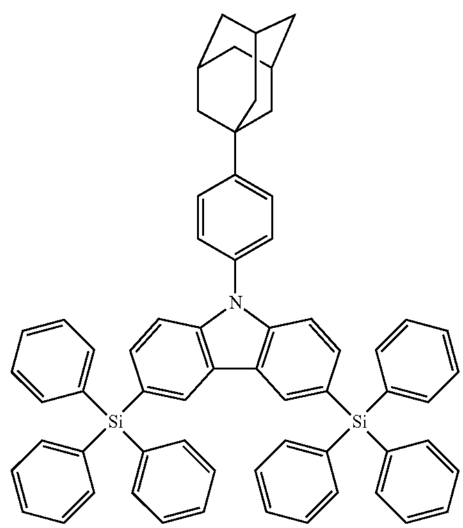

-continued
8
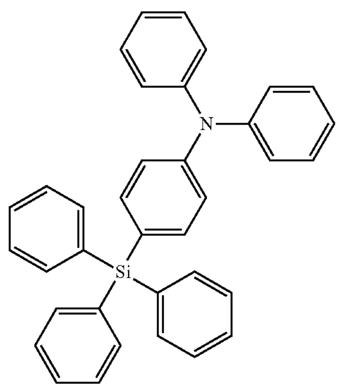
9
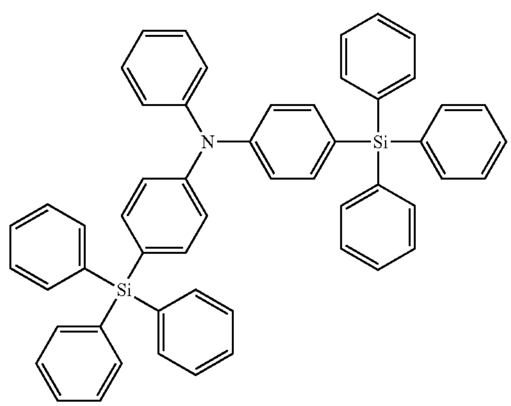
10
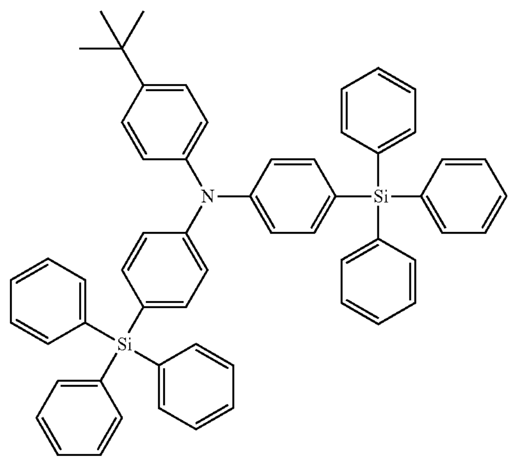
-continued
11
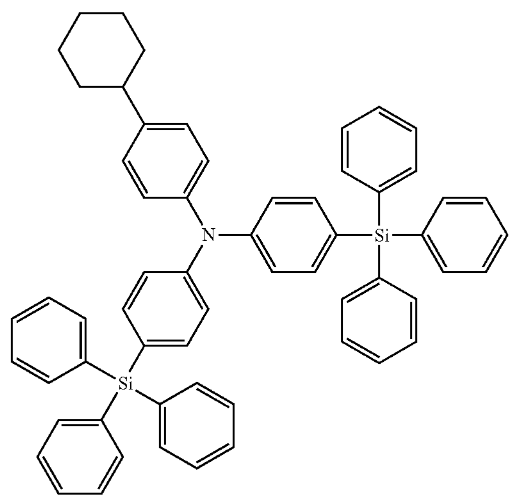
12
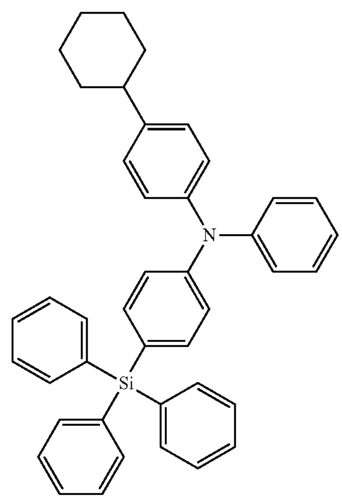
13
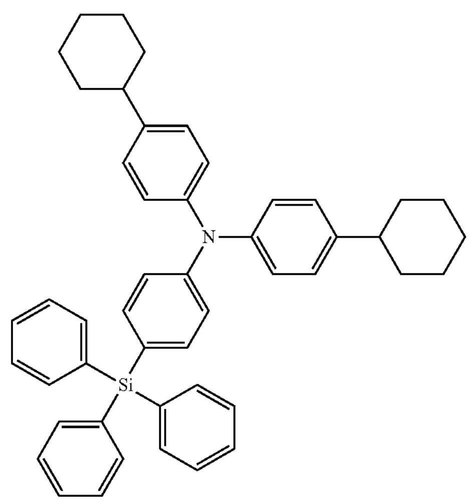

-continued
14
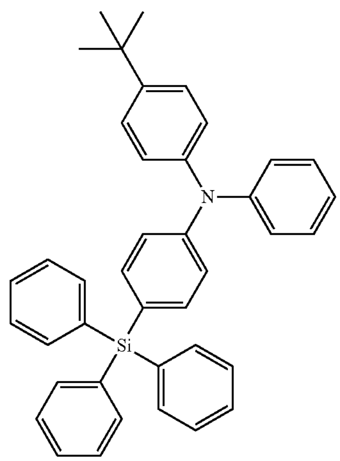
15
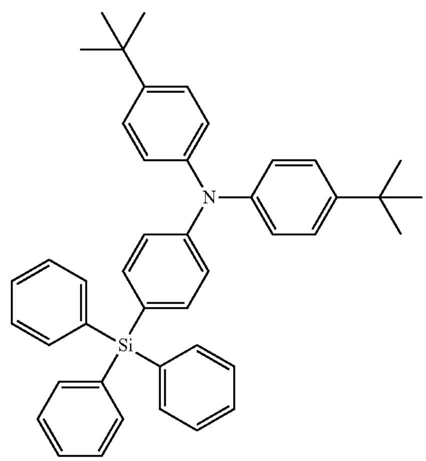
16
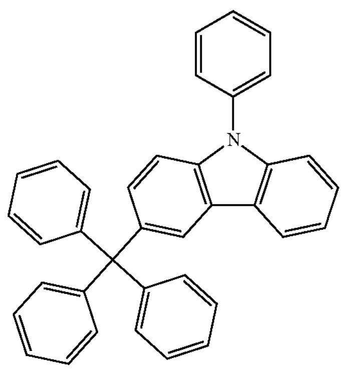
-continued
17
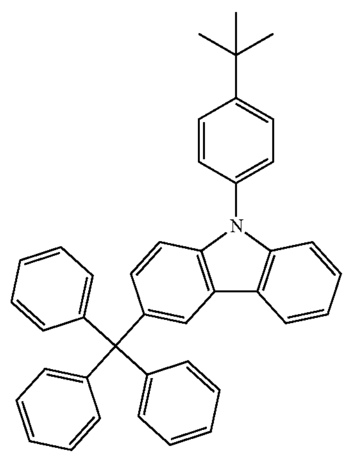
18
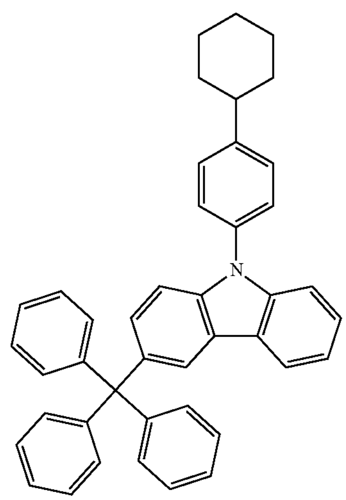
19
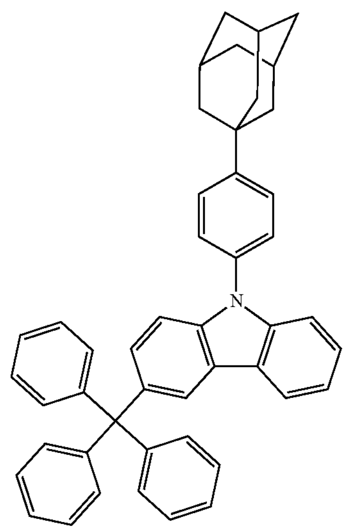

-continued
20
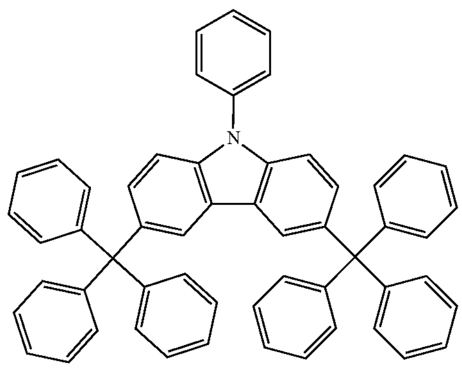
21
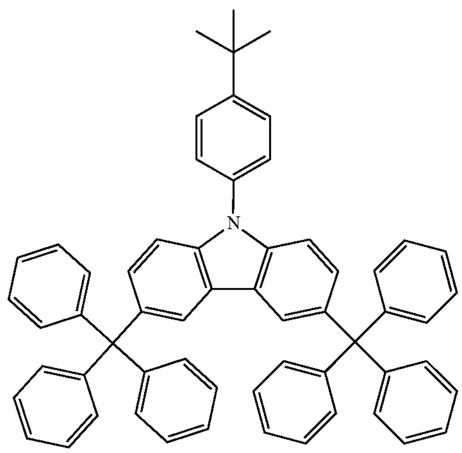
22
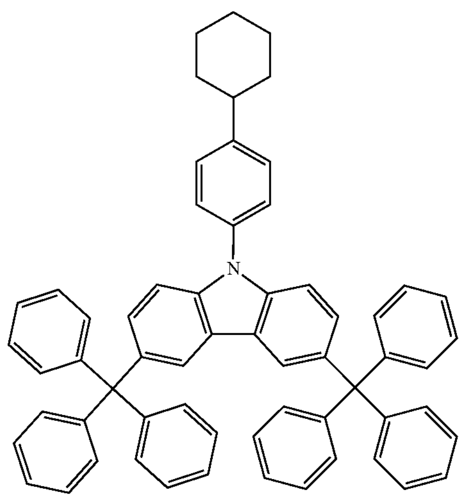
-continued
23
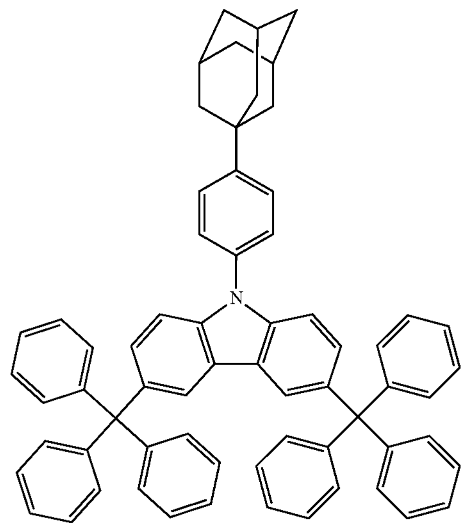
24
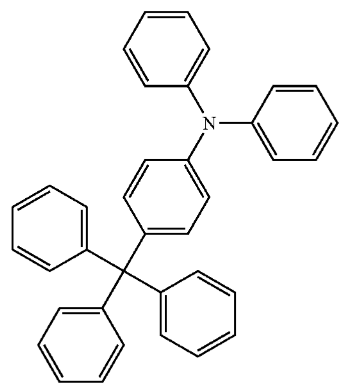
25
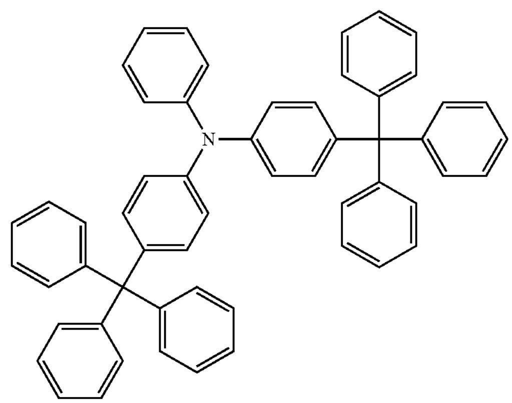

-continued

26

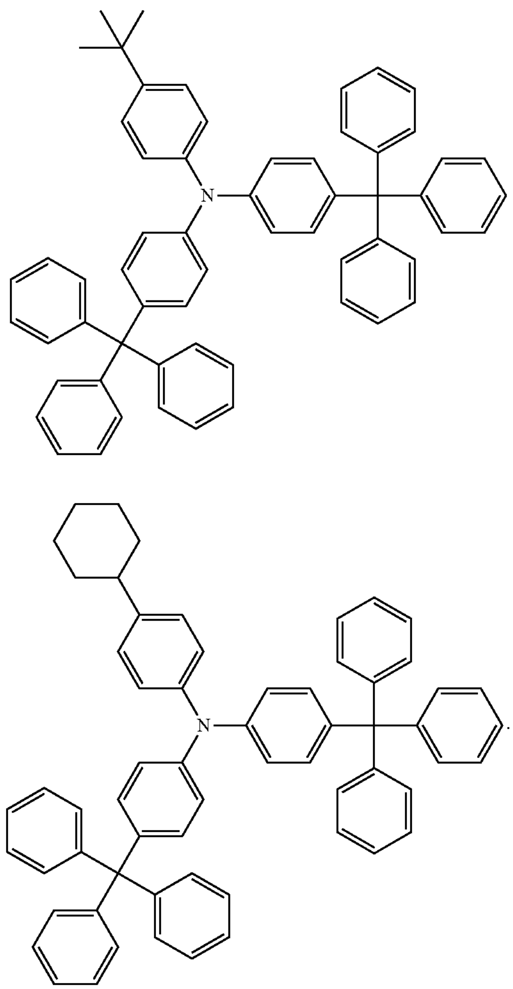

27

The polycyclic compound represented by Formula 1 has a low refractive index. For example, the polycyclic compound represented by Formula 1 has a refractive index of about 1.76 or less with respect to light having a wavelength of about 450 nm. For example, the polycyclic compound represented by Formula 1 may have a refractive index of about 1.6 to about 1.76 with respect to light having a wavelength of about 450 nm. In the disclosure, the term "refractive index of a compound" may refer to a refractive index of a single layer composed of the compound.

The hole transport region HTR of an embodiment may include the polycyclic compound represented by Formula 1, which is a low refractive material, and thus may have a refractive index of less than about 1.8. For example, the hole transport region HTR may have a refractive index of less than about 1.8 with respect to light having a wavelength of about 450 nm.

For example, the hole transport layer HTL included in the hole transport region HTR may include the polycyclic compound represented by Formula 1, and thus the refractive index may satisfy a range of less than about 1.8. For example, the hole transport layer HTL may have a refractive index of less than about 1.8 with respect to light having a wavelength of about 450 nm. The refractive index of the hole transport layer HTL may be from about 1.7 (e.g., greater than 1.7) to about than 1.8 (exclusive of 1.8, e.g., 1.8 or less). The light emitting element ED including the electron transport layer HTL having a refractive index of 1.8 or more may result in a decrease in the luminous efficiency compared with the light emitting element ED including the hole transport layer HTL having a refractive index of less than 1.8. This will be described in more detail.

The hole transport layer HTL has a thickness of about 250 Å or more. For example, the thickness of the hole transport layer HTL may satisfy a value of about 250 Å to about 1,000 Å. As the hole transport layer HTL satisfies the above-described thickness range, an effect of improving the optical efficiency of the element in the above-described refractive index range may be enhanced. The refractive index of the hole transport layer HTL and the effect of improving the optical efficiency versus the thickness will be described in more detail.

In some embodiments, the hole transport region HTR may further include a generally available/used material.

The hole transport region HTR of an embodiment may further include a compound represented by Formula H-1. For example, the hole transport layer HTL may further include the compound represented by Formula H-1.

The hole transport layer HTL of the present disclosure may include the polycyclic compound represented by Formula 1 and the compound represented by Formula H-1, thereby serving to transport holes and block electrons. For example, the hole transport layer HTL of the present disclosure may serve as the electron blocking layer EBL.

Formula H-1

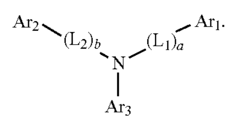

In Formula H-1, $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms. In some embodiments, in Formula H-1, $Ar_3$ may be a substituted or unsubstituted aryl group having 6 to 30 ring-forming carbon atoms. For example, $Ar_3$ may be a substituted or unsubstituted aryl group having 6 to 30 ring-forming carbon atoms at which a substituted or unsubstituted heteroaryl group having 2 to 24 ring-forming carbon atoms is substituted.

In Formula H-1, $L_1$ and $L_2$ may each independently be a direct linkage, a substituted or unsubstituted arylene group having 6 to 30 ring-forming carbon atoms, or a substituted or unsubstituted heteroarylene group having 2 to 30 ring-forming carbon atoms.

a and b may each independently be an integer from 0 to 10. In some embodiments, when a or b is an integer of 2 or greater, a plurality of $L_1$s and $L_2$s may each independently be a substituted or unsubstituted arylene group having 6 to 30 ring-forming carbon atoms, or a substituted or unsubstituted heteroarylene group having 2 to 30 ring-forming carbon atoms.

The compound represented by Formula H-1 may be a monoamine compound. In some embodiments, the compound represented by Formula H-1 may be a diamine compound in which at least one selected from among $Ar_1$ to $Ar_3$ includes the amine group as a substituent. In some embodiments, the compound represented by Formula H-1 may be a carbazole-based compound including a substituted or unsubstituted carbazole group in at least one of $Ar_1$ or $Ar_2$, or a fluorene-based compound including a substituted or unsubstituted fluorene group in at least one of $Ar_1$ or $Ar_2$.

The compound represented by Formula H-1 may be represented by any one selected from among Compounds H-1-1 to H-1-20 in Compound Group H. However, Compounds H-1-1 to H-1-20 listed in Compound Group H are merely examples, and the compounds represented by Formula H-1 are not limited to Compounds H-1-1 to H-1-20:

Compound Group H

H-1-1

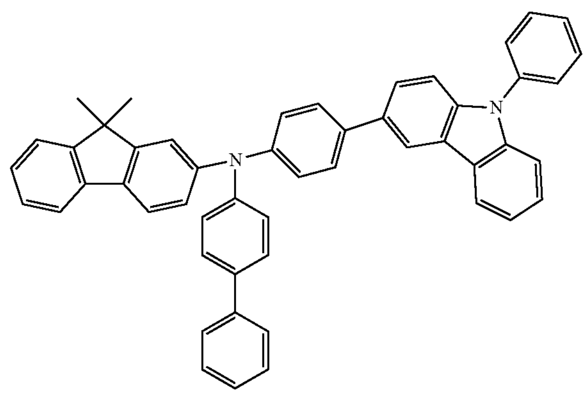

H-1-2

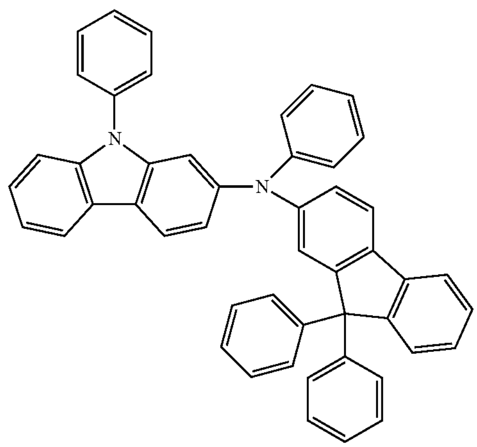

H-1-3

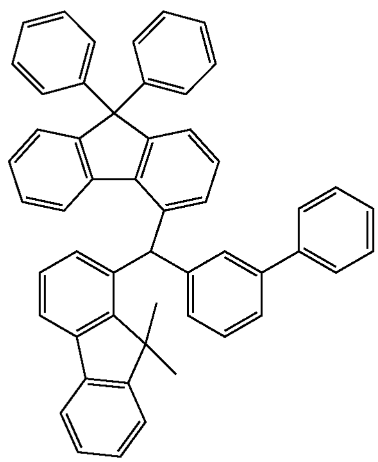

-continued

H-1-4

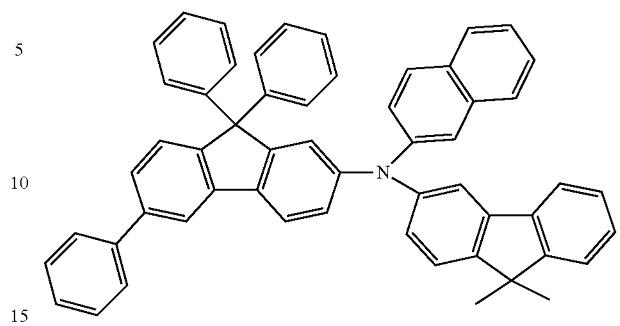

H-1-5

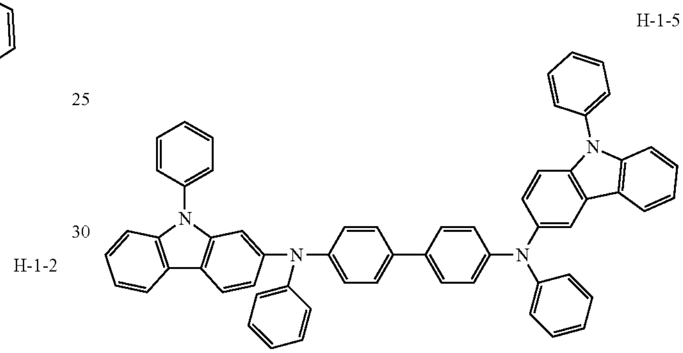

H-1-6

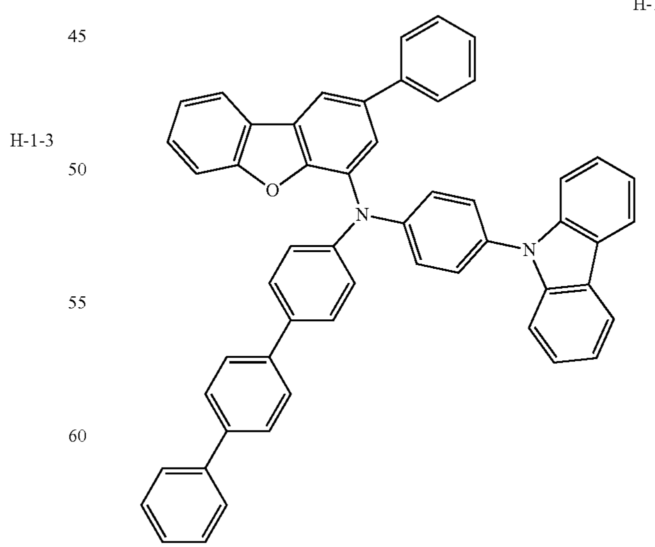

-continued
H-1-7
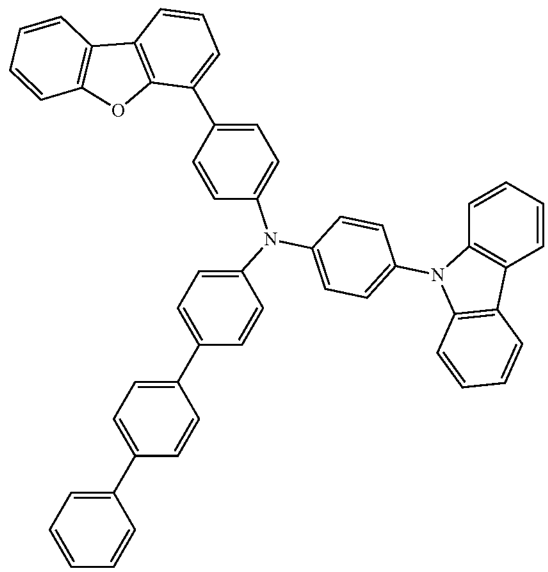
H-1-8
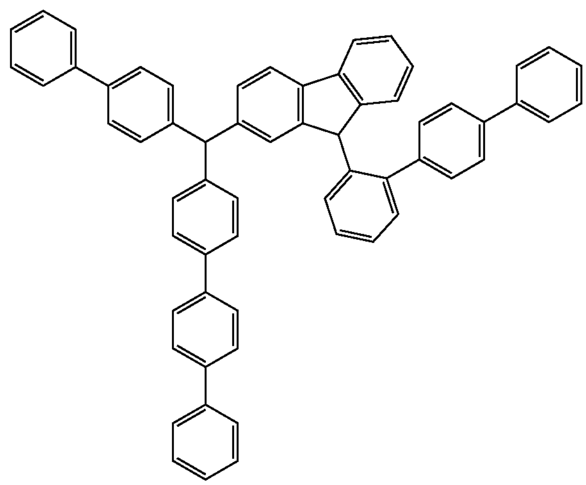
H-1-9
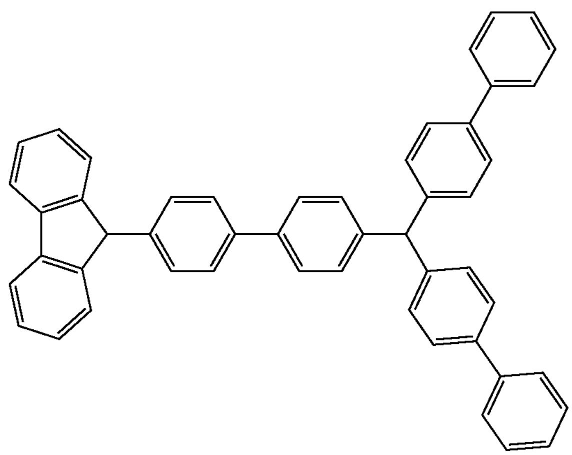
-continued
H-1-10
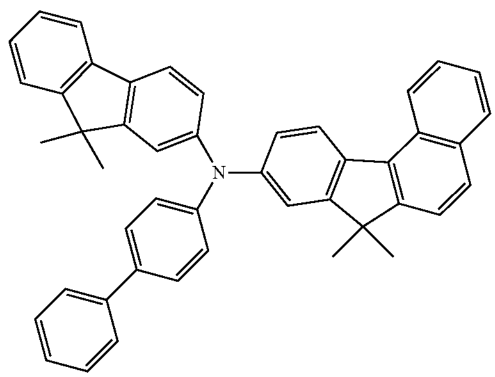
H-1-11
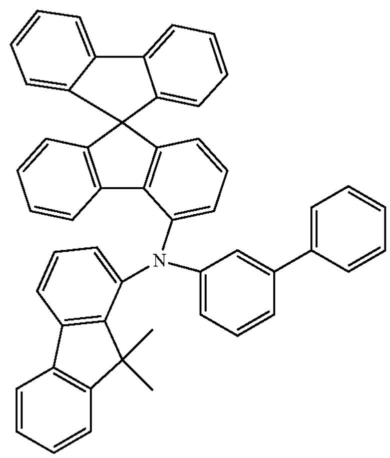
H-1-12
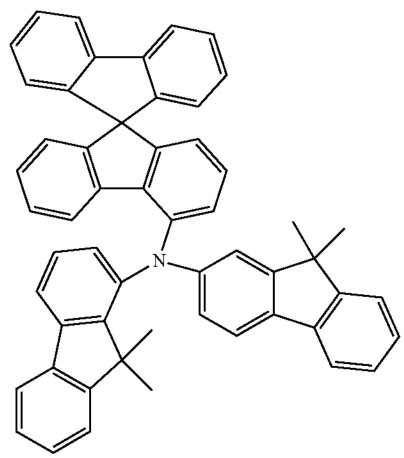

-continued
H-1-13
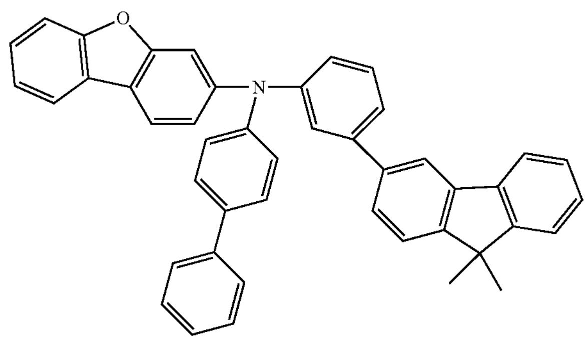
H-1-14
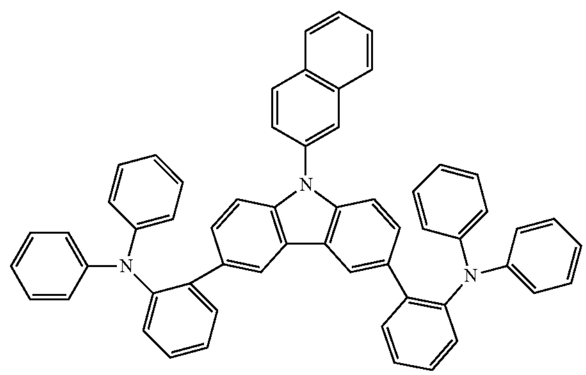
H-1-15
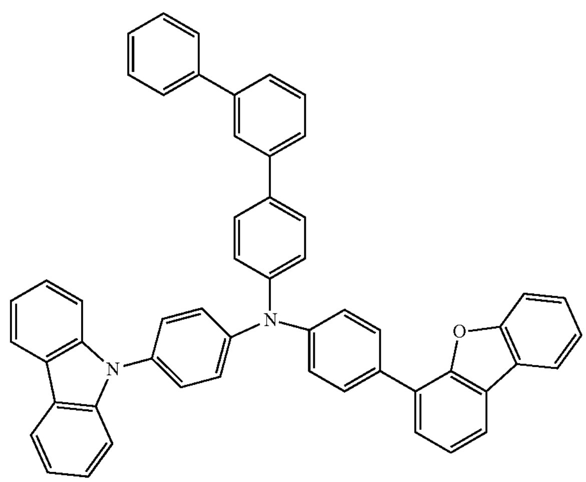
-continued
H-1-16
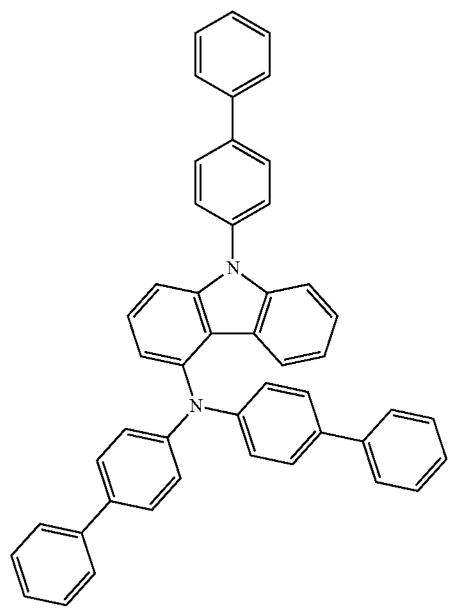
H-1-17
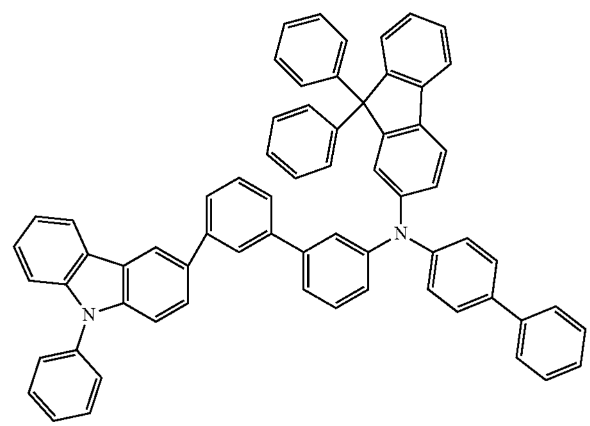
H-1-18
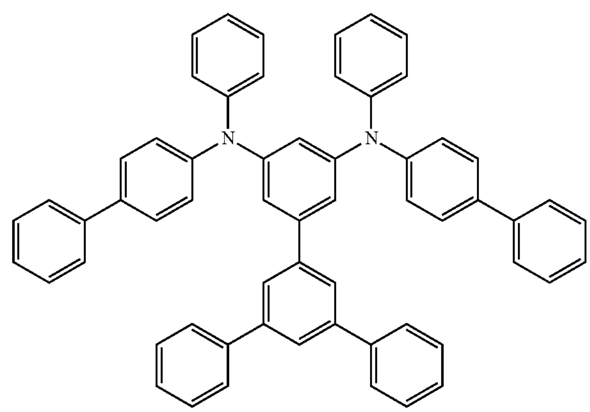

-continued

H-1-19

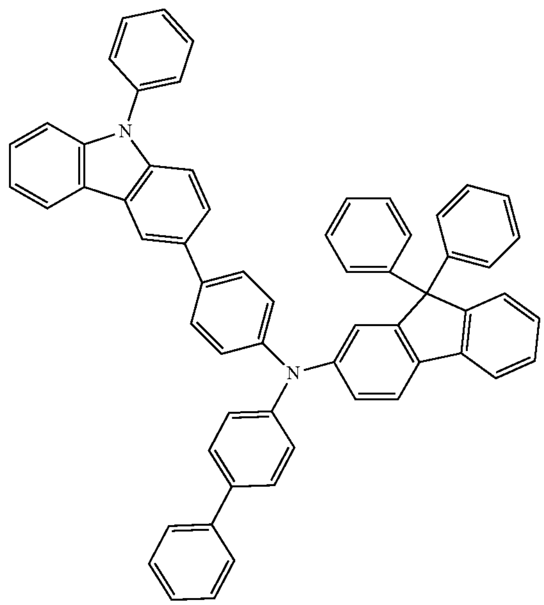

H-1-20

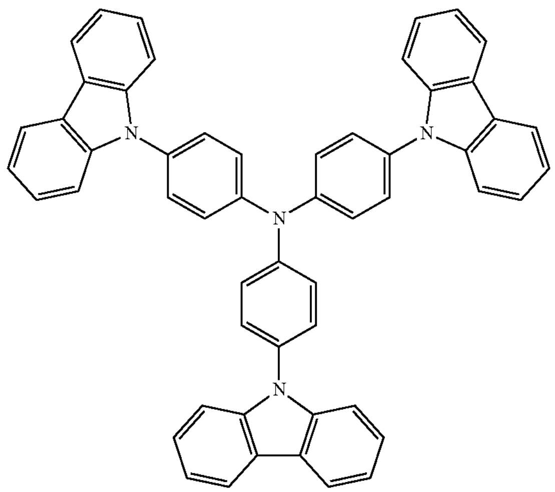

The hole transport region HTR may further include a phthalocyanine compound such as copper phthalocyanine; $N^1,N^{1'}$-([1,1'-biphenyl]-4,4'-diyl)bis($N^1$-phenyl-$N^4,N^4$-di-m-tolylbenzene-1,4-diamine) (DNTPD), 4,4',4"-[tris(3-methylphenyl)phenylamino] triphenylamine (m-MTDATA), 4,4',4"-tris(N,N-diphenylamino)triphenylamine (TDATA), 4,4',4"-tris[N(2-naphthyl)-N-phenylamino]-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-1-yl)-N,N'-diphenyl-benzidine (NPB), triphenylamine-containing polyetherketone (TPAPEK), 4-isopropyl-4'-methyldiphenyliodonium [tetrakis(pentafluorophenyl)borate], dipyrazino[2,3-f:2',3'-h]quinoxaline-2,3,6,7,10,11-hexacarbonitrile (HATCN), and/or the like.

The hole transport region HTR may include a carbazole-based derivative such as N-phenyl carbazole or polyvinyl carbazole, a fluorene-based derivative, a triphenylamine-based derivative such as N,N'-bis(3-methylphenyl)-N,N'-diphenyl-[1,1-biphenyl]-4,4'-diamine (TPD) or 4,4',4"-tris (N-carbazolyl)triphenylamine (TCTA), N,N'-di (naphthalene-1-yl)-N,N'-diphenyl-benzidine (NPB), 4,4'-cyclohexylidene bis[N,N-bis(4-methylphenyl] benzenamine] (TAPC), 4,4'-bis[N,N-(3-tolyl)amino]-3,3'-dimethylbiphenyl (HMTPD), 1,3-bis(N-carbazolyl)benzene (mCP), and/or the like.

In some embodiments, the hole transport region HTR may include 9-(4-tert-butylphenyl)-3,6-bis(triphenylsilyl)-9H-carbazole (CzSi), 9-phenyl-9H-3,9'-bicarbazole (CCP), 1,3-bis(1,8-dimethyl-9H-carbazol-9-yl)benzene (mDCP), etc.

The hole transport region HTR may include the above-described compounds of the hole transport region in at least one of a hole injection layer HIL, a hole transport layer HTL, or an electron blocking layer EBL.

The thickness of the hole transport region HTR may be from about 100 Å to about 10,000 Å, for example, from about 100 Å to about 5,000 Å. When the hole transport region HTR includes the hole injection layer HIL, the hole injection layer HIL may have, for example, a thickness of about 30 Å to about 1,000 Å. When the hole transport region HTR includes the hole transport layer HTL, the hole transport layer HTL may have a thickness of about 250 Å to about 1,000 Å. For example, when the hole transport region HTR includes the electron blocking layer EBL, the electron blocking layer EBL may have a thickness of about 10 Å to about 1,000 Å. When the thicknesses of the hole transport region HTR, the hole injection layer HIL, the hole transport layer HTL and the electron blocking layer EBL satisfy the above-described ranges, satisfactory (suitable) hole transport properties may be achieved without a substantial increase in driving voltage.

The hole transport region HTR may further include a charge generating material to increase conductivity in addition to the above-described materials. The charge generating material may be dispersed substantially uniformly or non-uniformly in the hole transport region HTR. The charge generating material may be, for example, a p-dopant. The p-dopant may include at least one of a halogenated metal compound, a quinone derivative, a metal oxide, or a cyano group-containing compound, but the embodiment of the present disclosure is not limited thereto. For example, the p-dopant may include a metal halide compound such as CuI or RbI, a quinone derivative such as tetracyanoquinodimethane (TCNQ) or 2,3,5,6-tetrafluoro-7,7'8,8-tetracyanoquinodimethane (F4-TCNQ), a metal oxide such as tungsten oxide or molybdenum oxide, a cyano group-containing compound such as dipyrazino[2,3-f:2',3'-h] quinoxaline-2,3,6,7,10,11-hexacarbonitrile (HATCN) or 4-[[2,3-bis[cyano-(4-cyano-2,3,5,6-tetrafluorophenyl)methylidene]cyclopropylidene]-cyanomethyl]-2,3,5,6-tetrafluorobenzonitrile (NDP9), etc., but the embodiment of the present disclosure is not limited thereto.

As described above, the hole transport region HTR may further include at least one of the buffer layer or the electron blocking layer EBL in addition to the hole injection layer HIL and the hole transport layer HTL. The buffer layer may compensate for a resonance distance according to the wavelength of light emitted from the emission layer EML and may thus increase light emission efficiency. A material that may be contained in the hole transport region HTR may also be utilized as a material to be contained in the buffer layer. The electron blocking layer EBL is a layer that serves to prevent or reduce the electron injection from the electron transport region ETR to the hole transport region HTR.

The emission layer EML is provided on the hole transport region HTR. The emission layer EML may have a thickness of, for example, about 100 Å to about 1,000 Å or about 100 Å to about 300 Å. The emission layer EML may have a single layer formed of a single material, a single layer formed of a plurality of different materials or a multilayer structure including a plurality of layers formed of a plurality of different materials.

In the light emitting element ED of an embodiment, the emission layer EML may include an anthracene derivative, a pyrene derivative, a fluoranthene derivative, a chrysene derivative, a dehydrobenzanthracene derivative, or a triphenylene derivative. For example, the emission layer EML may include the anthracene derivative or the pyrene derivative.

In each light emitting element ED of embodiments illustrated in FIGS. 3 to 7, the emission layer EML may further include a generally available/used host and dopant in addition to the above-described host and dopant, and the emission layer EML may include a compound represented by Formula E-1. The compound represented by Formula E-1 may be utilized as a fluorescent host material.

Formula E-1

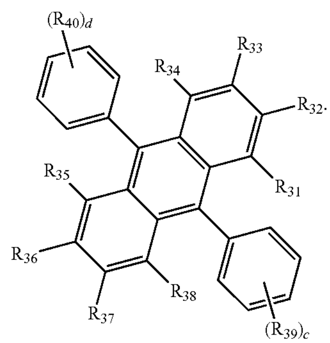

In Formula E-1, $R_{31}$ to $R_{40}$ may each independently be a hydrogen atom, a deuterium atom, a halogen atom, a substituted or unsubstituted silyl group, a substituted or unsubstituted thiol group, a substituted or unsubstituted oxy group, a substituted or unsubstituted alkyl group having 1 to 10 carbon atoms, a substituted or unsubstituted alkenyl group having 2 to 10 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring. In some embodiments, $R_{31}$ to $R_{40}$ may be bonded to an adjacent group to form a saturated hydrocarbon ring or an unsaturated hydrocarbon ring, a saturated heterocycle, or an unsaturated heterocycle.

In Formula E-1, c and d may each independently be an integer from 0 to 5.

Formula E-1 may be represented by any one selected from among Compound E1 to Compound E19:

E1

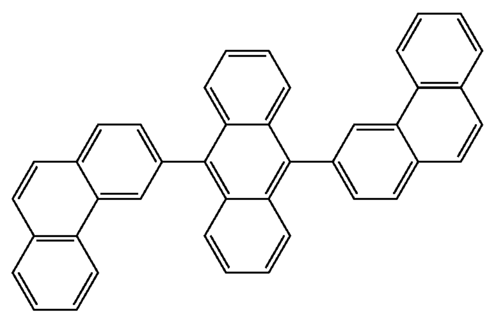

E2

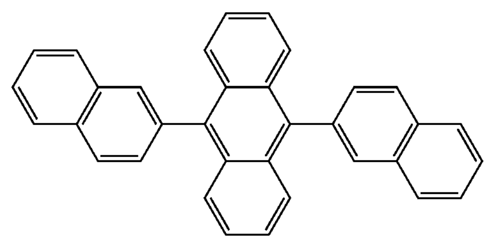

E3

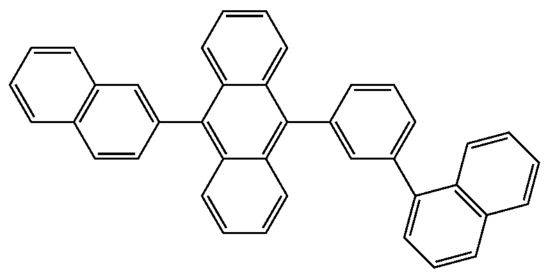

E4

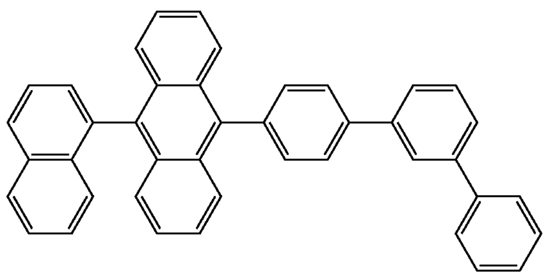

E5

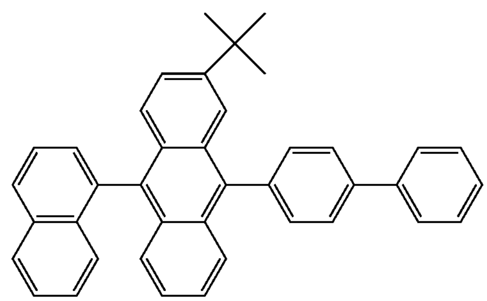

-continued
E6
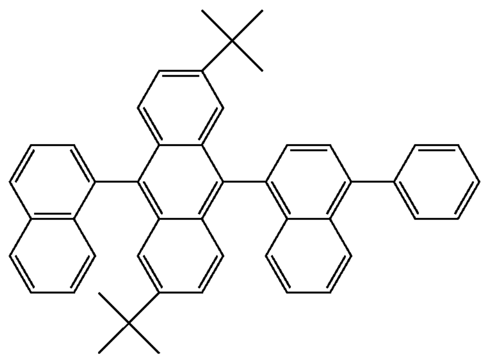
E7
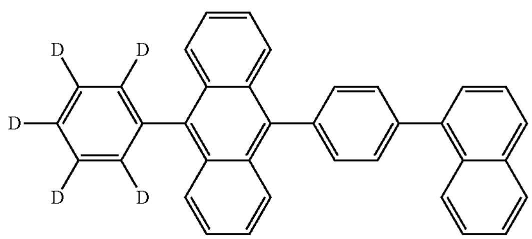
E8
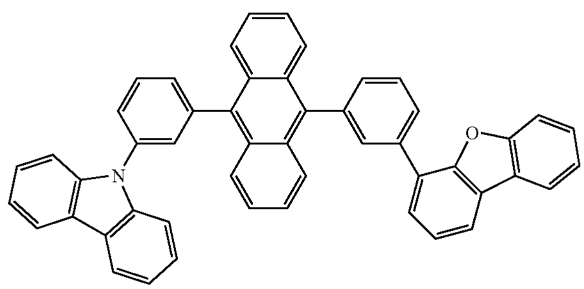
E9
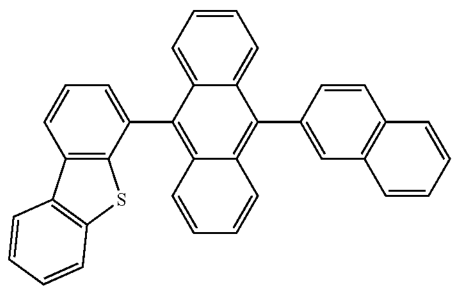
E10
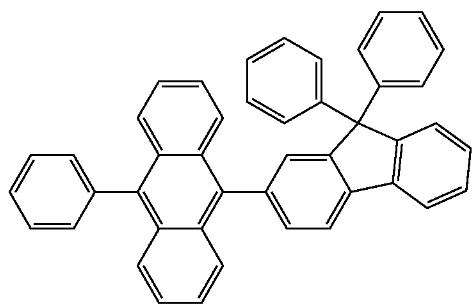
-continued
E11
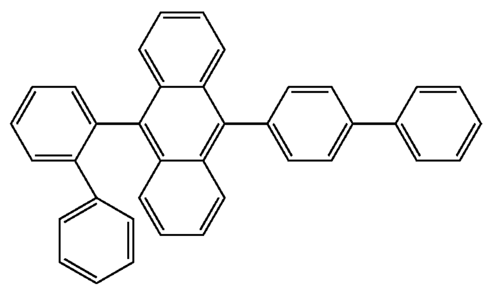
E12
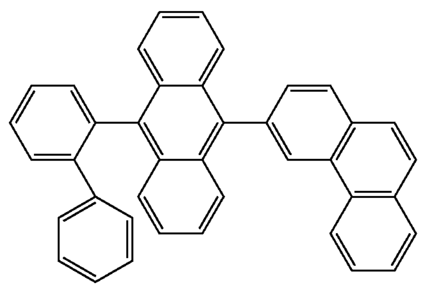
E13
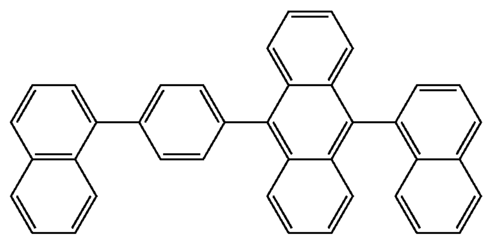
E14
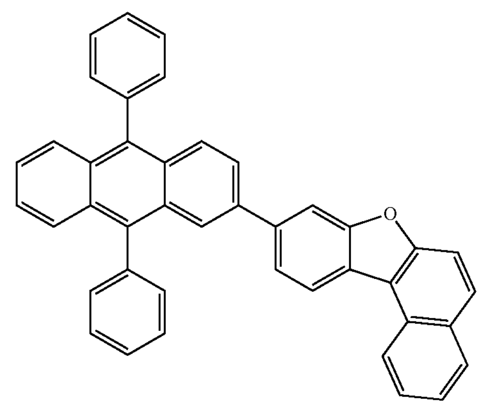

-continued

E15

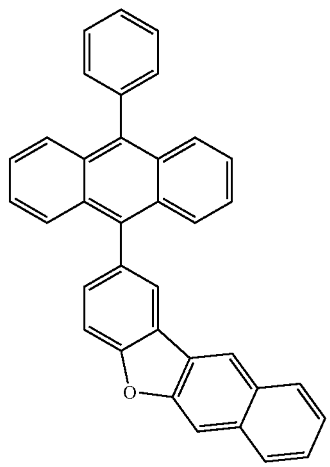

E16

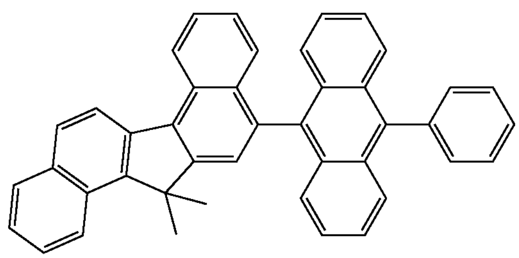

E17

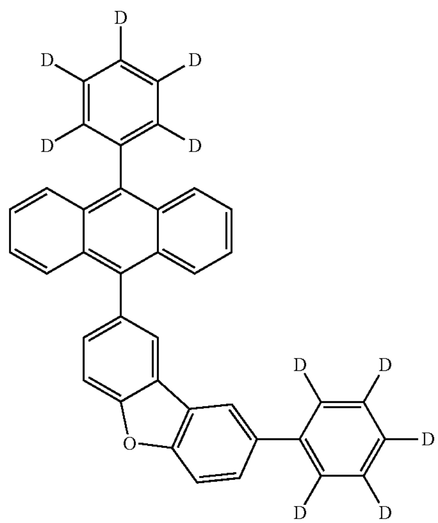

E18

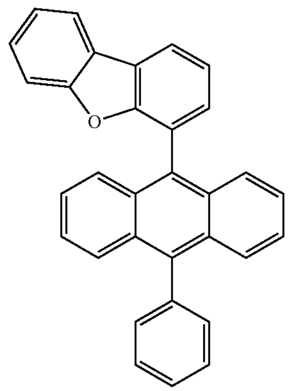

-continued

E19

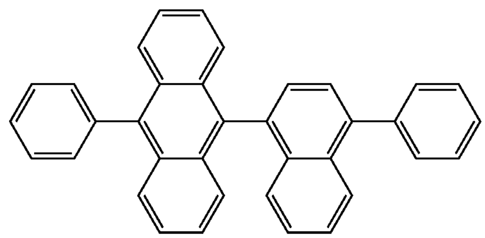

In an embodiment, the emission layer EML may include a compound represented by Formula E-2a or Formula E-2b. The compound represented by Formula E-2a or Formula E-2b may be utilized as a phosphorescent host material.

Formula E-2a]

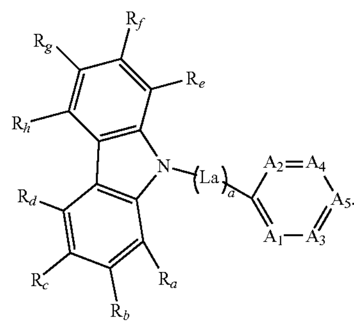

In Formula E-2a, a may be an integer from 0 to 10, La may be a direct linkage, a substituted or unsubstituted arylene group having 6 to 30 ring-forming carbon atoms, or a substituted or unsubstituted heteroarylene group having 2 to 30 ring-forming carbon atoms. In some embodiments, when a is an integer of 2 or more, a plurality of Las may each independently be a substituted or unsubstituted arylene group having 6 to 30 ring-forming carbon atoms, or a substituted or unsubstituted heteroarylene group having 2 to 30 ring-forming carbon atoms.

In some embodiments, in Formula E-2a, $A_1$ to $A_5$ may each independently be N or $CR_i$. $R_a$ to $R_i$ may each independently be a hydrogen atom, a deuterium atom, a substituted or unsubstituted amine group, a substituted or unsubstituted thiol group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring. $R_a$ to $R_i$ may be bonded to an adjacent group to form a hydrocarbon ring or a heterocycle containing N, O, S, etc. as a ring-forming atom.

In some embodiments, in Formula E-2a, two or three selected from among $A_1$ to $A_5$ may be N, and the rest may be $CR_i$.

Formula E-2b

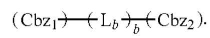

In Formula E-2b, Cbz1 and Cbz2 may each independently be an unsubstituted carbazole group, or a carbazole group substituted with an aryl group having 6 to 30 ring-forming carbon atoms. $L_b$ may be a direct linkage, a substituted or unsubstituted arylene group having 6 to 30 ring-forming carbon atoms, or a substituted or unsubstituted heteroarylene group having 2 to 30 ring-forming carbon atoms. In some embodiments, b may be an integer from 0 to 10, and when b is an integer of 2 or more, a plurality of $L_b$s may each independently be a substituted or unsubstituted arylene group having 6 to 30 ring-forming carbon atoms, or a substituted or unsubstituted heteroarylene group having 2 to 30 ring-forming carbon atoms.

The compound represented by Formula E-2a or Formula E-2b may be represented by any one selected from among the compounds of Compound Group E-2. However, the compounds listed in Compound Group E-2 are merely examples, and the compound represented by Formula E-2a or Formula E-2b is not limited to those represented in Compound Group E-2.

Compound Group E-2

E-2-1

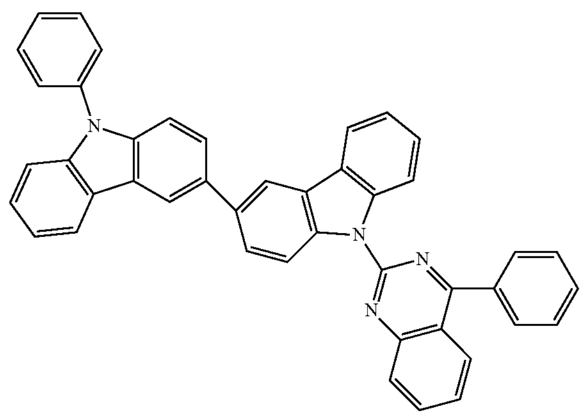

E-2-2

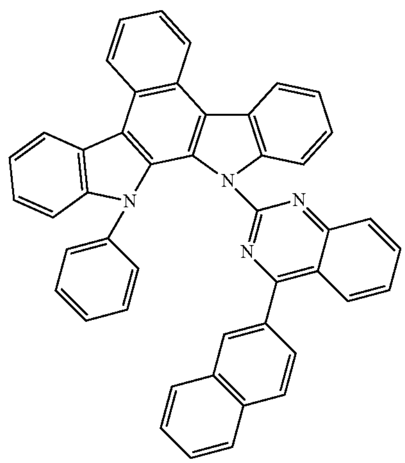

-continued

E-2-3

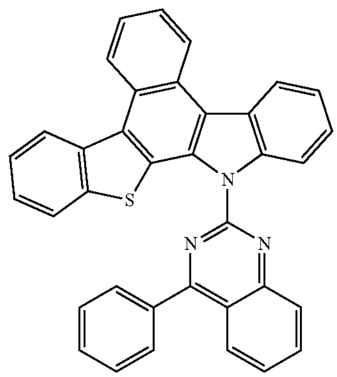

E-2-4

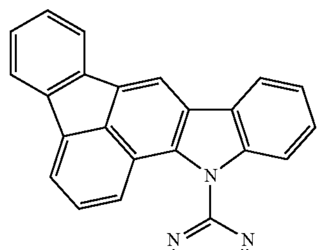

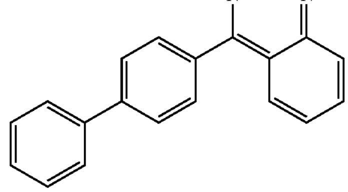

E-2-5

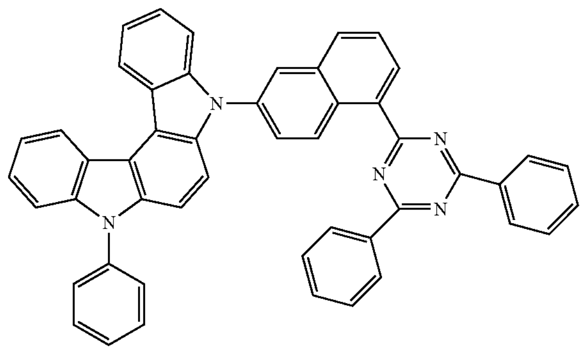

E-2-6

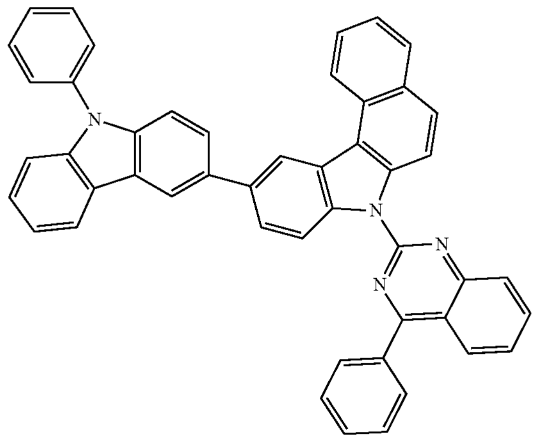

-continued
E-2-7
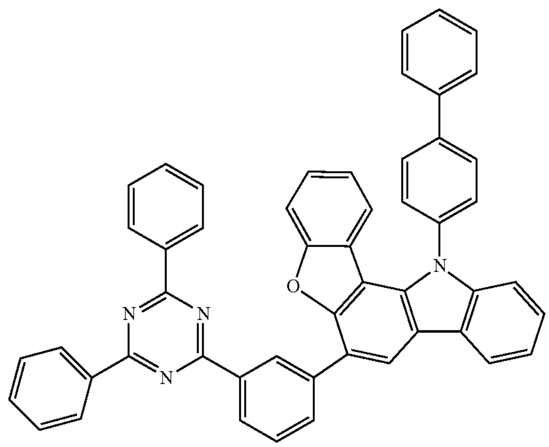
E-2-8
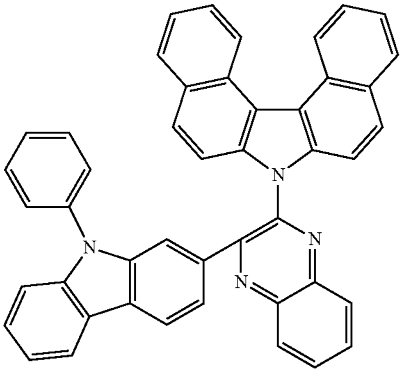
E-2-9
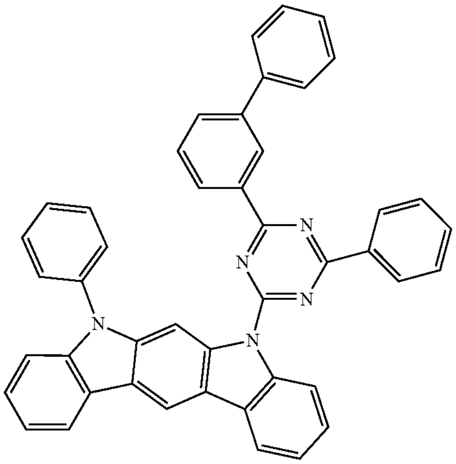
-continued
E-2-10
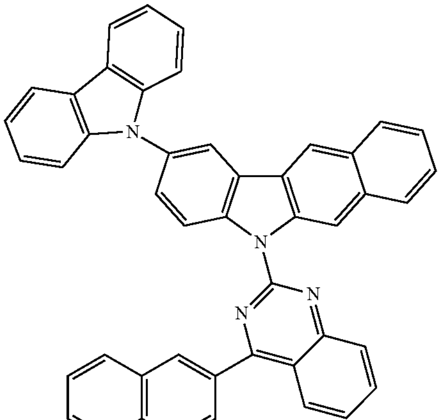
E-2-11
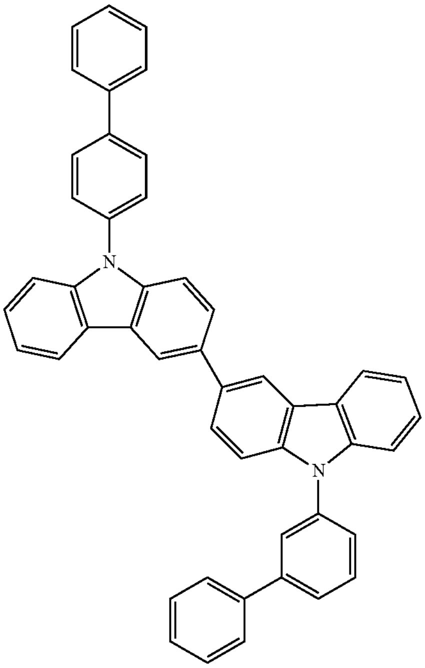
E-2-12
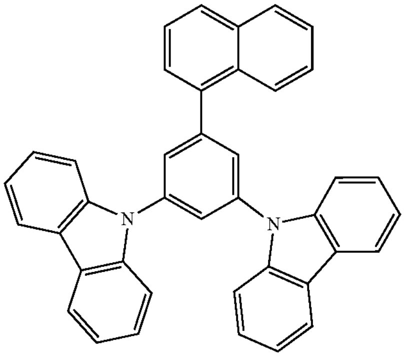

-continued
E-2-13
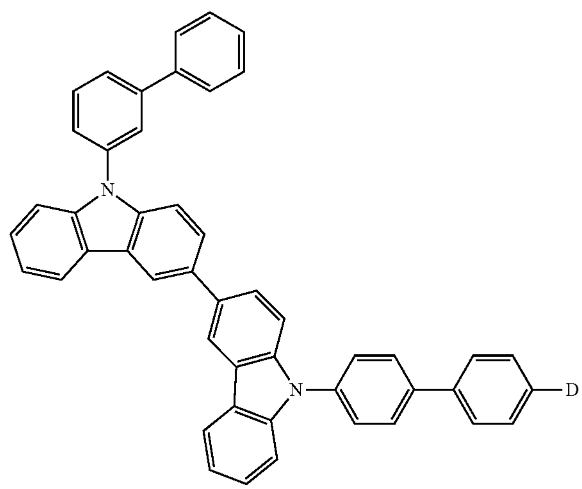
E-2-14
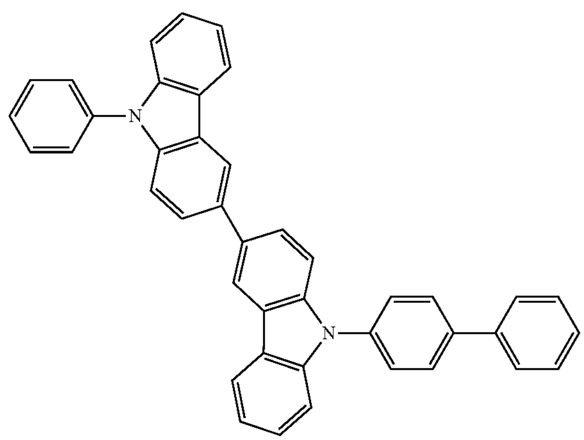
E-2-15
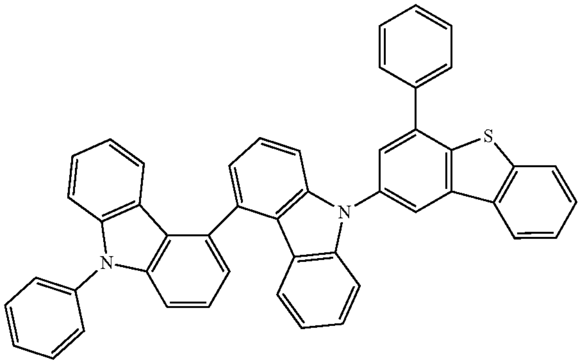
-continued
E-2-16
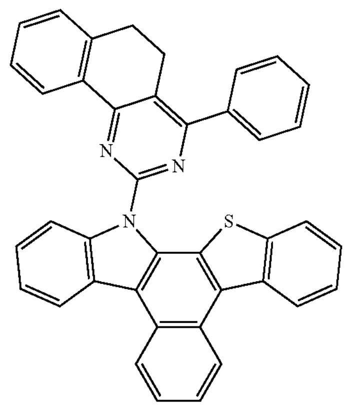
E-2-17
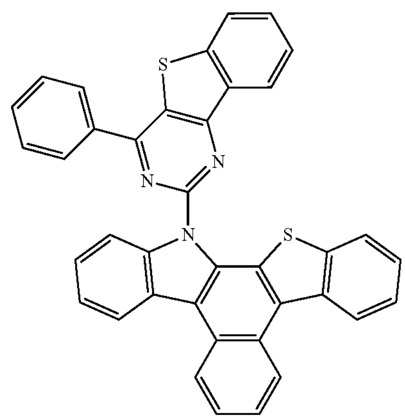
E-2-18
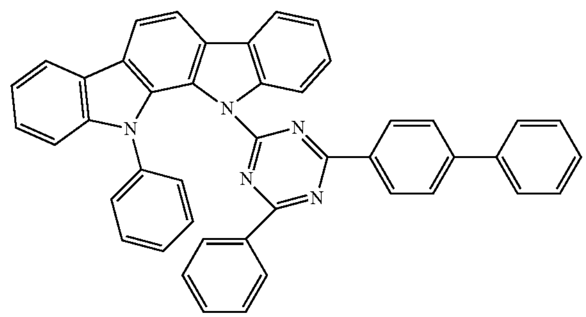
E-2-19
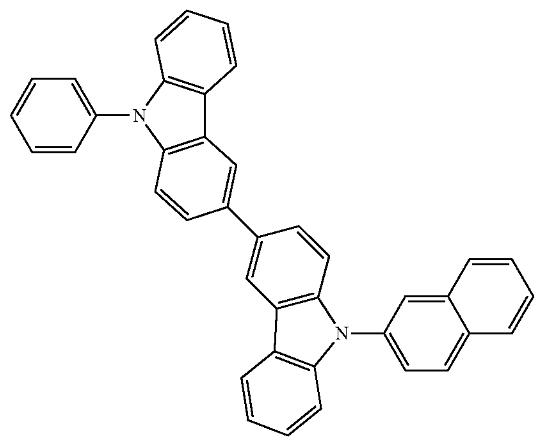

-continued

E-2-20

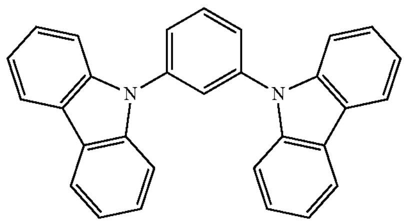

E-2-21

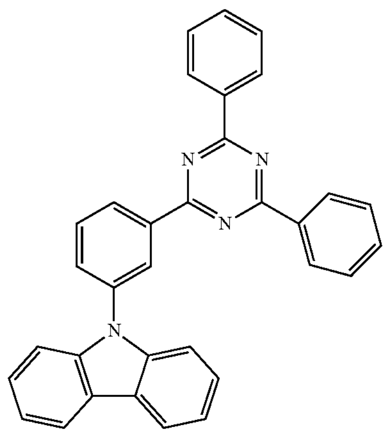

E-2-22

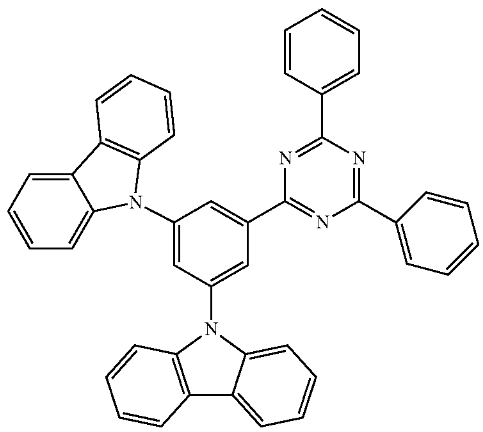

E-2-23

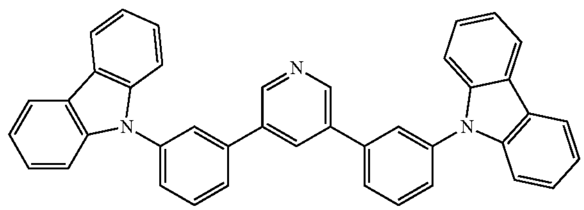

-continued

E-2-24

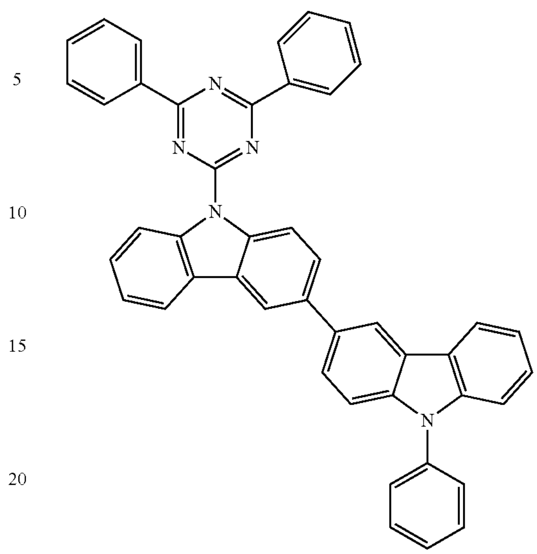

The emission layer EML may further include a generally available/used material as a host material. For example, the emission layer EML may include, as a host material, at least one of bis(4-(9H-carbazol-9-yl)phenyl)diphenylsilane (BCPDS), (4-(1-(4-(diphenylamino)phenyl)cyclohexyl)phenyl)diphenyl-phosphine oxide (POPCPA), bis[2-(diphenylphosphino)phenyl]ether oxide (DPEPO), 4,4'-bis(N-carbazolyl)-1,1'-biphenyl (CBP), 1,3-bis(carbazol-9-yl) benzene (mCP), 2,8-bis(diphenylphosphoryl)dibenzo[b,d] furan (PPF), 4,4',4"-tris(carbazol-9-yl)-triphenylamine (TCTA), or 1,3,5-tris(1-phenyl-1H-benzo[d]imidazole-2-yl) benzene (TPBi). However, the embodiment of the present disclosure is not limited thereto, for example, tris(8-hydroxyquinolino)aluminum (Alq3), 9,10-di(naphthalene-2-yl)anthracene (ADN), 2-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH2), hexaphenylcyclotrisiloxane ($DPSiO_3$), octaphenylcyclotetra siloxane ($DPSiO_4$), etc. may be utilized as a host material.

The emission layer EML may further include a compound represented by Formula M-a or Formula M-b. The compound represented by Formula M-a or Formula M-b may be utilized as a phosphorescent dopant material.

Formula M-a

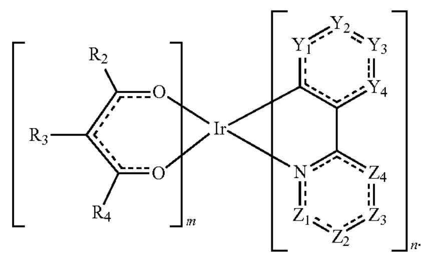

In Formula M-a, $Y_1$ to $Y_4$ and $Z_1$ to $Z_4$ may each independently be $CR_1$ or N, $R_1$ to $R_4$ may each independently be a hydrogen atom, a deuterium atom, a substituted or unsubstituted amine group, a substituted or unsubstituted thiol group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring. In Formula M-a, m may be 0 or 1, and n may be 2 or 3. In Formula M-a, when m is 0, n may be 3, and when m is 1, n may be 2.

The compound represented by Formula M-a may be utilized as a phosphorescent dopant.

The compound represented by Formula M-a may be represented by any one selected from among Compound M-a1 to Compound M-a25. However, Compounds M-a1 to M-a25 are example, and the compound represented by Formula M-a is not limited to those represented by Compounds M-a1 to M-a25.

M-a1

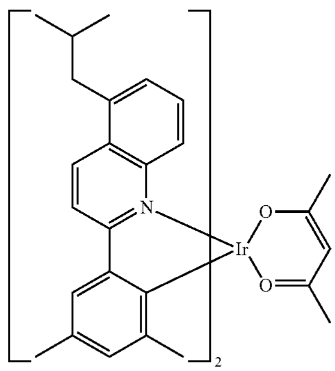

M-a2

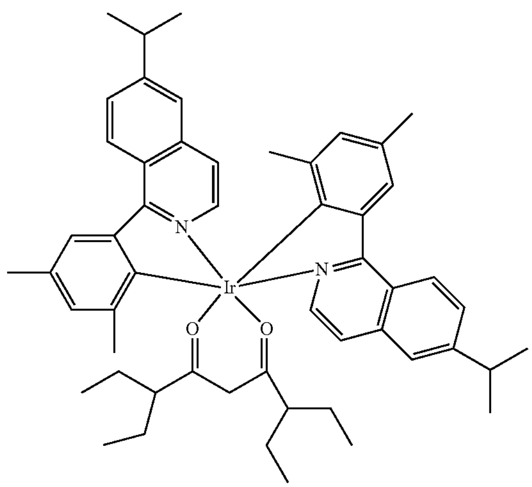

-continued

M-a3

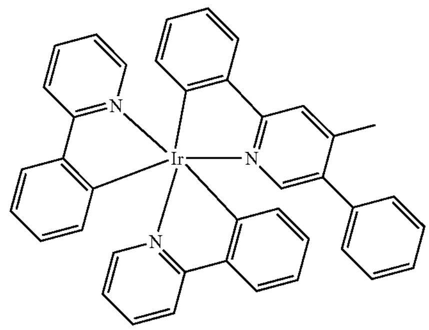

M-a4

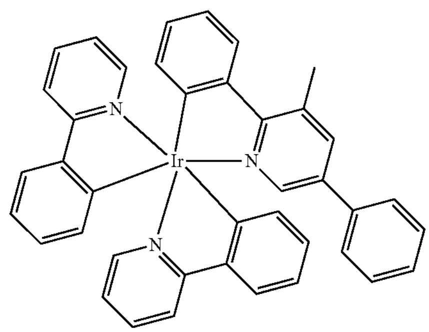

M-a5

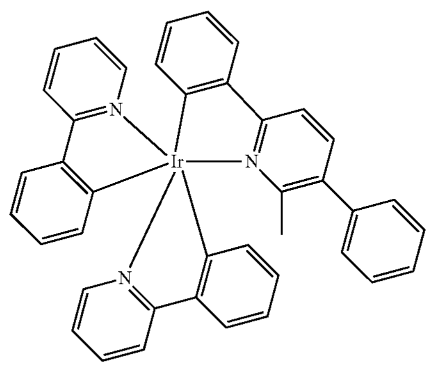

M-a6

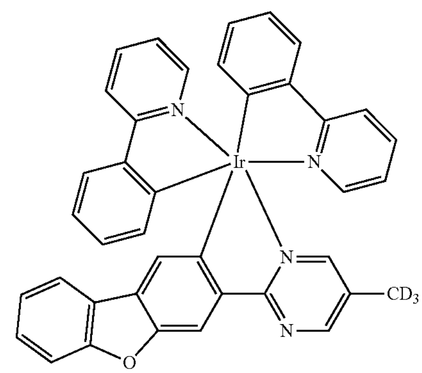

-continued
M-a7
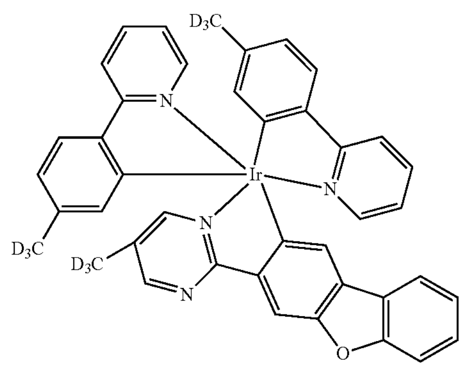
M-a8
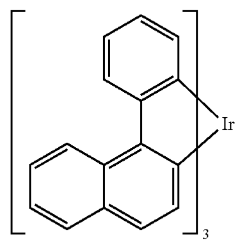
M-a9
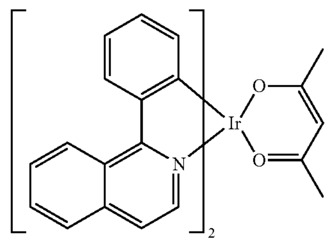
M-a10
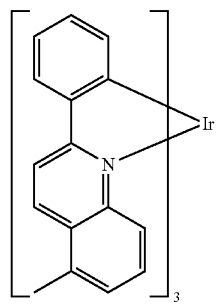
M-a11
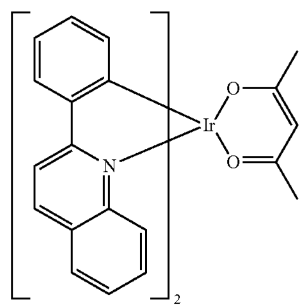
-continued
M-a12
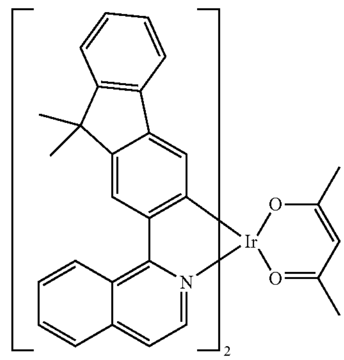
M-a13
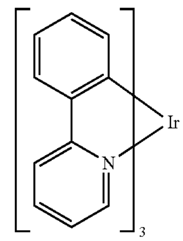
M-a14
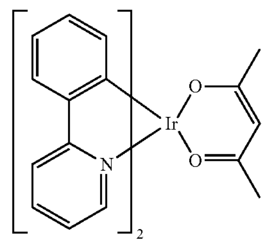
M-a15
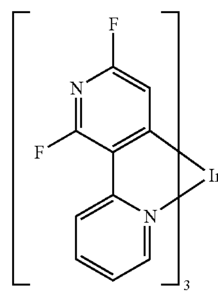
M-a16
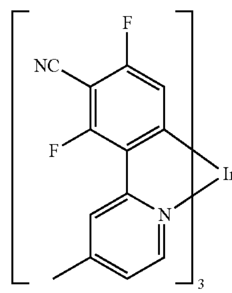

-continued
M-a17
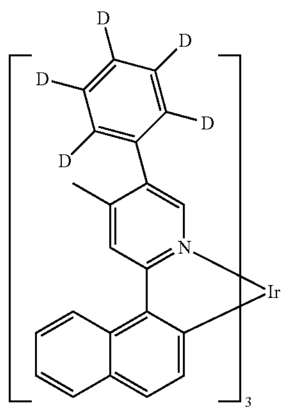
M-a18
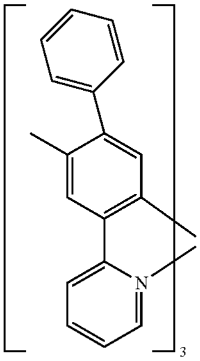
M-a19
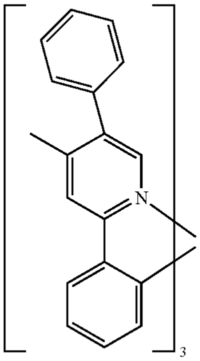
M-a20
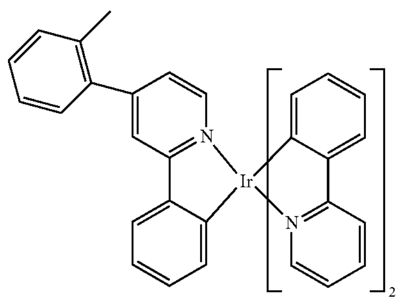
-continued
M-a21
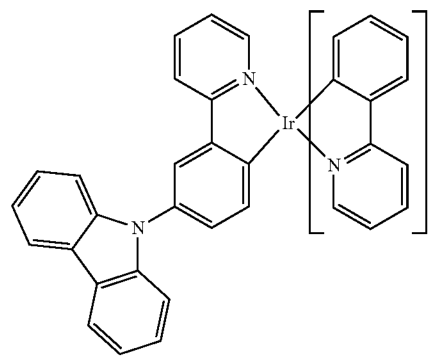
M-a22
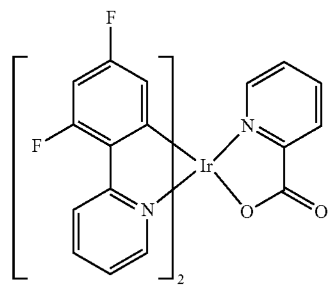
M-a23
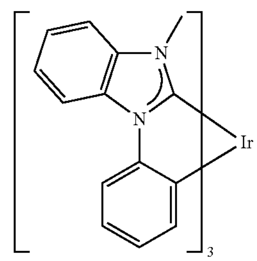
M-a24
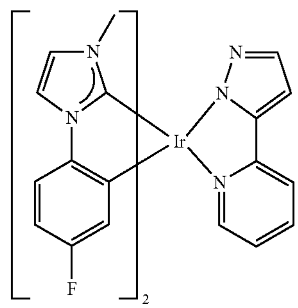
M-a25
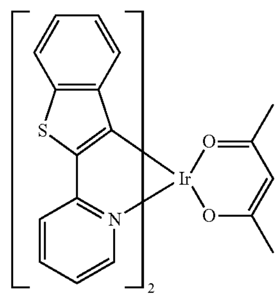

-continued

Formula M-b

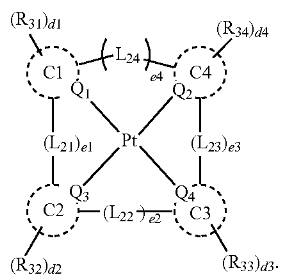

In Formula M-b, $Q_1$ to $Q_4$ may each independently be C or N, and $C_1$ to $C_4$ may each independently be a substituted or unsubstituted hydrocarbon ring having 5 to 30 ring-forming carbon atoms, or a substituted or unsubstituted heterocycle having 2 to 30 ring-forming carbon atoms. $L_{21}$ to $L_{24}$ may each independently be a direct linkage,

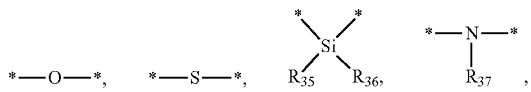

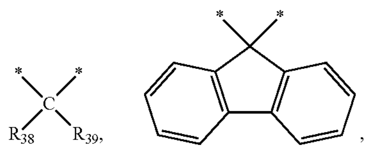

a substituted or unsubstituted divalent alkyl group having 1 to 20 carbon atoms, a substituted or unsubstituted arylene group having 6 to 30 ring-forming carbon atoms, or a substituted or unsubstituted heteroarylene group having 2 to 30 ring-forming carbon atoms, and el to e4 may each independently be 0 or 1. $R_{31}$ to $R_{39}$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or are bonded to an adjacent group to form a ring, and d1 to d4 may each independently be an integer from 0 to 4.

The compound represented by Formula M-b may be utilized as a blue phosphorescent dopant or a green phosphorescent dopant.

The compound represented by Formula M-b may be represented by any one selected from among Compounds M-b-1 to M-b-11. However, the following compounds are merely examples, and the compounds represented by Formula M-b are not limited to Compounds M-b-1 to M-b-11:

M-b-1

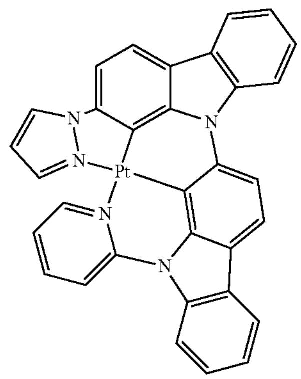

M-b-2

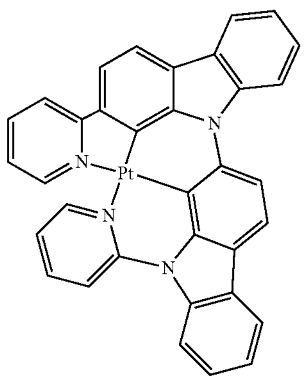

M-b-3

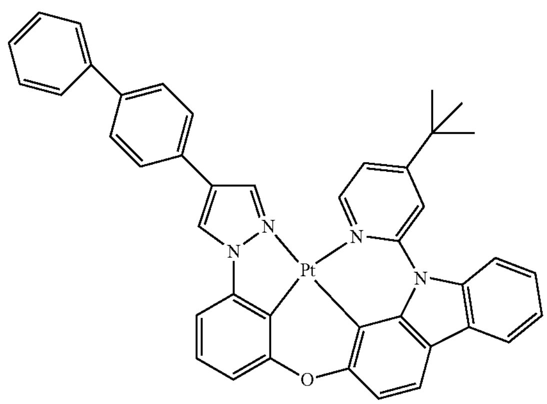

M-b-4

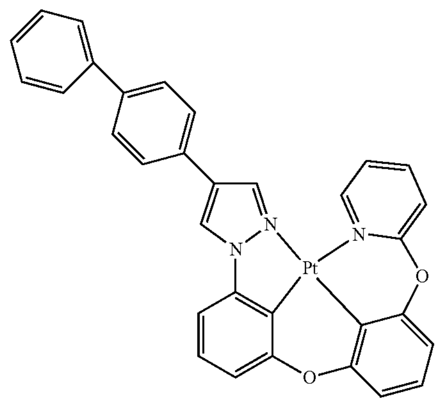

-continued

M-b-5

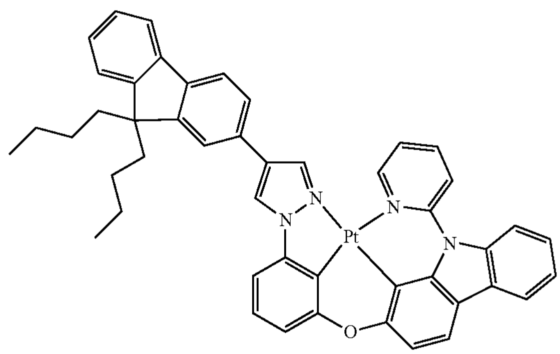

M-b-6

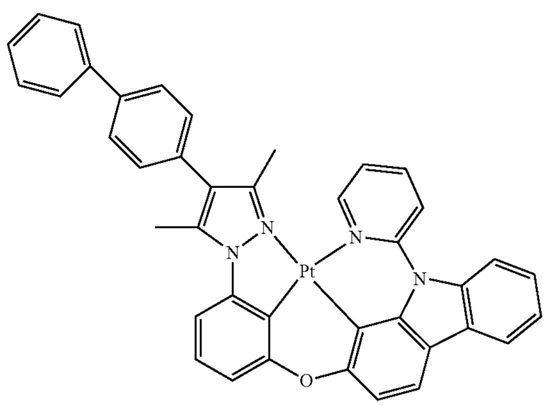

M-b-7

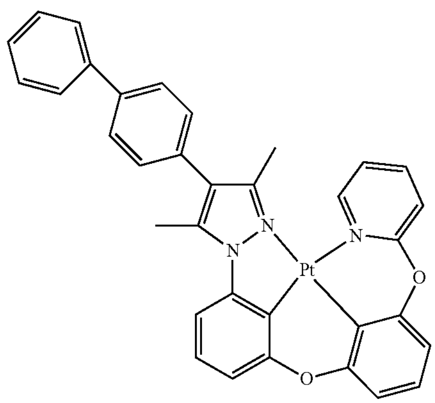

M-b-8

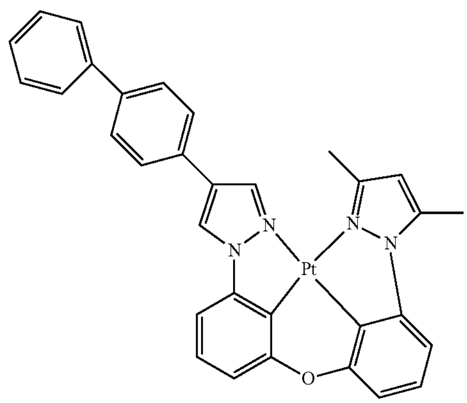

-continued

M-b-9

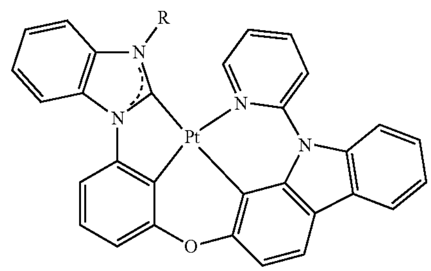

M-b-10

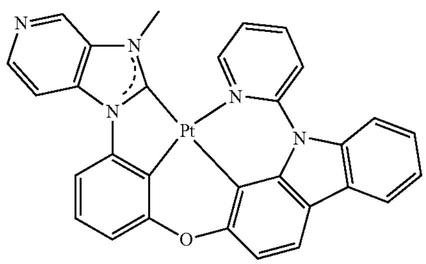

M-b-11

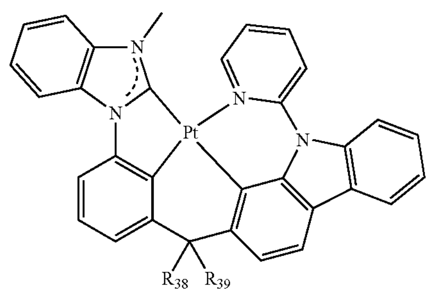

In the compounds, R, $R_{38}$, and $R_{39}$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

The emission layer EML may further include a compound represented by any one selected from among Formula F-a to Formula F-c. The compound represented by Formula F-a or Formula F-c may be utilized as a fluorescence dopant material.

Formula F-a

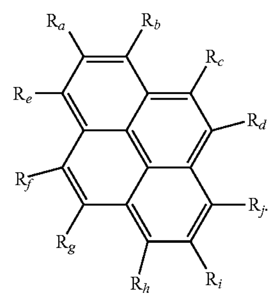

In Formula F-a, two substituents selected from among $R_a$ to $R_j$ may each independently be substituted with $*—NAr_1Ar_2$. The others, which are not substituted with

*—$NAr_1Ar_2$ selected from among $R_a$ to $R_j$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In *—$NAr_1Ar_2$, $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms. For example, at least one of $Ar_1$ or $Ar_2$ may be a heteroaryl group containing 0 or S as a ring-forming atom.

Formula F-b

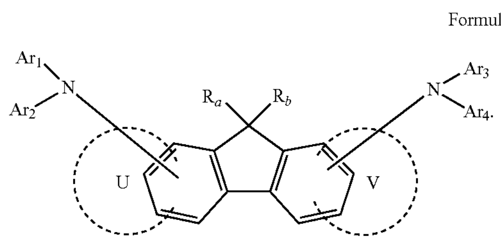

In Formula F-b, $Ar_1$ to $Ar_2$ may each independently be a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring.

In Formula F-b, $R_a$ and $R_b$ may each independently be a hydrogen atom, a deuterium atom, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring.

In Formula F-b, U and V may each independently be a substituted or unsubstituted hydrocarbon ring having 5 to 30 ring-forming carbon atoms, or a substituted or unsubstituted heterocycle having 2 to 30 ring-forming carbon atoms.

In Formula F-b, the number of rings represented by U and V may each independently be 0 or 1. For example, in Formula F-b, it refers to that when the number of U or V is 1, one ring constitutes a fused ring at a portion indicated by U or V, and when the number of U or V is 0, a ring indicated by U or V does not exist. For example, when the number of U is 0 and the number of V is 1, or when the number of U is 1 and the number of V is 0, the fused ring having a fluorene core in Formula F-b may be a cyclic compound having four rings. In some embodiments, when each number of U and V is 0, the fused ring in Formula F-b may be a cyclic compound having three rings. In some embodiments, when each number of U and V is 1, the fused ring having a fluorene core in Formula F-b may be a cyclic compound having five rings.

Formula F-c

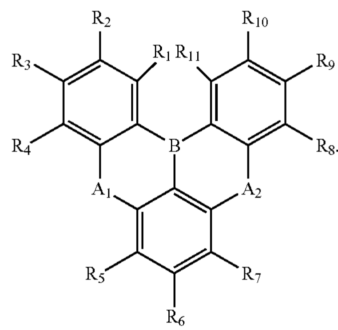

In Formula F-c, $A_1$ and $A_2$ may each independently be 0, S, Se, or $NR_m$, and $R_m$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. $R_1$ to $R_{11}$ may each independently be a hydrogen atom, a deuterium atom, a halogen atom, a cyano group, a substituted or unsubstituted amine group, a substituted or unsubstituted boryl group, a substituted or unsubstituted oxy group, a substituted or unsubstituted thiol group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or are bonded to an adjacent group to form a ring.

In Formula F-c, $A_1$ and $A_2$ may each independently be bonded to substituents of an adjacent ring to form a condensed ring. For example, when $A_1$ and $A_2$ may each independently be $NR_m$, $A_1$ may be bonded to $R_4$ or $R_5$ to form a ring. In some embodiments, $A_2$ may be bonded to $R_7$ or $R_8$ to form a ring.

In an embodiment, the emission layer EML may further include, as a generally available/used dopant material, styryl derivatives (e.g., 1,4-bis[2-(3-N-ethylcarbazoryl)vinyl]benzene (BCzVB), 4-(di-p-tolylamino)-4'-[(di-p-tolylamino)styryl]stilbene (DPAVB), and/or N-(4-((E)-2-(6-((E)-4-(diphenylamino)styryl)naphthalen-2-yl)vinyl)phenyl)-N-phenylbenzenamine (N-BDAVBi), 4,4'-bis[2-(4-(N,N-diphenylamino)phenyl)vinyl]biphenyl(DPAVBi), perylene and/or the derivatives thereof (e.g., 2,5,8,11-tetra-t-butylperylene (TBP)), pyrene and/or the derivatives thereof (e.g., 1,1-dipyrene, 1,4-dipyrenylbenzene, and/or 1,4-bis(N,N-diphenylamino)pyrene), etc.

The emission layer EML may further include a suitable phosphorescence dopant material. For example, a metal complex containing iridium (Ir), platinum (Pt), osmium (Os), aurum (Au), titanium (Ti), zirconium (Zr), hafnium (Hf), europium (Eu), terbium (Tb), or thulium (Tm) may be utilized as a phosphorescent dopant. For example, iridium (III) bis(4,6-difluorophenylpyridinato-N,C2')picolinate (Flrpic), bis(2,4-difluorophenylpyridinato)-tetrakis(1-pyrazolyl)borate (Fir6), or platinum octaethyl porphyrin (PtOEP) may be utilized as a phosphorescent dopant. However, the embodiment of the present disclosure is not limited thereto.

The emission layer EML may include a quantum dot material. The core of the quantum dot may be selected from among a Group II-VI compound, a Group III-VI compound, a Group I-III-IV compound, a Group III-V compound, a Group III-II-V compound, a Group IV-VI compound, a Group IV element, a Group IV compound, and one or more combinations thereof.

The Group II-VI compound may be selected from the group including (e.g., consisting of) a binary compound selected from the group including (e.g., consisting of) CdSe, CdTe, CdS, ZnS, ZnSe, ZnTe, ZnO, HgS, HgSe, HgTe, MgSe, MgS, and a mixture thereof, a ternary compound selected from the group including (e.g., consisting of) CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, and a quaternary compound selected from the group including (e.g., consisting of) HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-VI compound may include a binary compound such as $In_2S_3$ or $In_2Se_3$, a ternary compound such as $InGaS_3$ or $InGaSe_3$, or one or more combinations thereof.

The Group I-III-VI compound may be selected from a ternary compound selected from the group including (e.g., consisting of) AgInS, $AgInS_2$, CuInS, $CuInS_2$, $AgGaS_2$, $CuGaS_2$ $CuGaO_2$, $AgGaO_2$, $AgAlO_2$, and one or more compounds or mixtures thereof, and/or a quaternary compound such as $AgInGaS_2$ or $CuInGaS_2$ (the quaternary compound may be used alone or in combination with any of the foregoing compounds or mixtures; and the quaternary compound may also be combined with other quaternary compounds).

The Group III-V compound may be selected from the group including (e.g., consisting of) a binary compound selected from the group including (e.g., consisting of) GaN, GaP, GaAs, GaSb, AlN, AlP, AlAs, AlSb, InN, InP, InAs, InSb, and one or more compounds or mixtures thereof, a ternary compound selected from the group including (e.g., consisting of) GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and one or more compounds or mixtures thereof, and a quaternary compound selected from the group including (e.g., consisting of) GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and one or more compounds or mixtures thereof. In some embodiments, the Group III-V compound may further include a Group II metal. For example, InZnP, etc. may be selected as a Group III-II-V compound.

The Group IV-VI compound may be selected from the group including (e.g., consisting of) a binary compound selected from the group including (e.g., consisting of) SnS, SnSe, SnTe, PbS, PbSe, PbTe, and a mixture thereof, a ternary compound selected from the group including (e.g., consisting of) SnSeS, SnSeTe, SnSTe, PbSeS, PbSeTe, PbSTe, SnPbS, SnPbSe, SnPbTe, and one or more compounds or mixtures thereof, and a quaternary compound selected from the group including (e.g., consisting of) SnPbSSe, SnPbSeTe, SnPbSTe, and one or more compounds or mixtures thereof. The Group IV element may be selected from the group including (e.g., consisting of) Si, Ge, and one or more compounds or mixtures thereof. The Group IV compound may be a binary compound selected from the group including (e.g., consisting of) SiC, SiGe, and one or more compounds or mixtures thereof.

In this embodiment, a binary compound, a ternary compound, or a quaternary compound may be present in a particle form and the particle being with a uniform concentration distribution, or may be present in substantially the same particle with a partially different concentration distribution. In some embodiments, a core/shell structure in which one quantum dot surrounds another quantum dot may also be possible. The core/shell structure may have a concentration gradient in which the concentration of elements present in the shell decreases toward the core.

In some embodiments, the quantum dot may have the above-described core/shell structure including a core containing nanocrystals and a shell around (e.g., surrounding) the core. The shell of the quantum dot may serve as a protection layer to prevent or reduce the chemical deformation of the core so as to maintain semiconductor properties, and/or a charging layer to impart electrophoresis properties to the quantum dot. The shell may be a single layer or a multilayer. An example of the shell of the quantum dot may include a metal or non-metal oxide, a semiconductor compound, or a combination thereof.

For example, the metal or non-metal oxide may be a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO, or a ternary compound such as $MgAl_2O_4$, $CoFe_2O_4$, $NiFe_2O_4$, or $CoMn_2O_4$, but the embodiment of the present disclosure is not limited thereto.

Also, the semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but the embodiment of the present disclosure is not limited thereto.

The quantum dot may have a full width of half maximum (FWHM) of a light emission wavelength spectrum of about 45 nm or less, about 40 nm or less, or about 30 nm or less, and color purity and/or color reproducibility may be improved (increased) in the above range. In some embodiments, light emitted through such a quantum dot is emitted in all directions, and thus a wide viewing angle may be improved (increased).

In some embodiments, although the form of a quantum dot is not limited as long as it is a form commonly utilized in the art, more specifically, a quantum dot in the form of a substantially spherical, pyramidal, multi-arm, or cubic nanoparticles, nanotubes, nanowires, nanofibers, nanoparticles, etc. may be utilized.

The quantum dot may control the color of emitted light according to the particle size thereof. Accordingly, the quantum dot may have one or more suitable light emission colors such as blue, red, and/or green.

In an embodiment, the emission layer EML may include two different hosts, a sensitizer, and a dopant. For example, the emission layer EML may include a phosphorescent sensitizer and a thermally activated delayed fluorescence (TADF) sensitizer as the sensitizer.

For example, the emission layer EML may include a hole transport host and an electron transport host. In the light emitting element ED of an embodiment, the hole transport host and the electron transport host may form an exciplex. A triplet energy of the exciplex formed by the hole transport host and the electron transport host may correspond to T1 that is a gap between a lowest unoccupied molecular orbital (LUMO) energy level of the electron transport host and a highest occupied molecular orbital (HOMO) energy level of the hole transport host.

In an organic light emitting element of an embodiment, the lowest excited triplet energy level (T1) of the exciplex formed by the hole transport host and the electron transport host may be about 2.4 eV to about 3.0 eV.

In some embodiments, the lowest excited triplet energy level (T1) of the exciplex may be a value smaller than an energy gap of each host material. Therefore, the exciplex may have the lowest excited triplet energy level (T1) of about 3.0 eV or less that is an energy gap between the hole transport host and the electron transport host.

In some embodiments, the emission layer EML of the light emitting element ED may emit blue light. For example, the emission layer EML of the light emitting element ED of an embodiment may emit blue light having a center wavelength of about 430 nm to about 470 nm. However, the embodiment of the present disclosure is not limited thereto, and the emission layer EML may emit blue light having a center wavelength greater than about 470 nm, or may emit green light or red light.

In each light emitting element ED of embodiments illustrated in FIGS. 3 to 7, the electron transport region ETR is provided on the emission layer EML. The electron transport region ETR may include at least one of the hole blocking layer HBL, the electron transport layer ETL, or the electron injection layer EML, but the embodiment of the present disclosure is not limited thereto.

The electron transport region ETR may have a single layer formed of a single material, a single layer formed of a plurality of different materials, or a multilayer structure including a plurality of layers formed of a plurality of different materials.

For example, the electron transport region ETR may have a single layer structure of the electron injection layer EIL or the electron transport layer ETL, and may have a single layer structure formed of an electron injection material and an electron transport material. In some embodiments, the electron transport region ETR may have a single layer structure formed of a plurality of different materials, or may have a structure in which an electron transport layer ETL/electron injection layer EIL, a hole blocking layer HBL/electron transport layer ETL/electron injection layer EIL are stacked in order from the emission layer EML, but the embodiment of the present disclosure is not limited thereto. The electron transport region ETR may have a thickness, for example, from about 1,000 Å to about 1,500 Å.

The electron transport region ETR may be formed by utilizing one or more suitable methods such as a vacuum deposition method, a spin coating method, a cast method, a Langmuir-Blodgett (LB) method, an inkjet printing method, a laser printing method, and/or a laser induced thermal imaging (LITI) method.

The electron transport region ETR may include a compound represented by Formula ET-1:

Formula ET-1

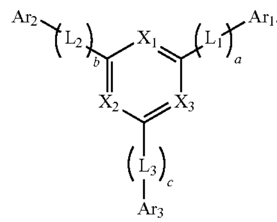

In Formula ET-1, at least one selected from among $X_1$ to $X_3$ is N, and the rest are $CR_a$. $R_a$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. $Ar_1$ to $Ar_2$ may each independently be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula ET-1, a to c may each independently be an integer from 0 to 10. In Formula ET-1, $L_1$ to $L_3$ may each independently be a direct linkage, a substituted or unsubstituted arylene group having 6 to 30 ring-forming carbon atoms, or a substituted or unsubstituted heteroarylene group having 2 to 30 ring-forming carbon atoms. In some embodiments, when a to c are an integer of 2 or more, $L_1$ to $L_3$ may each independently be a substituted or unsubstituted arylene group having 6 to 30 ring-forming carbon atoms, or a substituted or unsubstituted heteroarylene group having 2 to 30 ring-forming carbon atoms.

The electron transport region ETR may include an anthracene-based compound. However, the embodiment of the present disclosure is not limited thereto, and the electron transport region ETR may include, for example, tris(8-hydroxyquinolinato)aluminum (Alq3), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazol-1-yl) phenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), berylliumbis(benzoquinolin-10-olate ($Bebq_2$), 9,10-di(naphthalene-2-yl)anthracene (ADN), 1,3-Bis[3,5-di(pyridin-3-yl)phenyl]benzene (BmPyPhB), or one or more compounds or mixtures thereof.

The electron transport region ETR may include at least one selected from among Compound ET1 to Compound ET36:

ET1
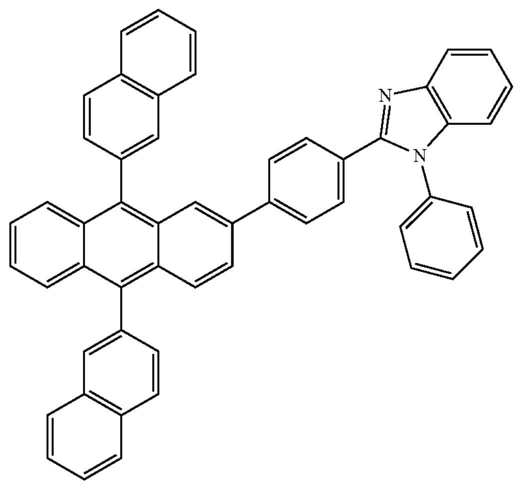
ET2
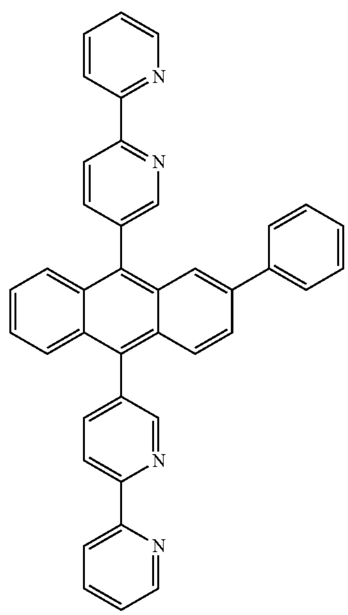
ET3
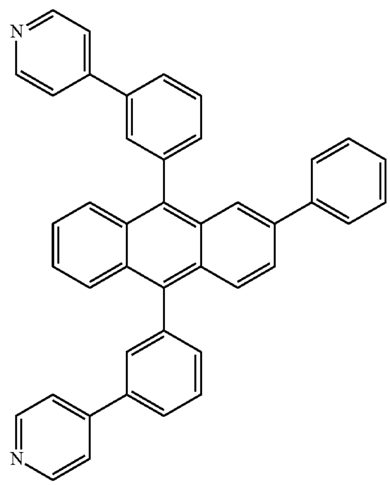

-continued
ET4
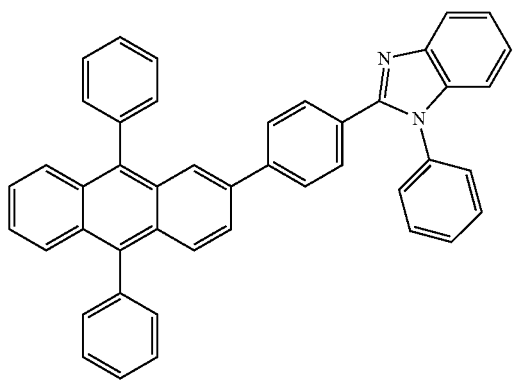
ET5
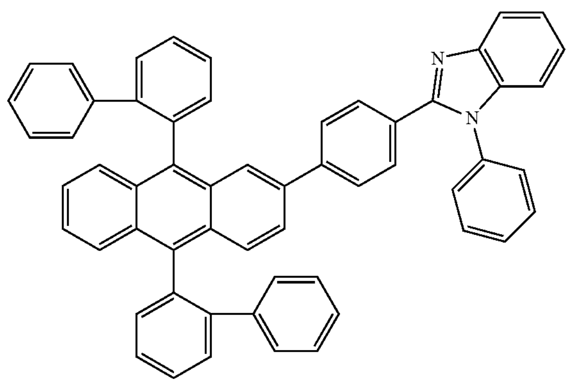
ET6
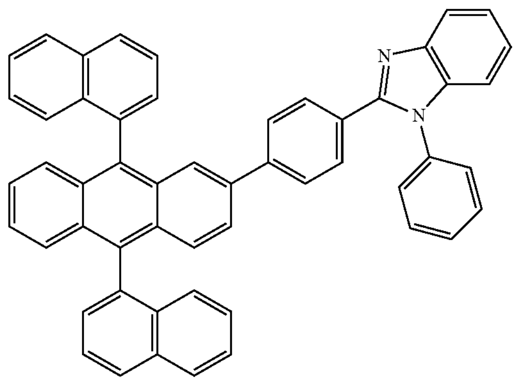

-continued
ET7
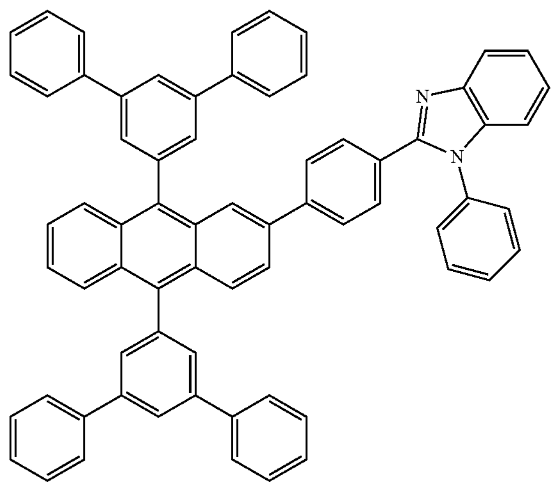
ET8
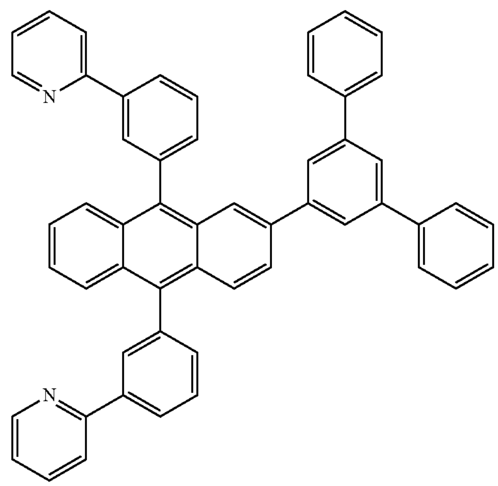
ET9
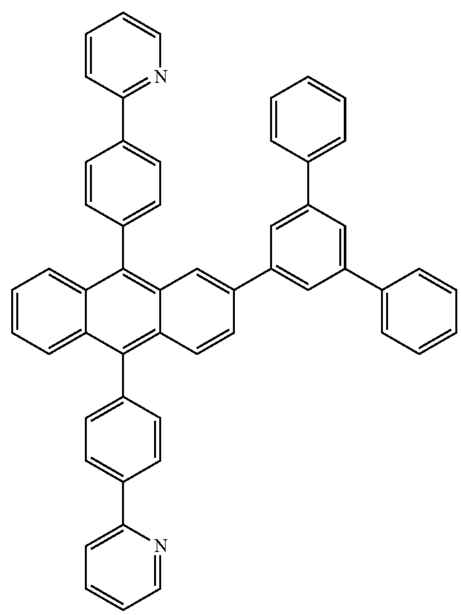

-continued
ET10
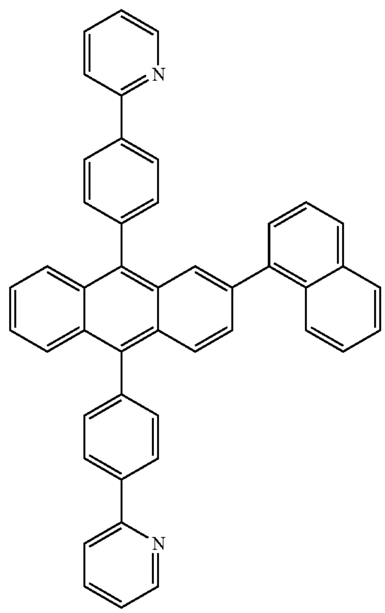
ET11
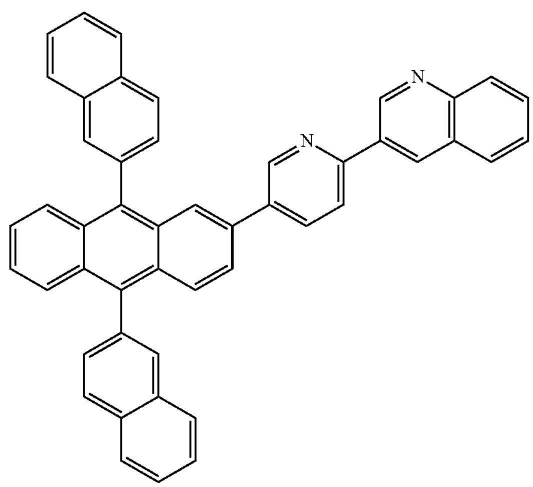
ET12
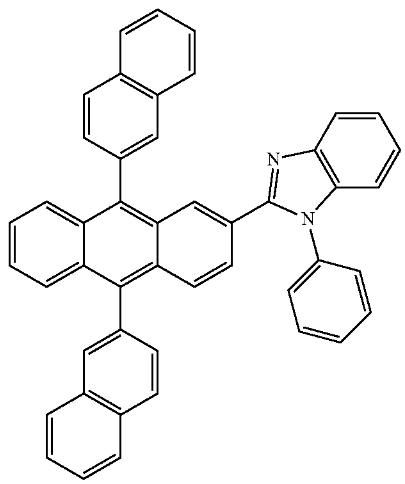

-continued
ET13
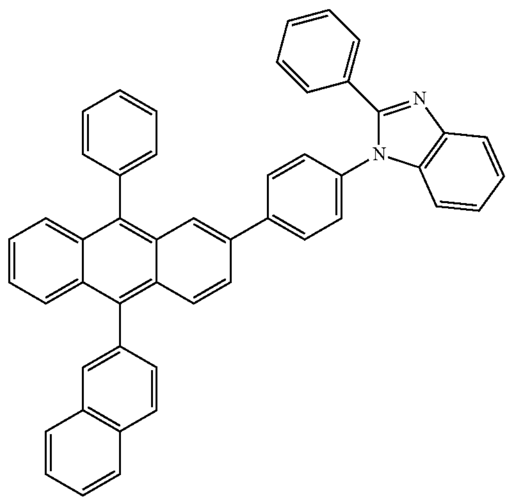
ET14
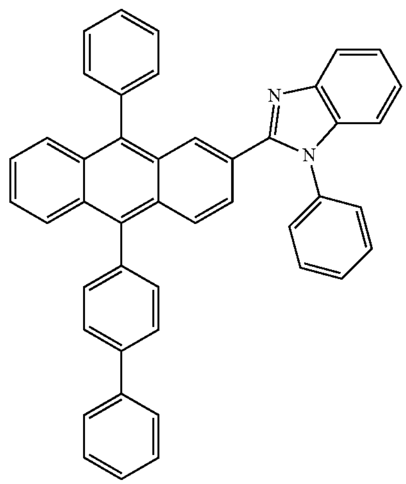
ET15
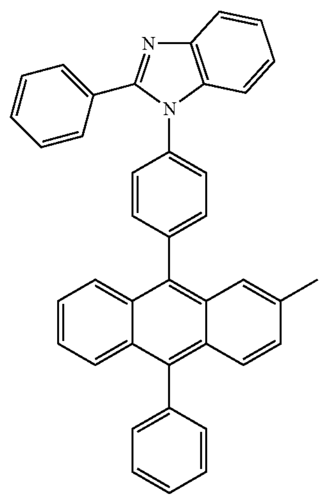

-continued
ET16
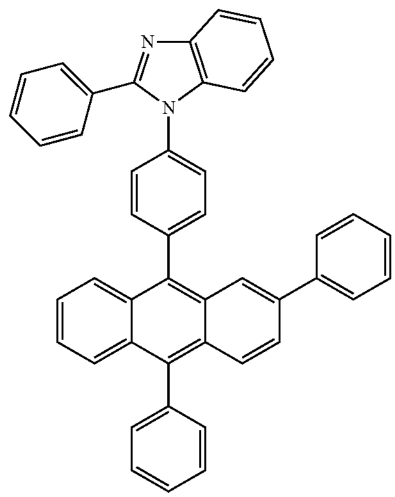
ET17
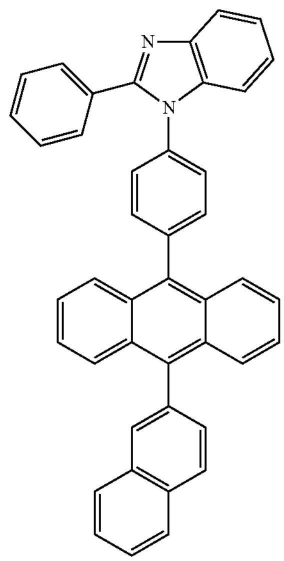
ET18
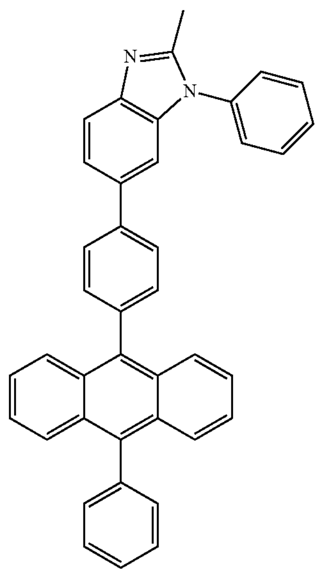

-continued
ET19
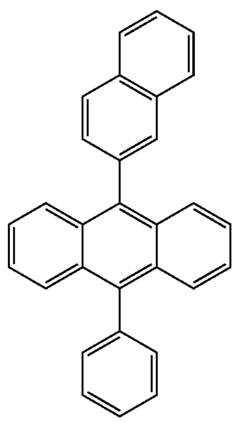
ET20
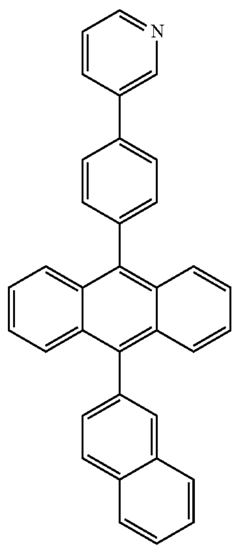
ET21
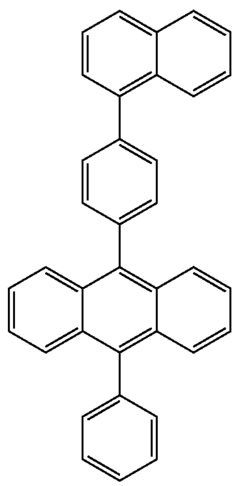

-continued
ET22
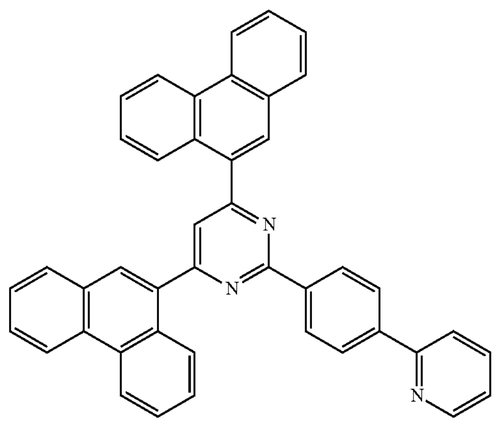
ET23
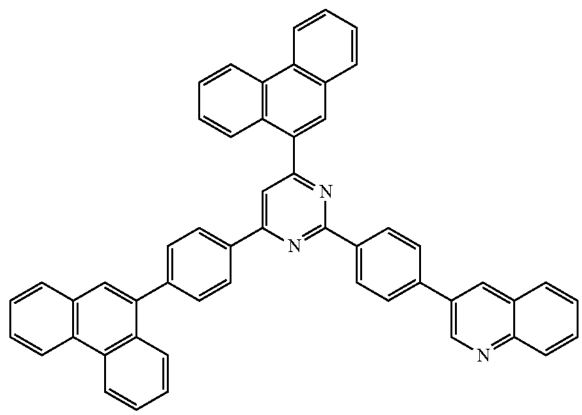
ET24
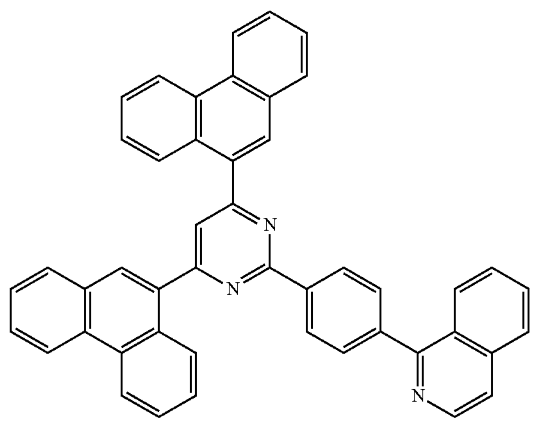

-continued
ET25
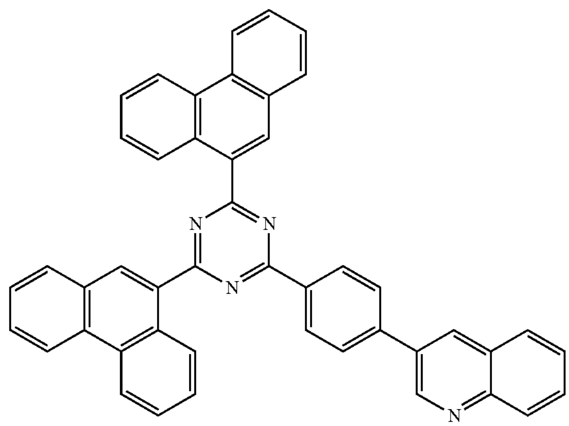
ET26
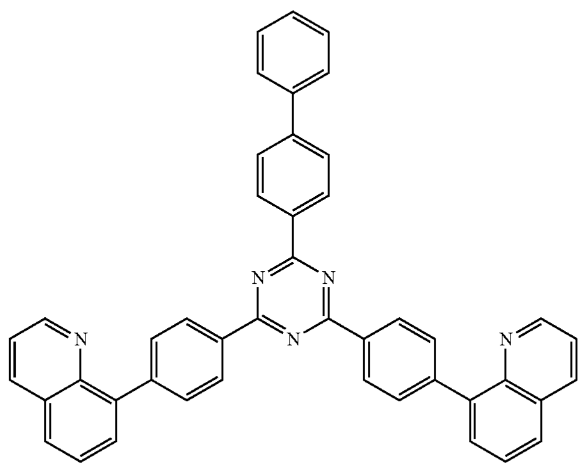
ET27
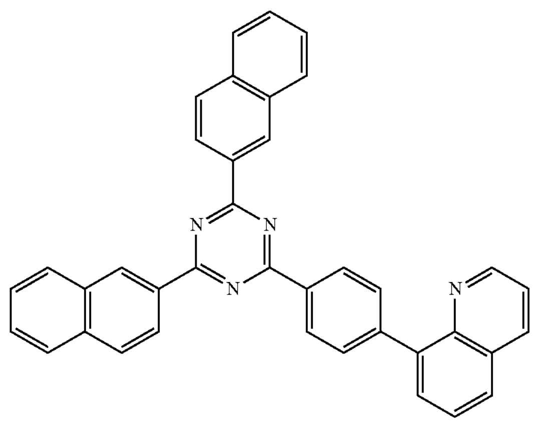

-continued
ET28
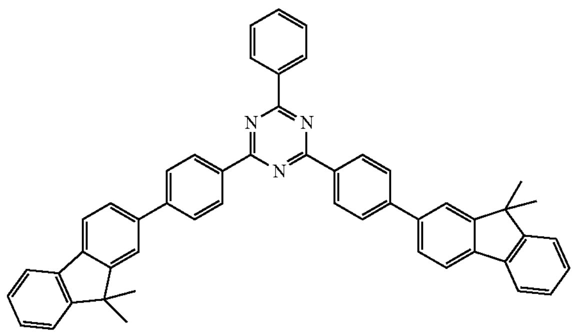
ET29
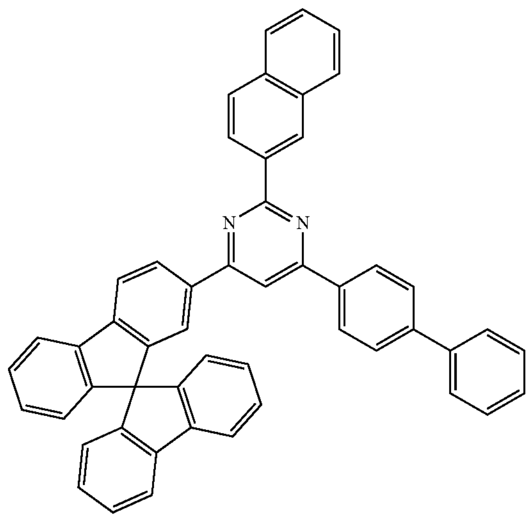
ET30
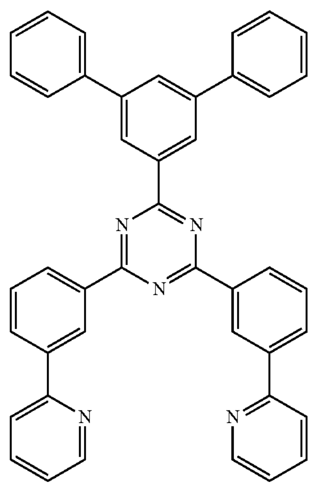

-continued
ET31
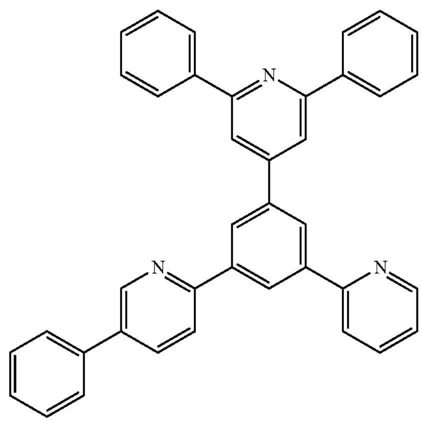
ET32
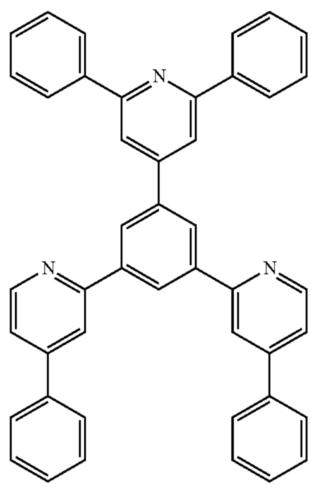
ET33
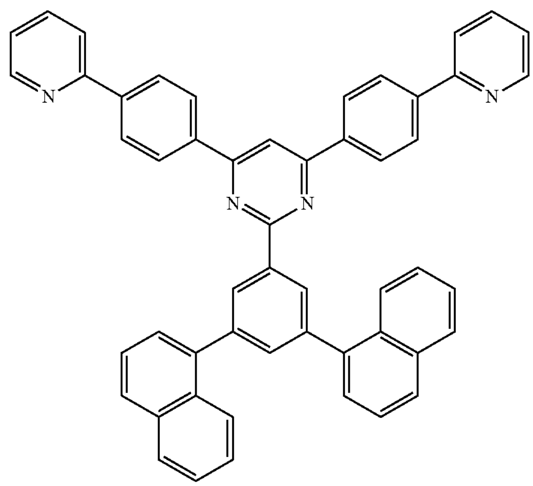

-continued

ET34

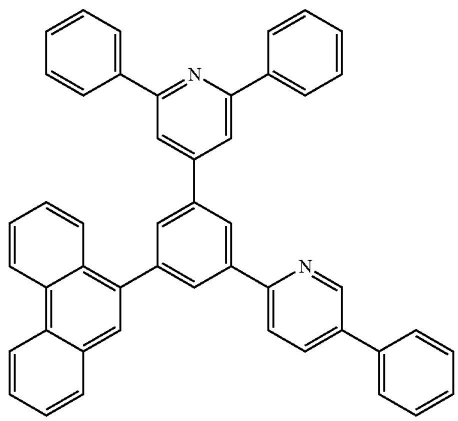

ET35

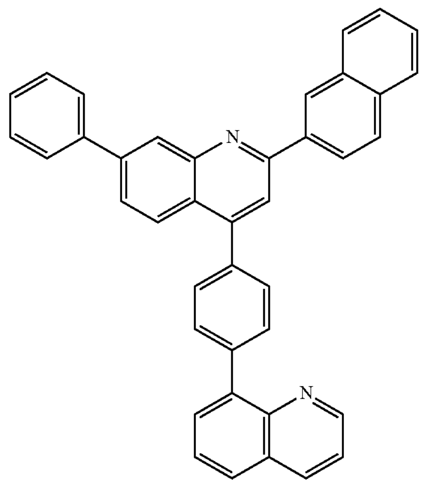

ET36

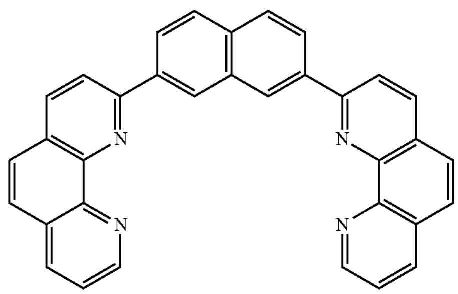

In some embodiments, the electron transport regions ETR may include a metal halide such as LiF, NaCl, CsF, RbCl, RbI, CuI, or KI, a lanthanide metal such as Yb, and a co-deposited material of the metal halide and the lanthanide metal. For example, the electron transport region ETR may include KI:Yb, RbI:Yb, LiF:Yb, etc. as a co-deposited material. In some embodiments, the electron transport region ETR may be formed utilizing a metal oxide such as $Li_2O$ or BaO, etc., but the embodiment of the present disclosure is not limited thereto. The electron transport region ETR may also be formed of a mixture material of an electron transport material and an insulating organometallic salt. The organometallic salt may be a material having an energy band gap of about 4 eV or more. For example, the organometallic salt may include, for example, a metal acetate, a metal benzoate, a metal acetoacetate, a metal acetylacetonate, or a metal stearate.

The electron transport region ETR may further include at least one of 2,9-dimethyl-4,7-diphenyl-1,10-phenanthroline (BCP), diphenyl(4-(triphenylsilyl)phenyl)phosphine oxide (TSPO1), or 4,7-diphenyl-1,10-phenanthroline (Bphen) in addition to the above-described materials, but the embodiment of the present disclosure is not limited thereto.

The electron transport region ETR may include the above-described compounds of the hole transport region in at least one of the electron injection layer EIL, the electron transport layer ETL, or the hole blocking layer HBL.

When the electron transport region ETR includes the electron injection layer EIL, the electron injection layer EIL may have a thickness of about 1 Å to about 100 Å, for example, about 3 Å to about 90 Å. When the thickness of the electron injection layer EIL satisfies the above-described range, satisfactory (suitable) electron injection characteristics may be obtained without a substantial increase in driving voltage.

The second electrode EL2 is provided on the electron transport region ETR. The second electrode EL2 may be a common electrode. The second electrode EL2 may be a cathode or an anode, but the embodiment of the present disclosure is not limited thereto. For example, when the first electrode EU is an anode, the second electrode EL2 may be a cathode, and when the first electrode EL1 is a cathode, the second electrode EL2 may be an anode. The second electrode may include at least one selected from among Ag, Mg, Cu, Al, Pt, Pd, Au, Ni, Nd, Ir, Cr, Li, Ca, LiF, Mo, Ti, W, In, Sn, Zn, compounds comprising one or more of the foregoing elements, combinations of two or more of the foregoing elements or compounds, mixtures of two or more of the foregoing elements or compounds, and/or oxides thereof.

The second electrode EL2 may be a transmissive electrode, a transflective electrode, or a reflective electrode. When the second electrode EL2 is the transmissive electrode, the second electrode EL2 may be formed of a transparent metal oxide, for example, indium tin oxide (ITO), indium zinc oxide (IZO), zinc oxide (ZnO), indium tin zinc oxide (ITZO), etc.

When the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, or one or more compounds or mixtures thereof (e.g., AgMg, AgYb, or MgAg). In some embodiments, the second electrode EL2 may have a multilayer structure including a reflective film or a transflective film formed of the above-described materials, and a transparent conductive film formed of ITO, IZO, ZnO, ITZO, etc. For example, the second electrode EL2 may include the above-described metal materials, combinations of at least two metal materials of the above-described metal materials, oxides of the above-described metal materials, and/or the like.

The second electrode EL2 may be connected with an auxiliary electrode. When the second electrode EL2 is connected with the auxiliary electrode, the resistance of the second electrode EL2 may be decreased.

In some embodiments, a capping layer CPL may further be disposed on the second electrode EL2 of the light emitting element ED of an embodiment. The capping layer CPL may include a multilayer or a single layer.

In an embodiment, the capping layer CPL may be an organic layer or an inorganic layer. For example, when the capping layer CPL contains an inorganic material, the inorganic material may include an alkaline metal compound (for example, LiF), an alkaline earth metal compound (for example, $MgF_2$), SiON, $SiN_x$, $SiO_y$, etc.

For example, when the capping layer CPL contains an organic material, the organic material may include α-NPD, NPB, TPD, m-MTDATA, Alq3, CuPc, N4,N4,N4',N4'-tetra (biphenyl-4-yl)biphenyl-4,4'-diamine (TPD15), 4,4',4"-tris (carbazol sol-9-yl)triphenylamine (TCTA), etc., or may include an epoxy resin, or an acrylate such as a methacrylate. However, the embodiment of the present disclosure is not limited thereto, and the capping layer CPL may include at least one selected from among Compounds P1 to P5:

P1

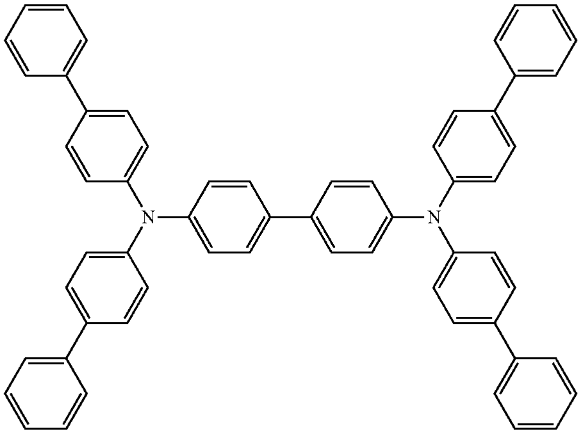

P2

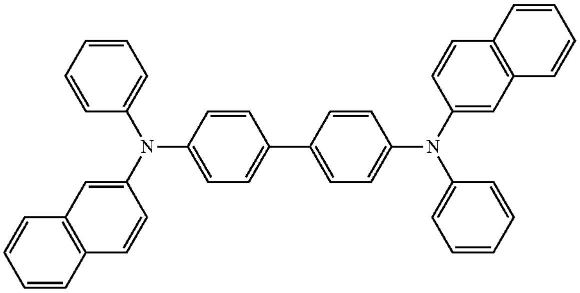

P3

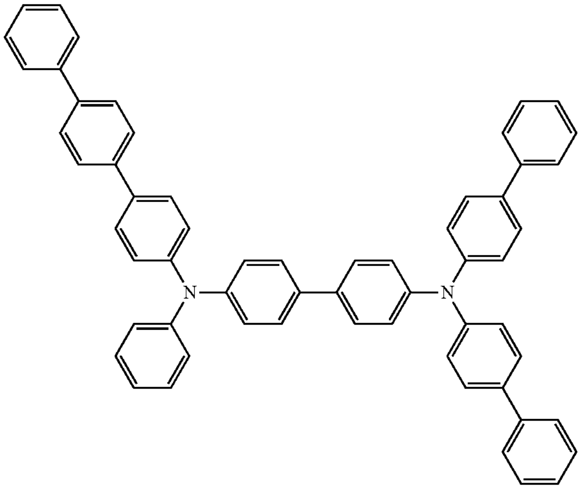

P4

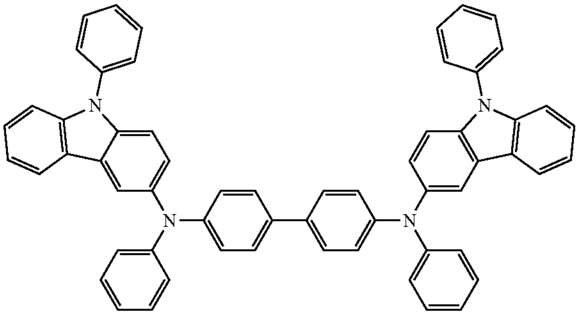

-continued

P5

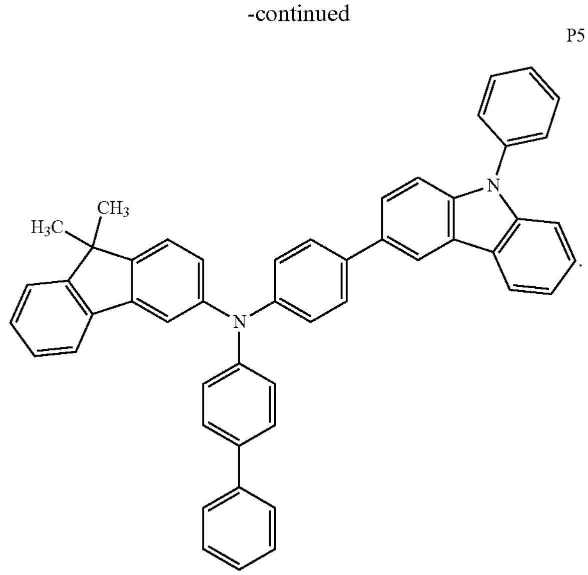

In some embodiments, the refractive index of the capping layer CPL may be about 1.6 or more. For example, the refractive index of the capping layer CPL may be about 1.6 or more with respect to light in a wavelength range of about 550 nm to about 660 nm.

Each of FIGS. 8 to 11 is a cross-sectional view of a display device according to an embodiment of the present disclosure. Hereinafter, in describing the display devices of embodiments with reference to FIGS. 8 to 11, the duplicated features which have been described in FIGS. 1 to 7 may not be described again, but their differences will be primarily described.

Figure 8:
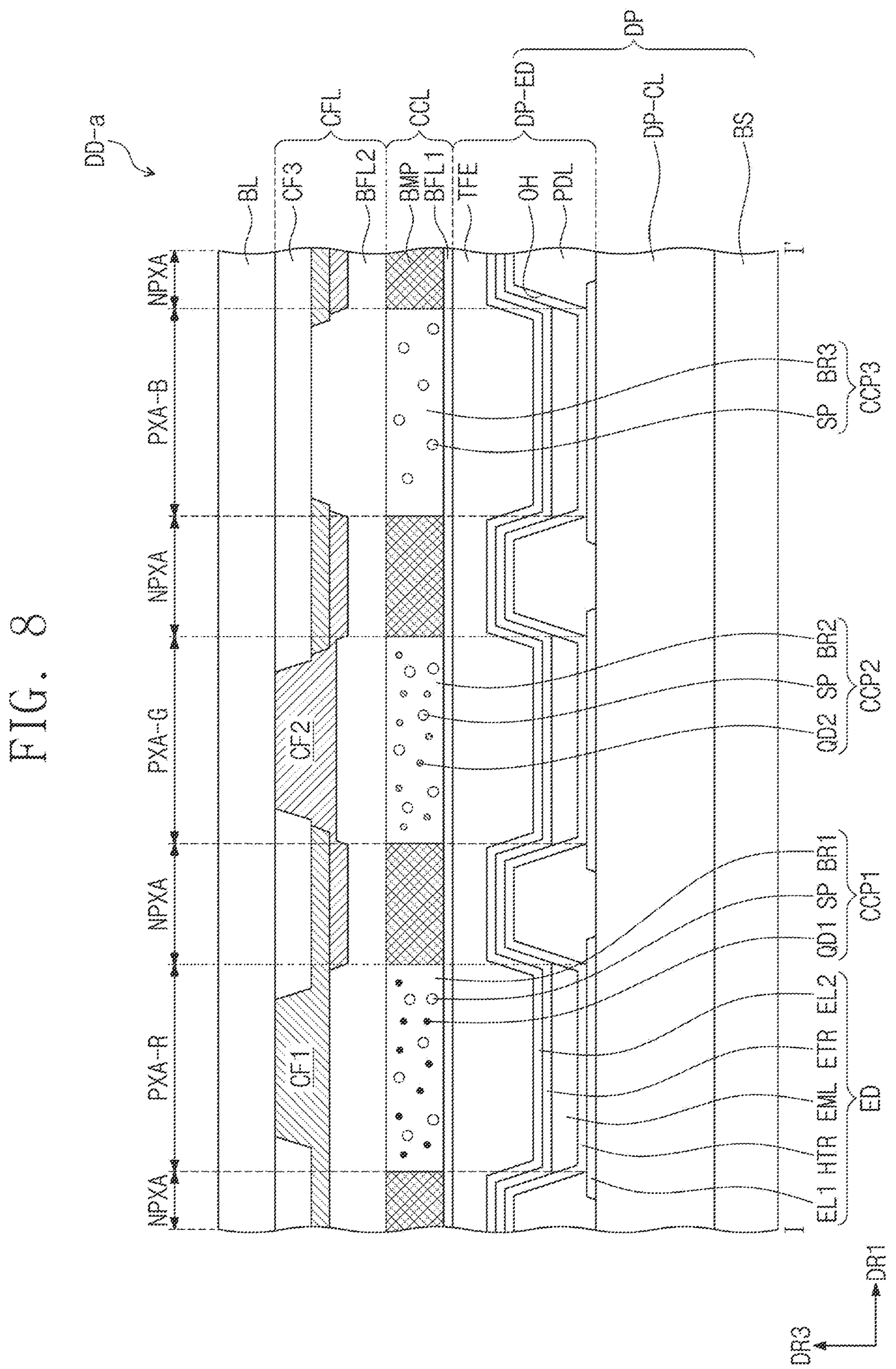
FIG. 8 is a cross-sectional view of a display device according to an embodiment.

Referring to FIG. 8, the display device DD-a according to an embodiment may include a display panel DP including a display element layer DP-ED, a light control layer CCL on the display panel DP, and a color filter layer CFL.

In an embodiment illustrated in FIG. 8, the display panel DP may include a base layer BS, a circuit layer DP-CL provided on the base layer BS, and the display element layer DP-ED, and the display element layer DP-ED may include a light emitting element ED.

The light emitting element ED may include a first electrode EL1, a hole transport region HTR disposed on the first electrode EL1, an emission layer EML on the hole transport region HTR, an electron transport region ETR on the emission layer EML, and a second electrode EL2 on the electron transport region ETR. In some embodiments, the structures of the light emitting elements of FIGS. 3 to 7 as described above may be equally applied to the structure of the light emitting element ED illustrated in FIG. 8.

The electron transport region ETR of the light emitting element ED included in the display device DD-a according to an embodiment may include the above-described polycyclic compound of an embodiment.

Referring to FIG. 8, the emission layer EML may be in an opening OH defined in a pixel defining film PDL. For example, the emission layer EML which is divided by the pixel defining film PDL and provided corresponding to each light emitting regions PXA-R, PXA-G, and PXA-B may emit light in substantially the same wavelength range. In the display device DD of an embodiment, the emission layer EML may emit blue light. In some embodiments, the emission layer EML may be provided as a common layer in the entire light emitting regions PXA-R, PXA-G, and PXA-B.

The light control layer CCL may be disposed on the display panel DP. The light control layer CCL may include a light conversion body. The light conversion body may be a quantum dot, a phosphor, and/or the like. The light conversion body may emit provided light by converting the wavelength thereof. For example, the light control layer CCL may be a layer containing the quantum dot or a layer containing the phosphor.

The light control layer CCL may include a plurality of light control parts CCP1, CCP2 and CCP3. The light control parts CCP1, CCP2, and CCP3 may be spaced apart from each other.

Referring to FIG. 8, divided patterns BMP may be disposed between the light control parts CCP1, CCP2 and CCP3 which are spaced apart from each other, but the embodiment of the present disclosure is not limited thereto. FIG. 8 illustrates that the divided patterns BMP do not overlap the light control parts CCP1, CCP2 and CCP3, but at least a portion of the edges of the light control parts CCP1, CCP2 and CCP3 may overlap the divided patterns BMP.

The light control layer CCL may include a first light control part CCP1 containing a first quantum dot QD1 which converts first color light provided from the light emitting element ED into second color light, a second light control part CCP2 containing a second quantum dot QD2 which converts the first color light into third color light, and a third light control part CCP3 which transmits the first color light.

In an embodiment, the first light control part CCP1 may provide red light that is the second color light, and the second light control part CCP2 may provide green light that is the third color light. The third light control part CCP3 may provide blue light by transmitting the blue light that is the first color light provided from the light emitting element ED. For example, the first quantum dot QD1 may be a red quantum dot, and the second quantum dot QD2 may be a green quantum dot. The same description used above may be applied with respect to the quantum dots QD1 and QD2.

In some embodiments, the light control layer CCL may further include a scatterer SP. The first light control part CCP1 may include the first quantum dot QD1 and the scatterer SP, the second light control part CCP2 may include the second quantum dot QD2 and the scatterer SP, and the third light control part CCP3 may not include (e.g., may exclude) any quantum dot but include the scatterer SP.

The scatterer SP may be inorganic particles. For example, the scatterer SP may include at least one of $TiO_2$, ZnO, $Al_2O_3$, $SiO_2$, or hollow sphere silica. The scatterer SP may include any one selected from among $TiO_2$, ZnO, $Al_2O_3$, $SiO_2$, and hollow sphere silica, or may be a mixture of at least two materials selected from among $TiO_2$, ZnO, $Al_2O_3$, $SiO_2$, and hollow sphere silica.

The first light control part CCP1, the second light control part CCP2, and the third light control part CCP3 each may include base resins BR1, BR2, and BR3 in which the quantum dots QD1 and QD2 and the scatterer SP are dispersed. In an embodiment, the first light control part CCP1 may include the first quantum dot QD1 and the scatterer SP dispersed in a first base resin BR1, the second light control part CCP2 may include the second quantum dot QD2 and the scatterer SP dispersed in a second base resin BR2, and the third light control part CCP3 may include the scatterer SP dispersed in a third base resin BR3. The base resins BR1, BR2, and BR3 are media in which the quantum dots QD1 and QD2 and the scatterer SP are dispersed, and may be formed of one or more suitable resin compositions, which may be generally referred to as a binder. For example, the base resins BR1, BR2, and BR3 may be acrylic-based resins, urethane-based resins, silicone-based resins, epoxy-based resins, etc. The base resins BR1, BR2, and BR3 may be transparent resins. In an embodiment, the first base resin BR1, the second base resin BR2, and the third base resin BR3 may be the same as or different from each other.

The light control layer CCL may include a barrier layer BFL1. The barrier layer BFL1 may serve to prevent or reduce the penetration of moisture and/or oxygen (hereinafter, referred to as 'moisture/oxygen'). The barrier layer BFL1 may be on the light control parts CCP1, CCP2, and CCP3 to block or reduce the light control parts CCP1, CCP2 and CCP3 from being exposed to moisture/oxygen. In some embodiments, the barrier layer BFL1 may cover the light control parts CCP1, CCP2, and CCP3. In some embodiments, a barrier layer BFL2 may be provided between the light control parts CCP1, CCP2, and CCP3 and filters CF1, CF2, and CF3.

The barrier layers BFL1 and BFL2 may include at least one inorganic layer. For example, the barrier layers BFL1 and BFL2 may include an inorganic material. For example, the barrier layers BFL1 and BFL2 may include a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, a silicon oxynitride, a metal thin film which secures a transmittance, etc. In some embodiments, the barrier layers BFL1 and BFL2 may further include an organic film. The barrier layers BFL1 and BFL2 may be formed of a single layer or a plurality of layers.

In the display device DD of an embodiment, the color filter layer CFL may be on the light control layer CCL. For example, the color filter layer CFL may be directly on the light control layer CCL. In this embodiment, the barrier layer BFL2 may not be provided.

The color filter layer CFL may include color filters CF1, CF2, and CF3. The color filter layer CFL may include a first filter CF1 configured to transmit the second color light, a second filter CF2 configured to transmit the third color light, and a third filter CF3 configured to transmit the first color light. For example, the first filter CF1 may be a red filter, the second filter CF2 may be a green filter, and the third filter CF3 may be a blue filter. The filters CF1, CF2, and CF3 each may include a polymeric photosensitive resin and a pigment and/or dye. The first filter CF1 may include a red pigment and/or dye, the second filter CF2 may include a green pigment and/or dye, and the third filter CF3 may include a blue pigment and/or dye. However, the embodiment of the present disclosure is not limited thereto, and the third filter CF3 may not include (e.g., may exclude) a pigment or dye. The third filter CF3 may include a polymeric photosensitive resin and may not include (e.g., may exclude) a pigment or dye. The third filter CF3 may be transparent. The third filter CF3 may be formed of a transparent photosensitive resin.

Furthermore, in an embodiment, the first filter CF1 and the second filter CF2 may be a yellow filter. The first filter CF1 and the second filter CF2 may not be separated but be provided as one filter. The first to third filters CF1, CF2, and CF3 may be disposed corresponding to the red light emitting region PXA-R, the green light emitting region PXA-G, and the blue light emitting region PXA-B, respectively.

In some embodiments, the color filter layer CFL may include a light shielding part. The color filter layer CFL may include a light shielding part disposed to overlap at the boundaries of neighboring filters CF1, CF2, and CF3. The light shielding part may be a black matrix. The light shielding part may include an organic light shielding material and/or an inorganic light shielding material containing a black pigment and/or dye. The light shielding part may separate boundaries between the adjacent filters CF1, CF2, and CF3. In some embodiments, the light shielding part may be formed of a blue filter.

A base substrate BL may be on the color filter layer CFL. The base substrate BL may be a member which provides a base surface in which the color filter layer CFL, the light control layer CCL, and/or the like are disposed. The base substrate BL may be a glass substrate, a metal substrate, a plastic substrate, etc. However, the embodiment of the present disclosure is not limited thereto, and the base substrate BL may be an inorganic layer, an organic layer, or a composite material layer. In some embodiments, the base substrate BL may not be provided.

Figure 9:
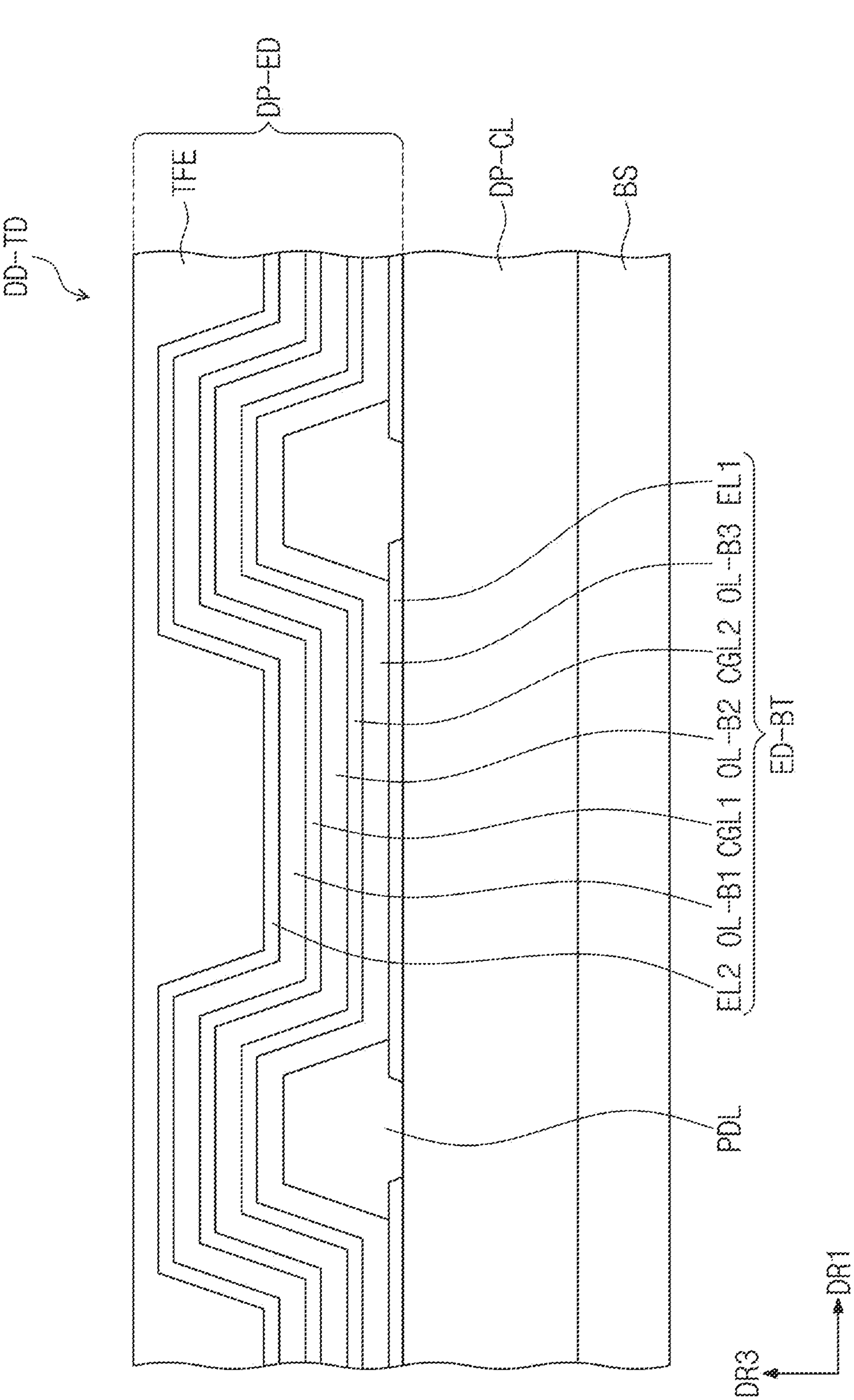
FIG. 9 is a cross-sectional view of a display device according to an embodiment.

FIG. 9 is a cross-sectional view illustrating a portion of a display device according to an embodiment of the present disclosure. FIG. 9 illustrates a cross-sectional view of a part corresponding to the display panel DP of FIG. 8. In the display device DD-TD of an embodiment, the light emitting element ED-BT may include a plurality of light emitting structures OL-B1, OL-B2, and OL-B3. The light emitting element ED-BT may include a first electrode EL1 and a second electrode EL2 which face each other, and the plurality of light emitting structures OL-B1, OL-B2, and OL-B3 sequentially stacked in the thickness direction between the first electrode EU and the second electrode EL2. The light emitting structures OL-B1, OL-B2, and OL-B3 each may include an emission layer EML (see FIG. 8) and a hole transport region HTR (see FIG. 8) and an electron transport region ETR (see FIG. 8) disposed with the emission layer EML (see FIG. 8) located therebetween.

For example, the light emitting element ED-BT included in the display device DD-TD of an embodiment may be a light emitting element having a tandem structure and including a plurality of emission layers.

In an embodiment illustrated in FIG. 9, all light beams respectively emitted from the light emitting structures OL-B1, OL-B2, and OL-B3 may be blue light. However, the embodiment of the present disclosure is not limited thereto, and the light beams respectively emitted from the light emitting structures OL-B1, OL-B2, and OL-B3 may have wavelength ranges different from each other. For example, the light emitting element ED-BT including the plurality of light emitting structures OL-B1, OL-B2, and OL-B3 which emit light beams having wavelength ranges different from each other may emit white light.

Charge generation layers CGL1 and CGL2 may be respectively disposed between two of the neighboring light emitting structures OL-B1, OL-B2, and OL-B3. The charge generation layers CGL1 and CGL2 may include a p-type or kind charge generation layer and/or an n-type or kind charge generation layer.

At least one selected from among the light emitting structures OL-B1, OL-B2, and OL-B3 included in the display device DD-TD of an embodiment may include the above-described polycyclic compound of an embodiment. For example, the hole transport region HTR (see FIG. 8) included in at least one selected from among the light emitting structures OL-B1, OL-B2, and OL-B3 may include the polycyclic compound of an embodiment.

Figure 10:
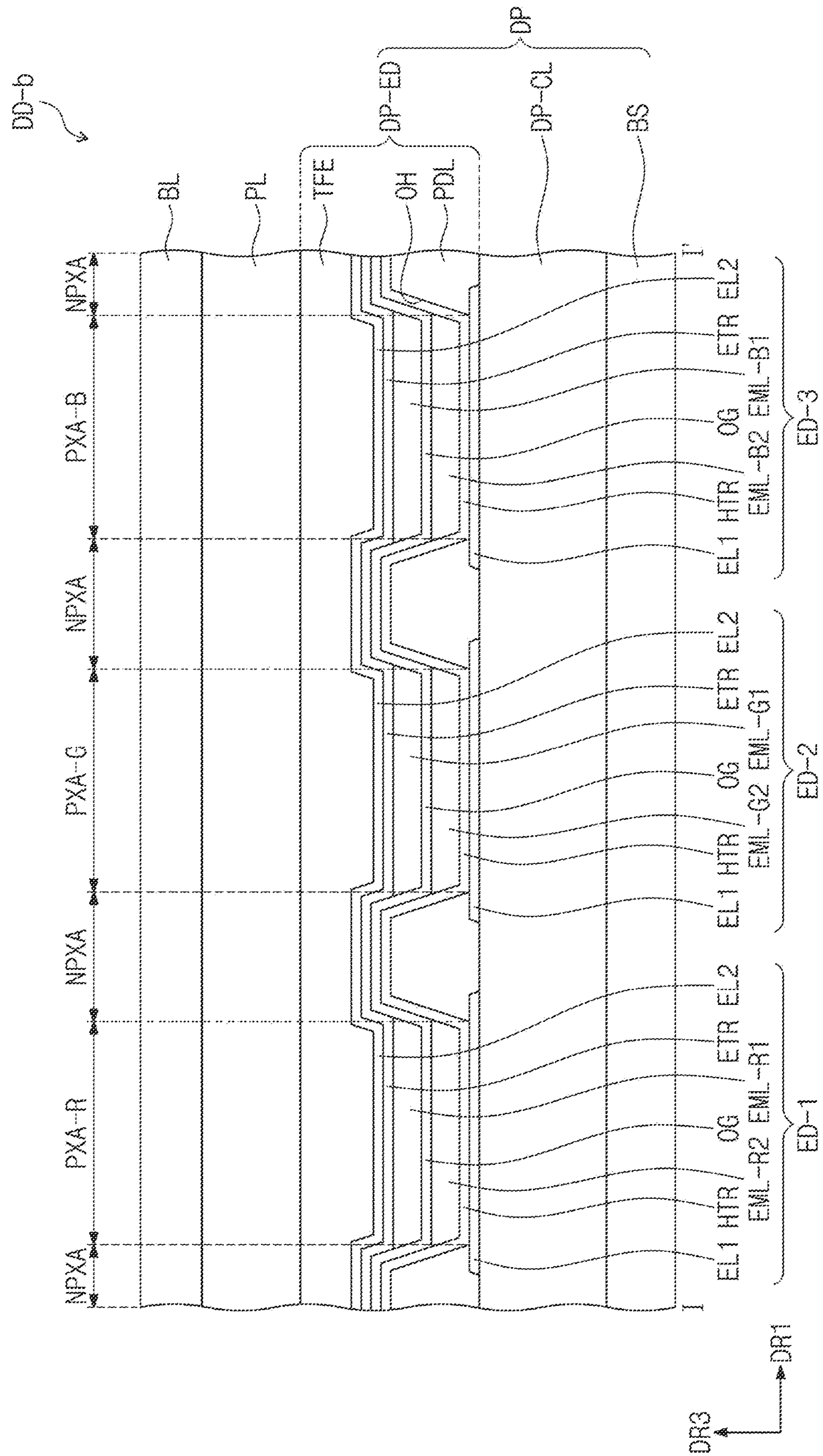
FIG. 10 is a cross-sectional view illustrating a display device according to an embodiment.

Referring to FIG. 10, the display device DD-b according to an embodiment may include light emitting elements ED-1, ED-2, and ED-3 in which two emission layers are stacked. Compared with the display device DD of an embodiment illustrated in FIG. 2, an embodiment illustrated in FIG. 11 has a difference in that the first to third light emitting elements ED-1, ED-2, and ED-3 each include two emission layers stacked in the thickness direction. In each of the first to third light emitting elements ED-1, ED-2, and ED-3, the two emission layers may emit light in substantially the same wavelength region.

The first light emitting element ED-1 may include a first red emission layer EML-R1 and a second red emission layer EML-R2. The second light emitting element ED-2 may include a first green emission layer EML-G1 and a second green emission layer EML-G2. In some embodiments, the third light emitting element ED-3 may include a first blue emission layer EML-B1 and a second blue emission layer EML-B2. An emission auxiliary part OG may be between the first red emission layer EML-R1 and the second red emission layer EML-R2, between the first green emission layer EML-G1 and the second green emission layer EML-G2, and between the first blue emission layer EML-B1 and the second blue emission layer EML-B2.

The emission auxiliary part OG may include a single layer or a multilayer. The emission auxiliary part OG may include a charge generation layer. For example, the emission auxiliary part OG may include an electron transport region, a charge generation layer, and a hole transport region that are sequentially stacked. The emission auxiliary part OG may be provided as a common layer in the whole of the first to third light emitting elements ED-1, ED-2, and ED-3. However, the embodiment of the present disclosure is not limited thereto, and the emission auxiliary part OG may be provided by being patterned within the openings OH defined in the pixel defining film PDL.

The first red emission layer EML-R1, the first green emission layer EML-G1, and the first blue emission layer EML-B1 may be between the hole transport region HTR and the emission auxiliary part OG. The second red emission layer EML-R2, the second green emission layer EML-G2, and the second blue emission layer EML-B2 may be between the emission auxiliary part OG and the electron transport region ETR.

For example, the first light emitting element ED-1 may include the first electrode EL1, the hole transport region HTR, the second red emission layer EML-R2, the emission auxiliary part OG, the first red emission layer EML-R1, the electron transport region ETR, and the second electrode EL2 that are sequentially stacked. The second light emitting element ED-2 may include the first electrode EL1, the hole transport region HTR, the second green emission layer EML-G2, the emission auxiliary part OG, the first green emission layer EML-G1, the electron transport region ETR, and the second electrode EL2 that are sequentially stacked. The third light emitting element ED-3 may include the first electrode EL1, the hole transport region HTR, the second blue emission layer EML-B2, the emission auxiliary part OG, the first blue emission layer EML-B1, the electron transport region ETR, and the second electrode EL2 that are sequentially stacked.

In some embodiments, an optical auxiliary layer PL may be on the display element layer DP-ED. The optical auxiliary layer PL may include a polarizing layer. The optical auxiliary layer PL may be on the display panel DP and control reflected light in the display panel DP due to external light. The optical auxiliary layer PL in the display device according to an embodiment may not be provided.

Figure 11:
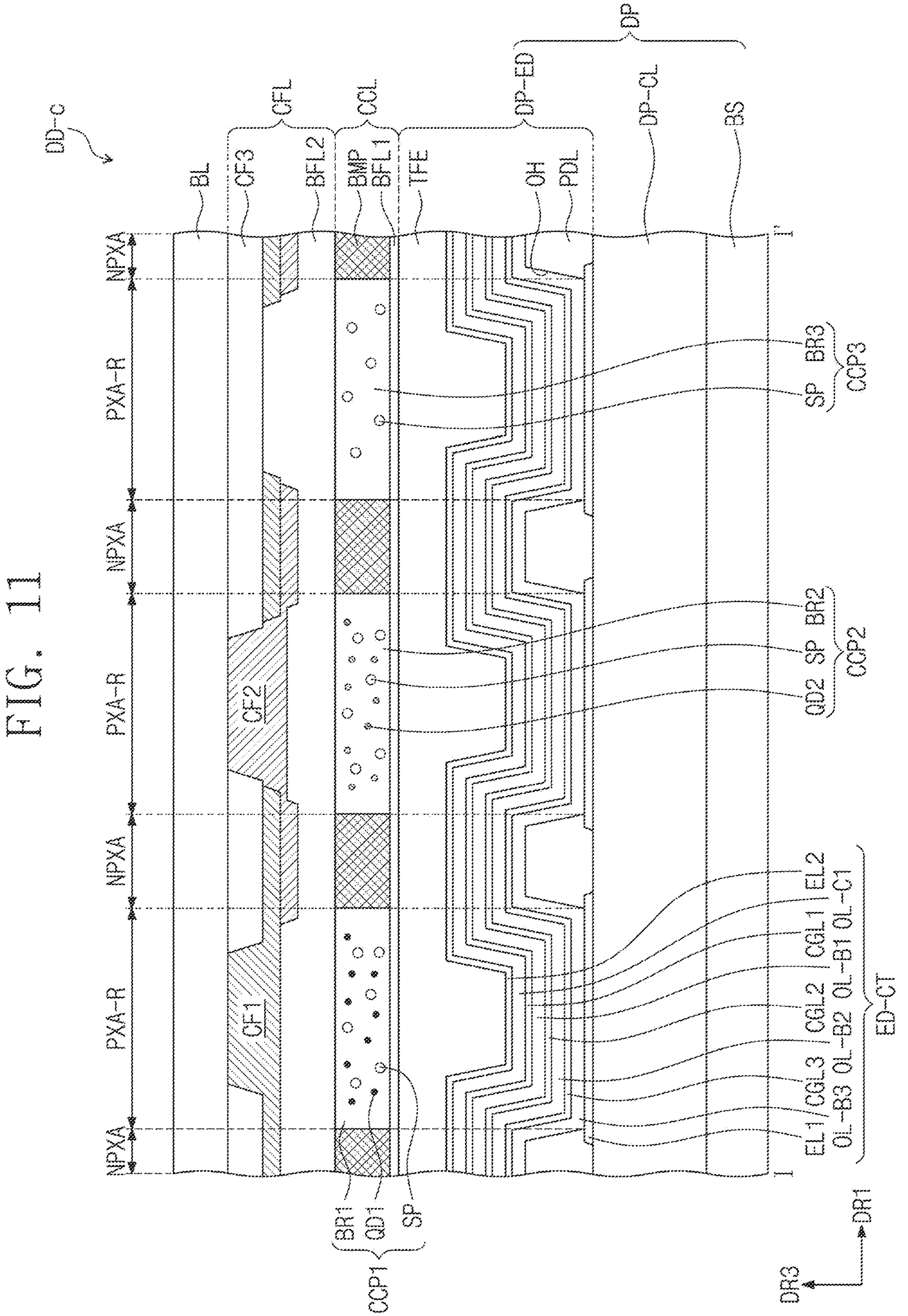
FIG. 11 is a cross-sectional view illustrating a display device according to an embodiment of the inventive concept.

Unlike FIGS. 9 and 10, FIG. 11 illustrates that a display device DD-c includes four light emitting structures OL-B1, OL-B2, OL-B3, and OL-C1. A light emitting element ED-CT may include a first electrode EL1 and a second electrode EL2 which face each other, and first to fourth light emitting structures OL-B1, OL-B2, OL-B3, and OL-C1 that are sequentially stacked in the thickness direction between the first electrode EL1 and the second electrode EL2. Charge generation layers CGL1, CGL2, and CGL3 may be between the first to fourth light emitting structures OL-B1, OL-B2, OL-B3, and OL-C1. Among the four light emitting structures, the first to third light emitting structures OL-B1, OL-B2, and OL-B3 may emit blue light, and the fourth light emitting structure OL-C1 may emit green light. However, the embodiment of the present disclosure is not limited thereto, and the first to fourth light emitting structures OL-B1, OL-B2, OL-B3, and OL-C1 may emit light beams in different wavelength regions.

The charge generation layers CGL1, CGL2, and CGL3 between adjacent light emitting structures OL-B1, OL-B2, OL-B3, and OL-C1 may include a p-type or kind charge generation layer and/or an n-type or kind charge generation layer.

At least one selected from among the light emitting structures OL-B1, OL-B2, OL-B3, and OL-C1 included in the display device DD-c of an embodiment may include the above-described polycyclic compound of an embodiment. For example, the hole transport region HTR (see FIG. 8) included in at least one selected from among the light emitting structures OL-B1, OL-B2, and OL-B3 may include the polycyclic compound of an embodiment.

The light emitting element ED according to an embodiment of the present disclosure may include the above-described polycyclic compound of an embodiment in at least one Iof the hole transport region HTR (between the first electrode EL1 and the second electrode EL2), the emission layer EML, or the electron transport region ETR, or in a capping layer CPL.

For example, the light emitting element ED of an embodiment may include the polycyclic compound of an embodiment in the hole transport region HTR, thereby exhibiting excellent or suitable luminous efficiency and long service life characteristics.

For example, the hole transport layer HTL of the hole transport region HTR as described above may include the polycyclic compound of an embodiment, thereby having a refractive index of less than about 1.8 with respect to light having a wavelength of about 450 nm. In some embodiments, the thickness of the hole transport layer HTL of an embodiment satisfies a range of about 250 Å or more.

The light emitting element ED of the present disclosure has a refractive index of less than about 1.8 with respect to light having a wavelength of about 450 nm and includes the hole transport layer HTL having a thickness of about 250 Å or more, and thus the luminous efficiency and element service life may be improved (increased).

Hereinafter, with reference to Examples and Comparative Examples, a polycyclic compound according to an embodiment of the present disclosure and a light emitting element of an embodiment will be described in more detail. In some embodiments, Examples described are merely illustrations to assist the understanding of the present disclosure, and the scope of the present disclosure is not limited thereto.

EXAMPLES

1. Synthesis of Polycyclic Compound

First, a synthetic method of the polycyclic compound according to the current embodiment will be described by illustrating synthetic methods of Compounds 2, 7, 12 and 15. In the following descriptions, the synthetic methods of the polycyclic compounds are provided as examples, but the synthetic method according to an embodiment of the present disclosure is not limited to Examples.

1) Synthesis of Compound 2

Compound 2 according to an example may be synthesized by, for example, the steps (e.g., tasks or acts) shown in Reaction Scheme 1:

Reaction Scheme 1

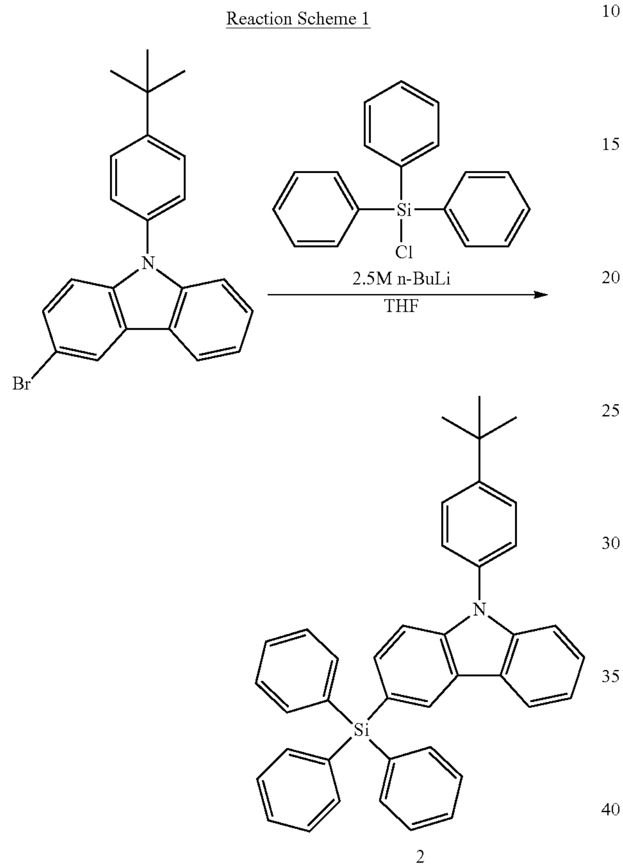

2

(1) Synthetic Method of Compound 2

In a nitrogen atmosphere, 3-bromo-9-(4-(tert-butyl)phenyl)-9H-carbazole (5.00 g, 0.0132 mol) was put into a 500 mL round bottom flask, was dissolved in 200 mL of tetrahydrofuran (THF) with high purity, and was cooled to about −78° C. by utilizing liquid nitrogen. 2.5M n-BuLi (5.81 mL, 0.01452 mol) was slowly injected thereto via a syringe, and the flask was left for about 1 hour, and then chlorotriphenylsilane (4.27 g, 0.01452 mol) was slowly added thereto, and the resulting mixture was then stirred at room temperature for about 24 hours. The reaction was terminated in water, the reaction solution was extracted with ethyl ether, and then the solvent was removed. The resulting product was separated by column chromatography by utilizing a mixed solution of hexane:ethyl ether (10:1) to prepare Compound 2 (5.89 g, yield: 80%).

H-NMR (DMSO-$d_6$): 8.55 (1H, d), 7.92 (1H, d), 7.79 (1H, s), 7.65 (1H, d), 7.48-7.35 (19H, m), 7.22-7.15 (3H, m), 1.35 (9H, s), $C_{40}H_{35}NSi$, m/z: 557.25

2) Synthesis of Compound 7

Compound 7 according to an example may be synthesized by, for example, the steps (e.g., tasks or acts) shown in Reaction Scheme 2:

Reaction Scheme 2

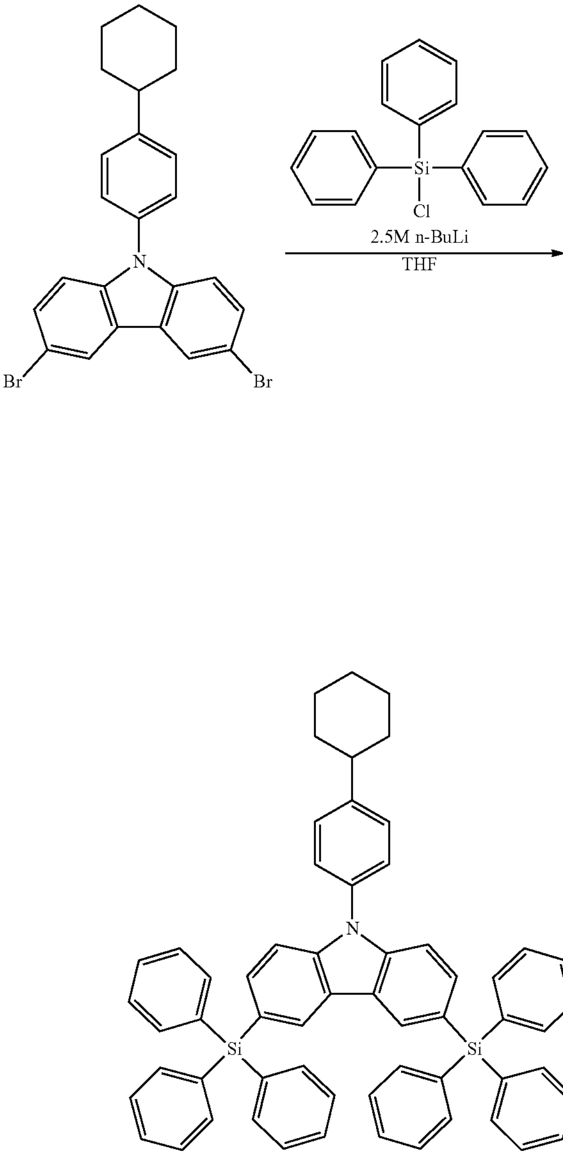

7

(1) Synthetic Method of Compound 7

In the synthetic method of Compound 2, 3,6-dibromo-9-(4-cyclohexylphenyl)-9H-carbazole (5.00 g, 0.0103 mol) was utilized instead of 3-bromo-9-(4-(tert-butyl)phenyl)-9H-carbazole (5.00 g, 0.0132 mol), 2.5M n-BuLi (9.06 mL, 0.02266 mol) was utilized instead of 2.5M n-BuLi (5.81 mL, 0.01452 mol), and chlorotriphenylsilane (6.68 g, 0.02266 mol) was utilized instead of chlorotriphenylsilane (4.27 g, 0.01452 mol) to prepare Compound 7 (6.51 g, yield: 75%).

H-NMR (DMSO-$d_6$): 8.04 (1H, d), 7.85 (2H, s), 7.67 (1H, d), 7.48-7.35 (36H, m), 2.70 (1H, m), 1.86 (4H, m), 1.35 (6H, m) m/z: 841.36

3) Synthesis of Compound 12

Compound 12 according to an example may be synthesized by, for example, the steps (e.g., tasks or acts) shown in Reaction Scheme 3:

Reaction Scheme 3

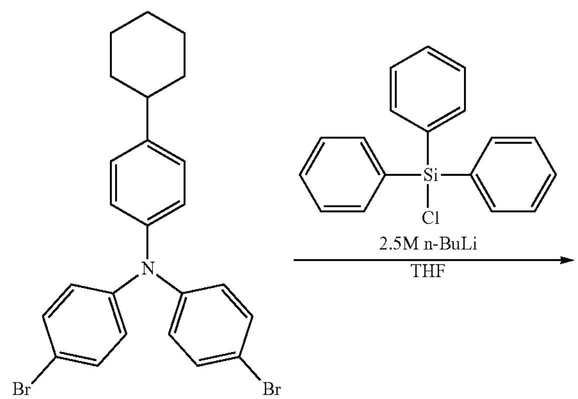

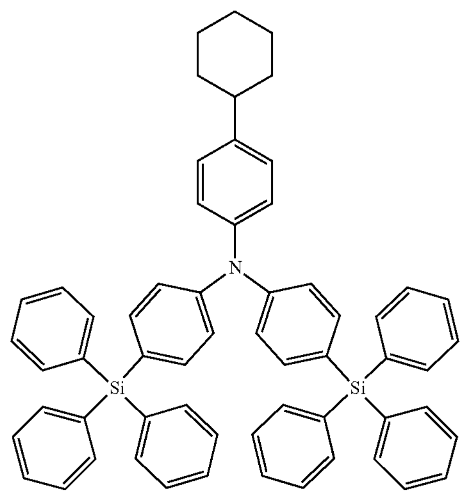

12

(1) Synthetic Method of Compound 12

In the synthetic method of Compound 2, 4-bromo-N-(4-bromophenyl)-N-(4-cyclohexylphenyl)aniline (5.00 g, 0.0103 mol) was utilized instead of 3-bromo-9-(4-(tert-butyl)phenyl)-9H-)aniline (5.00 g, 0.0132 mol), 2.5M n-BuLi (9.06 mL, 0.02266 mol) was utilized instead of 2.5M n-BuLi (5.81 mL, 0.01452 mol), and chlorotriphenylsilane (6.68 g, 0.02266 mol) was utilized instead of chlorotriphenylsilane (4.27 g, 0.01452 mol) to prepare Compound 12 (6.51 g, yield: 75%).

H-NMR (DMSO-$d_6$): 7.48-7.35 (34H, m), 7.28 (4H, m), 7.15 (2H, d), 7.05 (2H, d), 2.70 (1H, m), 1.86 (4H, m), 1.35 (6H, m), m/z: 843.37

4) Synthesis of Compound 15

Compound 15 according to an example may be synthesized by, for example, the steps (e.g., tasks or acts) shown in Reaction Scheme 4:

[Reaction Scheme 4]

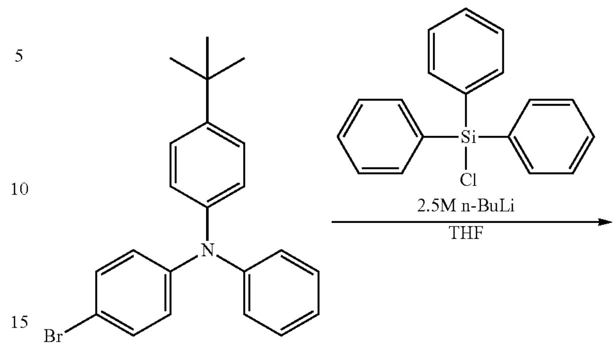

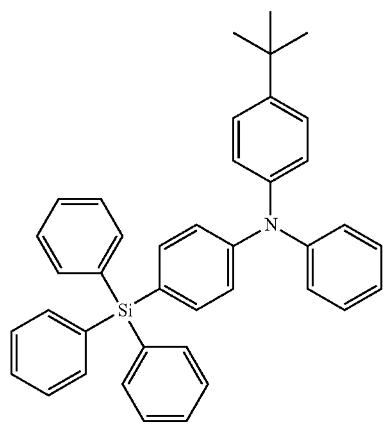

15

(1) Synthetic Method of Compound 15

In the synthetic method of Compound 2, 4-bromo-N-(4-(tert-butyl)phenyl)-N-phenylaniline (5.00 g, 0.0131 mol) was utilized instead of 3-bromo-9-(4-(tert-butyl)phenyl)-9H-carbazole (5.00 g, 0.0132 mol), 2.5M n-BuLi (5.764 mL, 0.01441 mol) was utilized instead of 2.5M n-BuLi (5.81 mL, 0.01452 mol), and chlorotriphenylsilane (4.25 g, 0.01441 mol) was utilized instead of chlorotriphenylsilane (4.27 g, 0.01452 mol) to prepare Compound 15 (6.01 g, yield: 82%).

H-NMR (DMSO-$d_6$): 7.48-7.35 (17H, m), 7.28-7.24 (4H, m), 7.10-7.01 (7H, m), 1.35 (9H, s), m/z: 559.27

2. Manufacture and Evaluation of Light Emitting Element Including Polycyclic Compound Manufacture of Light Emitting Element To manufacture light emitting elements, Example Compounds 2, 7, 12, and 15 and Reference Example Compound R1 were utilized. Example Compounds 2, 7, 12, and 15 are the polycyclic compounds represented by Formula 1 as described above. Reference Example Compound R1 is the compound represented by Formula H-1 as described above.

The structures of Example Compounds 2, 7, 12, and 15, and Reference Example Compound R1 are listed in Table 1:

TABLE 1
Polycyclic compound represented by Formula 1
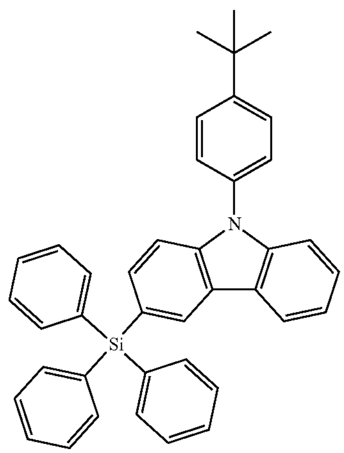
2
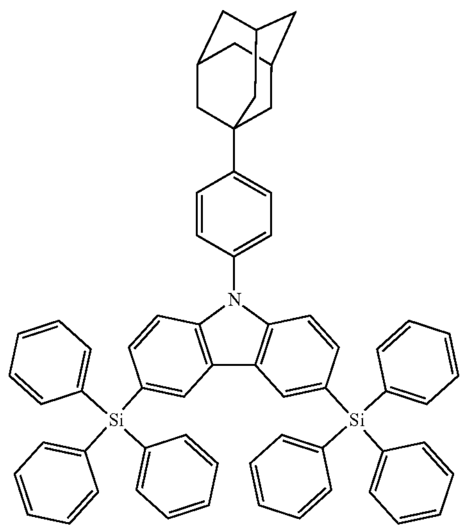
7
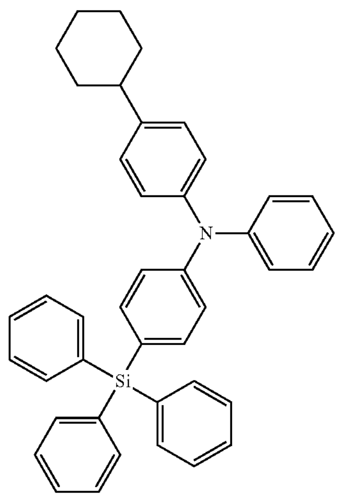
12

TABLE 1-continued

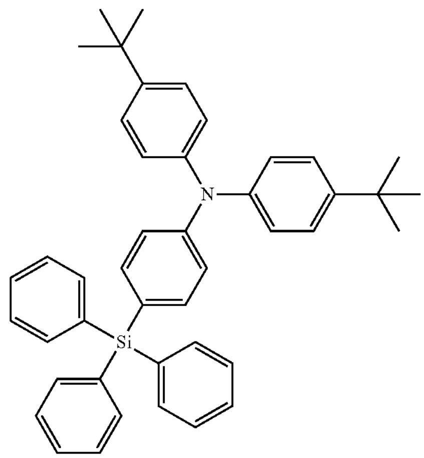

15

Reference Example Compound R1

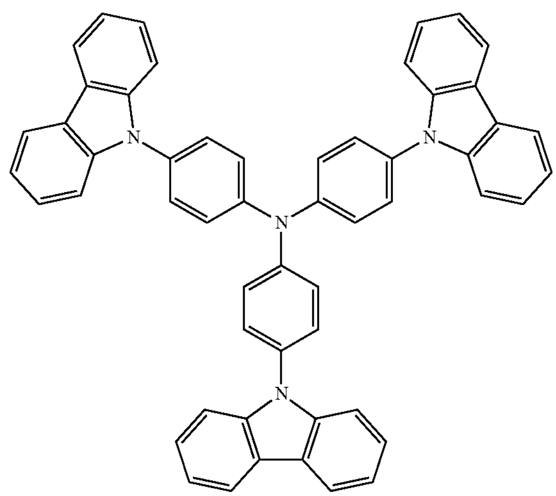

R1

Figure 12A:
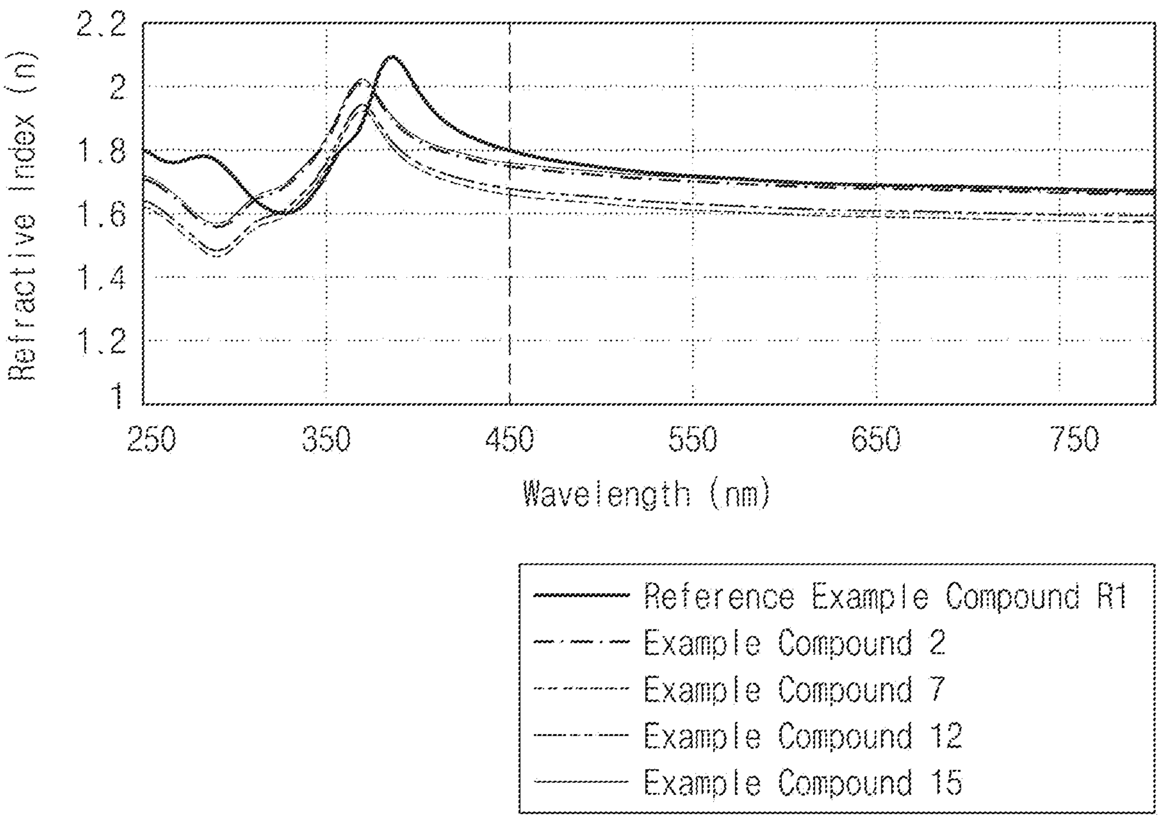
FIG. 12A is a graph showing changes in refractive index of each compound in a wavelength range of visible light.
Figure 12B:
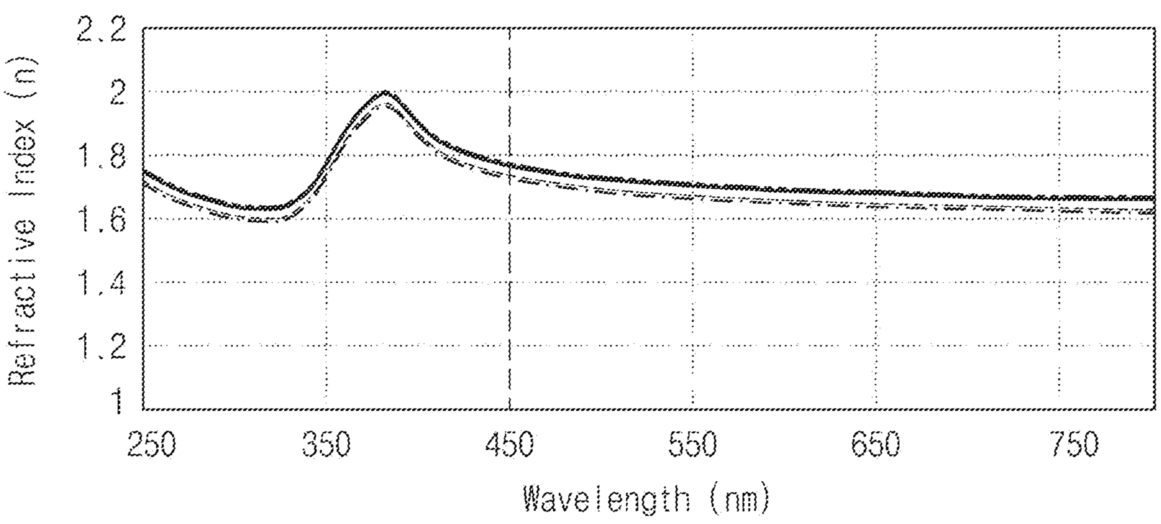
FIG. 12B is a graph showing changes in refractive index of each compound in a wavelength range of visible light.

FIGS. 12A and 12B are graphs showing changes in the refractive index of each compound in a wavelength range of visible light. For example, FIG. 12A shows the refractive indexes of single films that are each composed of Example Compound or the Reference Example Compound. FIG. 12B shows the refractive indexes of mixed films each including Example Compound and Reference Example Compound.

The refractive indexes of single films composed of Example Compounds 2, 7, 12, and 15 and Reference Example Compound R1, respectively, with respect to light having a wavelength of about 450 nm among the refractive indexes shown in FIG. 12A are listed in Table 2:

TABLE 2

| Division | Refractive index of single film |
|---|---|
| Example Compound 2 | 1.75 |
| Example Compound 7 | 1.66 |
| Example Compound 12 | 1.68 |
| Example Compound 15 | 1.76 |
| Reference Example Compound R1 | 1.8 |

Referring to Table 2 and FIG. 12A together, the refractive indexes of single films that are composed of Example Compounds 1 to 4, respectively, with respect to light having a wavelength of about 450 nm satisfy a value of about 1.76 or less. In contrast, the refractive index of single film that is composed of Reference Example Compound R1 is greater than about 1.76. For example, it may be confirmed that Example Compound represented by Formula 1 has a refractive index satisfying a range of about 1.76 or less, and thus is a lower refractive material than Reference Example Compound R1. The hole transport layer of the present disclosure may include, as a hole transport material, the compound represented by Formula H-1 as described above, and may further include, as a low refractive material, Example Compound represented by Formula 1 as described above, thereby having a refractive index of less than about 1.8 while exhibiting high hole transport mobility.

The refractive indexes of mixed films each including Reference Example Compound R1 and any one selected from among Example Compounds 2, 7, 12, and 15 with respect to light having a wavelength of about 450 nm among the refractive indexes shown in FIG. 12B are listed in Table 3:

TABLE 3

| Division | Refractive index of mixed film |
|---|---|
| Example Compound 2 + Reference Example Compound R1 | 1.77 |
| Example Compound 7 + Reference Example Compound R1 | 1.73 |
| Example Compound 12 + Reference Example Compound R1 | 1.74 |
| Example Compound 15 + Reference Example Compound R1 | 1.78 |

Referring to Table 3 and FIG. 12B together, the mixed film including Example Compound represented by Formula 1 as described above and the compound represented by Formula H-1 as described above may have a refractive index satisfying a range of less than about 1.8.

The hole transport layer of the present disclosure may include Example Compound represented by Formula 1 as described above and the compound represented by Formula H-1 as described above to have a refractive index satisfying a range of less than about 1.8, thereby exhibiting excellent or suitable hole transport property.

Hereinafter, to evaluate the degree of improvement in optical characteristics according to the refractive index of the hole transport layer, the mode analysis was performed on the light emitting elements of Examples 1 to 8 and Comparative Example 1.

Manufacture and Evaluation of Light Emitting Element 1

Light emitting elements of Examples 1 to 4 and Comparative Examples 1 to 5 were manufactured.

The light emitting elements of Examples 1 to 4 include a hole transport layer including the polycyclic compound represented by Formula 1 and the compound represented by Formula H-1. The hole transport layer included in each light emitting element of Examples 1 to 4 has a refractive index of less than about 1.8.

The light emitting elements of Comparative Examples 1 to 4 include the polycyclic compound represented by Formula 1 and do not include the compound represented by Formula H-1. The hole transport layer included in each light emitting element of Comparative Example 1 to 4 has a refractive index of less than about 1.8.

The light emitting element of Comparative Example 5 does not include the polycyclic compound represented by Formula 1 and includes the compound represented by Formula H-1. The hole transport layer included in the light emitting element of Comparative Example 5 has a refractive index of about 1.8 or more.

Manufacture of Light Emitting Element 1

An ITO glass substrate was cut to a size of about 50 mm×50 mm×0.5 mm, washed by ultrasonic waves utilizing isopropyl alcohol and distilled water for about 5 minutes, respectively, and then irradiated with ultraviolet rays for about 30 minutes and cleansed by exposing to ozone, and then installed on a vacuum deposition apparatus. Then, a hole injection layer having a thickness of about 50 Å was formed of HATCN, and on the hole injection layer, at least one of Example Compound 2, Example Compound 7, Example Compound 12, Example Compound 15, or Reference Example Compound R1 was utilized to form a hole transport layer having a thickness of about 800 Å.

For example, the hole transport layer of the light emitting element of Example 1 was manufactured by utilizing Example Compound 2 and Reference Example Compound R1. The hole transport layer of the light emitting element of Example 2 was manufactured by utilizing Example Compound 7 and Reference Example Compound R1. The hole transport layer of the light emitting element of Example 3 was manufactured by utilizing Example Compound 12 and Reference Example Compound R1. The hole transport layer of the light emitting element of Example 4 was manufactured by utilizing Example Compound 15 and Reference Example Compound R1. The hole transport layers of the light emitting elements of Comparative Examples 1 to 4 were manufactured by utilizing Example Compound 2, 7, 12, and 15, respectively. The hole transport layer of the light emitting element of Comparative Example 5 was manufactured by utilizing Reference Example Compound R1.

On the upper portion of the hole transport layer, Compound H1 as a host material and Compound D1 as a dopant material were co-deposited at a weight ratio of about 99:1 to form a 100 Å-thick emission layer.

On the upper portion of the emission layer, a hole blocking layer having a thickness of about 50 Å was formed of T2T. Next, Compound E1 and Liq as electron transport layer materials were co-deposited at a weight ratio of about 1:1 to form a 350 Å-thick electron transport layer.

On the upper portion of the electron transport layer, a 10 Å-thick electron injection layer was formed of Yb. Subsequently, Ag and Mg were co-deposited at a weight ratio of about 90:10 to form a 1,000 Å-thick electrode.

Each layer was formed by a vacuum deposition method.

The compounds utilized to manufacture the light emitting elements are shown. The materials were utilized to manufacture the elements by subjecting commercial products to sublimation purification.

Compounds Used to Manufacture Elements

HATCN

TCTA

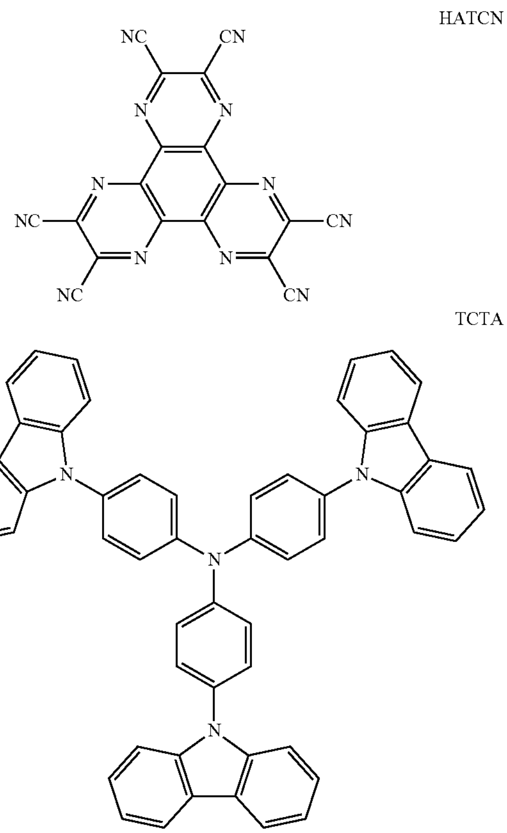

-continued

E1

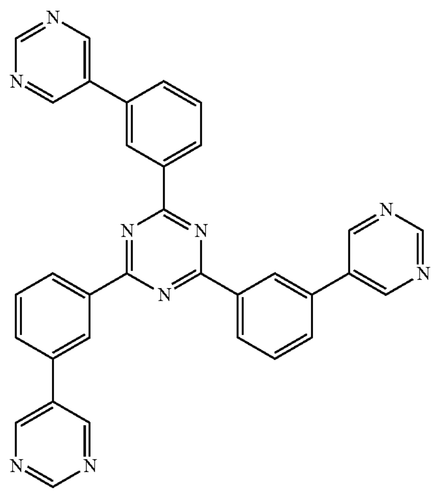

H1

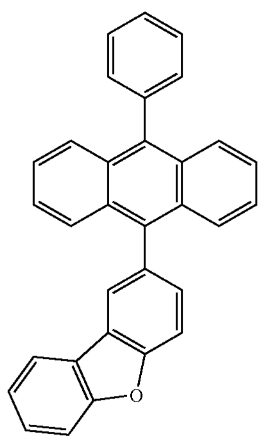

D1

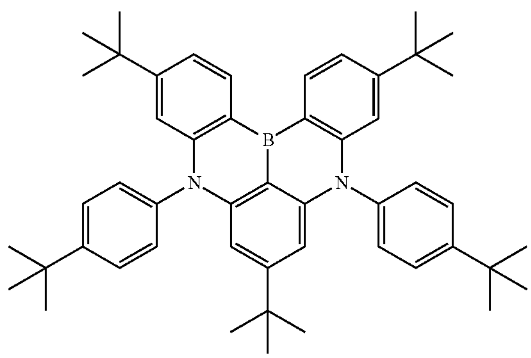

-continued

T2T

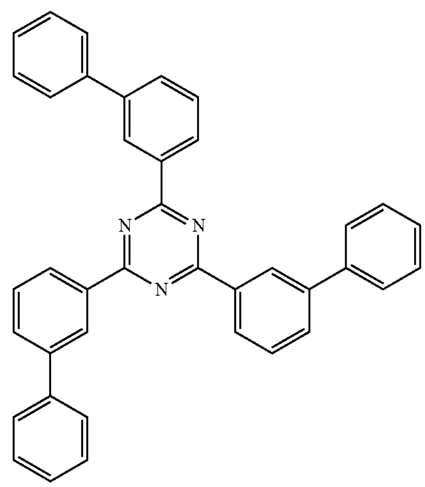

Evaluation of Light Emitting Element Efficiency 1

The mode analysis of the light emitting elements of Examples 1 to 4 and Comparative Examples 1 to 5 was performed, and the results are listed in Table 4. The mode analysis with respect to light having a wavelength of about 450 nm that is emitted from each light emitting element of Examples 1 to 4 and Comparative Examples 1 to 5 was performed by utilizing an in-house optical simulator, and the results are listed in Table 4:

TABLE 4

| Division | Component of hole transport layer | Refractive index of hole transport layer | Out-coupling Efficiency (%) | Absorption Loss (%) | Guided mode + evanescent coupling (%) |
|---|---|---|---|---|---|
| Example 1 | Example Compound 2 + Reference Example Compound R1 | 1.77 | 28 | 30 | 42 |
| Example 2 | Example Compound 7 + Reference Example Compound R1 | 1.73 | 32 | 30 | 38 |
| Example 3 | Example Compound 12 + Reference Example Compound R1 | 1.74 | 30 | 30 | 40 |
| Example 4 | Example Compound 15 + Reference Example Compound R1 | 1.78 | 27 | 30 | 43 |
| Comparative Example 1 | Example Compound 2 | 1.75 | 32 | 30 | 38 |
| Comparative Example 2 | Example Compound 7 | 1.66 | 35 | 30 | 35 |
| Comparative Example 3 | Example Compound 12 | 1.68 | 34 | 30 | 36 |
| Comparative Example 4 | Example Compound 15 | 1.76 | 29 | 30 | 41 |
| Comparative Example 5 | Reference Example Compound R1 | 1.8 | 25 | 32 | 43 |

Referring to the results of Table 4, it may be confirmed that the outcoupling efficiency of each light emitting element of Examples 1 to 4 and Comparative Examples 1 to 4 is higher than the outcoupling efficiency of the light emitting element of Comparative Example 5. This is believed to occur because the refractive index of the hole transport layer included in each light emitting element of Examples 1 to 4 and Comparative Examples 1 to 4 satisfies a range of less than about 1.8, and thus the amount of light, which is lost in the absorption loss, guided mode, and evanescent coupling, in the light emitted from the element is reduced. For example, it may be confirmed that the lower the refractive index of the hole transport layer, the more reduced the amount of light that is lost in the guided mode and evanescent coupling, and thus the higher the outcoupling efficiency.

Evaluation of Light Emitting Element Characteristics 1

Driving voltage, efficiency, and service life of each light emitting element of Examples 1 to 4 and Comparative Examples 1 to 5 were evaluated, and the results are listed in Table 5. In addition, the component and the refractive index of the hole transport layer included in each light emitting element of Examples 1 to 4 and Comparative Examples 1 to 5, and the outcoupling efficiency of the light emitting element as measured in Table 4 are listed together in Table 5.

Each light emitting element of Examples 1 to 4 has the outcoupling efficiency higher than that of each light emitting element of Comparative Examples 1 and 2, and thus the luminous efficiency may be improved (increased).

The driving voltage (V) and efficiency (cd/A) in Table 5 were measured at a current density of 10 $mA/cm^2$ and a brightness of 1,000 $cd/m^2$. Service life ratio was indicated by measuring time for the brightness to be deteriorated to a brightness of 95% with respect to the initial brightness, and listed are relative values when the service life of Comparative Example 5 is 120.

TABLE 5

| Division | Component of hole transport layer | Refractive index of hole transport layer | Out-coupling Efficiency (%) | Driving voltage (V) | Efficiency (cd/A) | Service life ratio (T95) |
|---|---|---|---|---|---|---|
| Example 1 | Example Compound 2 + Reference Example Compound R1 | 1.77 | 28 | 4.0 | 7.8 | 132 |
| Example 2 | Example Compound 7 + Reference Example Compound R1 | 1.73 | 32 | 4.1 | 9.0 | 125 |
| Example 3 | Example Compound 12 + Reference Example Compound R1 | 1.74 | 30 | 4.1 | 8.4 | 122 |
| Example 4 | Example Compound 15 + Reference Example Compound R1 | 1.78 | 27 | 3.9 | 7.6 | 142 |
| Comparative Example 1 | Example Compound 2 | 1.75 | 32 | 4.3 | 9.0 | 53 |
| Comparative Example 2 | Example Compound 7 | 1.66 | 35 | 4.5 | 9.8 | 44 |
| Comparative Example 3 | Example Compound 12 | 1.68 | 34 | 4.4 | 9.5 | 48 |
| Comparative Example 4 | Example Compound 15 | 1.76 | 29 | 4.2 | 8.1 | 68 |
| Comparative Example 5 | Reference Example Compound R1 | 1.8 | 25 | 4.1 | 7 | 120 |

Referring to the results of Table 5, the light emitting elements of Examples 1 to 4 exhibit low driving voltages, high luminous efficiencies, and improved element service lives compared with the light emitting element of Comparative Example 5. In addition, the light emitting elements of Examples 1 to 4 exhibit low driving voltages and improved element service lives compared with Comparative Examples 1 to 4. It is believed that the light emitting elements of Comparative Examples 1 to 4 have the refractive indexes of the hole transport layers satisfying a value of less than about 1.76, and thus exhibit high outcoupling efficiencies and high luminous efficiencies, but do not include the compound, which is a hole transport material, represented by Formula H-1, thereby reducing the element service lives.

The light emitting element of Comparative Example 5 does not include the polycyclic compound, which is a low refractive material, represented by Formula 1 in the hole transport layer. Thus, it is believed that the light emitting element of Comparative Example 5 includes the hole transport layer having a refractive index of greater than about 1.76, the outcoupling efficiency is reduced, and thus the luminous efficiency is reduced.

The hole transport layer of the present disclosure may include the polycyclic compound represented by Formula 1, thereby having a refractive index satisfying a range of about 1.6 to about 1.76, and may include the compound represented by Formula H-1, thereby exhibiting excellent or suitable hole mobility.

The light emitting element of the present disclosure may include the hole transport layer, thereby exhibiting excellent or suitable luminous efficiency and improved service life.

Manufacture and Evaluation of Light Emitting Element 2

Light emitting elements of Examples 5 to 8 and Comparative Example 6 were manufactured.

Each light emitting element of Examples 5 to 8 and Comparative Example 6 has the plurality of light emitting structures OL-B1 and OL-B2 as described above in FIG. 7. For example, each light emitting element of Examples 5 to 8 and Comparative Example 6 includes a first hole transport layer and a second hole transport layer.

Each light emitting element of Examples 5 to 8 includes the polycyclic compound represented by Formula 1 and the compound represented by Formula H-1 in each of the first hole transport layer and the second hole transport layer.

The light emitting element of Comparative Example 6 includes the compound represented by Formula H-1 in each of the first hole transport layer and the second hole transport layer, and does not include the polycyclic compound represented by Formula 1.

Manufacture of Light Emitting Element 2

An ITO glass substrate was cut to a size of about 50 mm×50 mm×0.5 mm, washed by ultrasonic waves utilizing isopropyl alcohol and distilled water for about 5 minutes, respectively, and then irradiated with ultraviolet rays for about 30 minutes and cleansed by exposing to ozone, and then installed on a vacuum deposition apparatus. Then, a first hole injection layer having a thickness of about 50 Å was formed of HATCN, and on the first hole injection layer, at least one of Example Compound 2, Example Compound 7, Example Compound 12, Example Compound 15, or Reference Example Compound R1 was utilized to form a first hole transport layer having a thickness of about 500 Å.

For example, the first hole transport layer of the light emitting element of Example 5 was manufactured by utilizing Example Compound 2 and Reference Example Compound R1. The first hole transport layer of the light emitting element of Example 6 was manufactured by utilizing Example Compound 7 and Reference Example Compound R1. The first hole transport layer of the light emitting element of Example 7 was manufactured by utilizing Example Compound 12 and Reference Example Compound R1. The first hole transport layer of the light emitting element of Example 8 was manufactured by utilizing Example Compound 15 and Reference Example Compound R1. The first hole transport layer of the light emitting element of Comparative Example 6 was manufactured by utilizing Reference Example Compound R1.

On the upper portion of the first hole transport layer, Compound H1 as a host material and Compound D1 as a dopant material were co-deposited at a weight ratio of about 99:1 to form a 200 Å-thick first emission layer.

The first hole blocking layer having a thickness of about 50 Å was formed of T2T on the upper portion of the first emission layer. Next, Compound E1 and Liq as electron transport layer materials were co-deposited at a weight ratio of about 1:1 to form a 250 Å-thick first electron transport layer.

On the upper portion of the first electron transport layer, BPhen and Li were co-deposited at a weight ratio of about 99:1 to form a 50 Å-thick charge generation layer.

On the charge generation layer, a second hole injection layer having a thickness of about 50 Å was formed of HATCN, and on the second hole injection layer, at least one of Example Compound 2, Example Compound 7, Example Compound 12, Example Compound 15, or Reference Example Compound R1 was utilized to form a second hole transport layer having a thickness of about 500 Å.

For example, the second hole transport layer of the light emitting element of Example 5 was manufactured by utilizing Example Compound 2 and Reference Example Compound R1. The second hole transport layer of the light emitting element of Example 6 was manufactured by utilizing Example Compound 7 and Reference Example Compound R1. The second hole transport layer of the light emitting element of Example 7 was manufactured by utilizing Example Compound 12 and Reference Example Compound R1. The second hole transport layer of the light emitting element of Example 8 was manufactured by utilizing Example Compound 15 and Reference Example Compound R1. The second hole transport layer of the light emitting element of Comparative Example 6 was manufactured by utilizing Reference Example Compound R1.

On the upper portion of the second hole transport layer, Compound H1 as a host material and Compound D1 as a dopant material were co-deposited at a weight ratio of about 99:1 to form a 200 Å-thick second emission layer.

On the upper portion of the second emission layer, a second hole blocking layer having a thickness of about 50 Å was formed of T2T. Next, Compound E1 and Liq as electron transport layer materials were co-deposited at a weight ratio of about 1:1 to form a 350 Å-thick second electron transport layer.

On the upper portion of the second electron transport layer, a 10 Å-thick electron injection layer was formed of Yb. Subsequently, Ag and Mg were co-deposited at a weight ratio of about 90:10 to form a 1,000 Å-thick electrode.

Each layer was formed by a vacuum deposition method.

The compounds utilized to manufacture the light emitting elements are shown. The materials were utilized to manufacture the devices by subjecting commercial products to sublimation purification.

Compounds Used to Manufacture Devices

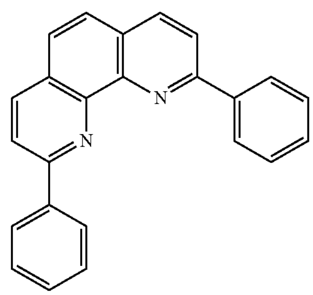

BPhen

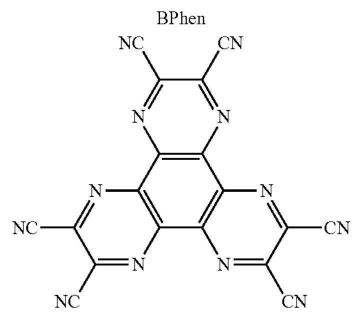

HATCN

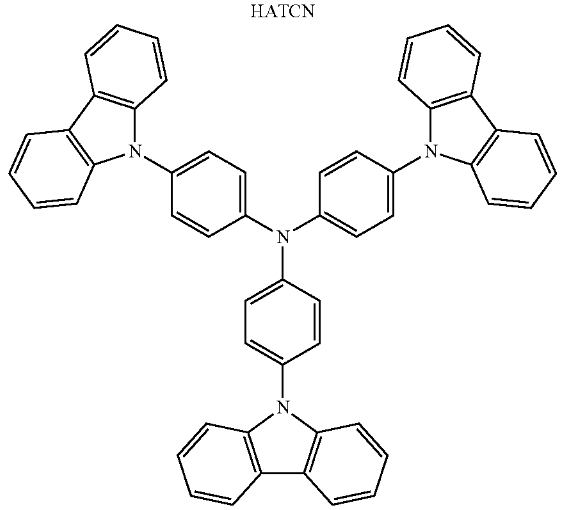

TCTA

-continued

E1

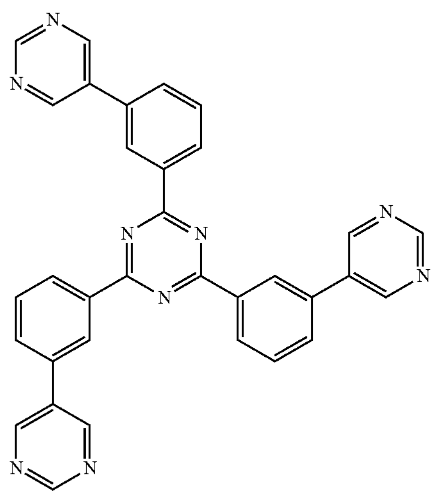

H1

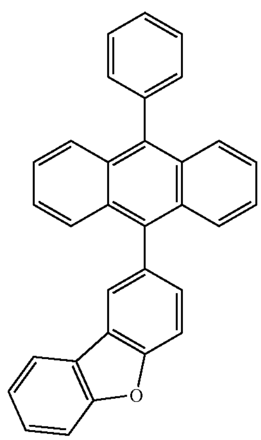

D1

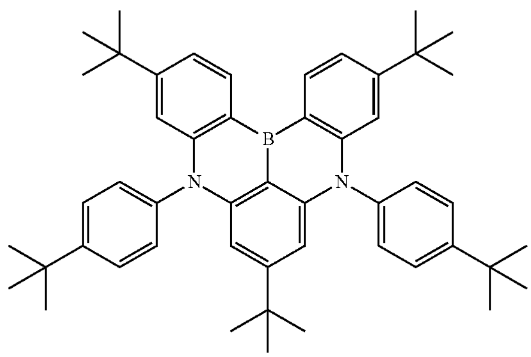

-continued

T2T

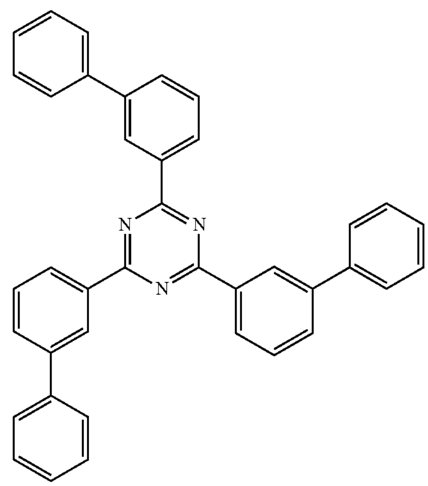

Evaluation of Light Emitting Element Efficiency and Characteristics 2

The results of the mode analysis of the light emitting elements of Examples 5 to 8 and Comparative Example 6 and the evaluation results of element characteristics are listed in Table 6. The mode analysis with respect to light having a wavelength of about 450 nm that is emitted from each light emitting element of Examples 5 to 8 and Comparative Example 6 was performed by utilizing an in-house optical simulator, and the outcoupling efficiency (%) values are listed in Table 6. In some embodiments, driving voltage, efficiency, and service life of each light emitting element of Examples 5 to 8 and Comparative Example 6 were evaluated, and the results are listed in Table 6. The components and refractive indexes of the first and second hole transport layers included in the light emitting elements of Examples 5 to 8 and Comparative Example 6 are listed together in Table 6.

As described above in (Manufacture of Light Emitting Element 2), the components of the first and second hole transport layers in the light emitting elements of Examples 5 to 8 and Comparative Example 6 may each independently be the same as each other.

The driving voltage (V) and efficiency (cd/A) in Table 6 were measured at a current density of 10 mA/cm$^2$ and a brightness of 1,000 cd/m$^2$. Service life ratio was indicated by measuring time for the brightness to be deteriorated to a brightness of 95% with respect to the initial brightness, and listed are relative values when the service life of Comparative Example 5 in Table 5 is 120.

TABLE 6

| Division | Component of each of first and second hole transport layers | Refractive index of each of first and second hole transport layers | Out-coupling Efficiency (%) | Driving voltage (V) | Efficiency (cd/A) | Service life ratio (T95) |
|---|---|---|---|---|---|---|
| Example 5 | Example Compound 2 + Reference Example | 1.77 | 28 | 7.9 | 13.3 | 198 |

TABLE 6-continued

| Division | Component of each of first and second hole transport layers | Refractive index of each of first and second hole transport layers | Out-coupling Efficiency (%) | Driving voltage (V) | Efficiency (cd/A) | Service life ratio (T95) |
|---|---|---|---|---|---|---|
| Example 6 | Compound R1 Example Compound 7 + Reference Example Compound R1 | 1.73 | 32 | 8.0 | 15.2 | 185 |
| Example 7 | Example Compound 12 + Reference Example Compound R1 | 1.74 | 30 | 8.0 | 14.3 | 178 |
| Example 8 | Example Compound 15 + Reference Example Compound R1 | 1.78 | 27 | 7.8 | 12.9 | 202 |
| Comparative Example 5 | Reference Example Compound R1 | 1.8 | 25 | 8.0 | 11.9 | 170 |

Referring to the results of Table 6, it may be seen that the outcoupling efficiency of each light emitting element of Examples 5 to 8 is higher than that of the light emitting element of Comparative Example 6. This is believed to occur because the refractive indexes of the first and second hole transport layers included in each light emitting element of Examples 1 to 8 and Comparative Examples 1 to 4 satisfy a range of less than about 1.8, and thus the amount of light, which is lost in the absorption loss, guided mode, and evanescent coupling, in the light emitted from the element is reduced. For example, it may be confirmed that the lower the refractive index of the hole transport layer, the more reduced the amount of light that is loss in the guided mode and evanescent coupling, and thus the higher the outcoupling efficiency. In some embodiments, the light emitting elements of Examples 5 to 8 exhibit low driving voltages, high luminous efficiencies, and improved element service lives compared with the light emitting element of Comparative Example 6. In some embodiments, the light emitting elements of Examples 1 to 4 exhibit improved driving voltages, high efficiencies, and long service lives compared with Comparative Examples 1 to 4.

The light emitting element of Comparative Example 6 does not include the polycyclic compound, which is a low refractive material, represented by Formula 1 in the first and second hole transport layers. Thus, it is believed that each refractive index of the first and second hole transport layers of the light emitting element of Comparative Example 6 is greater than about 1.76, the outcoupling efficiency is reduced, and thus the luminous efficiency is reduced.

The hole transport layer of the present disclosure may include the polycyclic compound represented by Formula 1, thereby having a refractive index satisfying a range of about 1.6 to about 1.76, and may include the compound represented by Formula H-1, thereby exhibiting excellent or suitable hole mobility.

The light emitting element of the present disclosure may include the hole transport layer, thereby exhibiting excellent or suitable luminous efficiency and improved service life.

The light emitting element of an embodiment may exhibit improved element characteristics with high efficiency and a long service life.

The polycyclic compound of an embodiment may be included in a hole transport layer of the light emitting element to contribute to high efficiency and a long service life of the light emitting element.

The use of "may" when describing embodiments of the present disclosure refers to "one or more embodiments of the present disclosure."

As used herein, the term "substantially," "about," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this disclosure is intended to include all higher numerical limitations subsumed therein. Accordingly, Applicant reserves the right to amend this disclosure, including the claims, to expressly recite any sub-range subsumed within the ranges expressly recited herein.

The display device or any other relevant devices or components according to embodiments of the present disclosure described herein may be implemented utilizing any suitable hardware, firmware (e.g., an application-specific integrated circuit), software, or a combination of software, firmware, and hardware. For example, the various components of the device may be formed on one integrated circuit (IC) chip or on separate IC chips. Further, the various components of the device may be implemented on a flexible printed circuit film, a tape carrier package (TCP), a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the embodiments of the present disclosure.

Although the embodiments of the present disclosure have been described, it is understood that the present disclosure should not be limited to these embodiments, but one or more suitable changes and modifications can be made by one ordinary skilled in the art within the spirit and scope of the present disclosure as defined by the following claims and equivalents thereof.

What is claimed is:

1. A light emitting element comprising:

a first electrode;

a first hole transport region on the first electrode;

a first emission layer on the first hole transport region;

a first electron transport region on the first emission layer; and a second electrode on the first electron transport region, wherein the first hole transport region comprises a polycyclic compound represented by Formula 1 and a compound represented by Formula H-1:

Formula 1

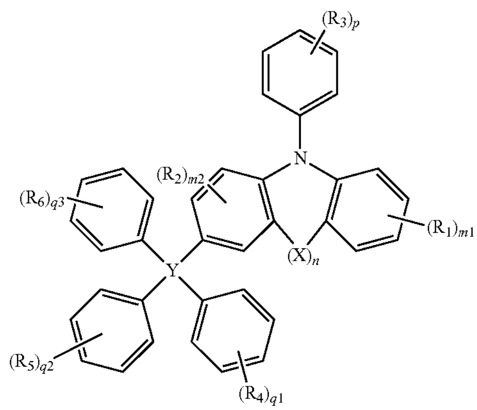

wherein, in Formula 1,

X is a direct linkage,

Y is C or Si, $R_1$ to $R_6$ are each independently a hydrogen atom, a deuterium atom, a halogen atom, a substituted or unsubstituted silyl group, a substituted or unsubstituted amine group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, and/or are bonded to an adjacent group to form a ring, at least one $R_3$ is a hydrogen atom or a saturated aliphatic hydrocarbon group having 1 to 20 carbon atoms, n is 0 or 1, m1 is an integer from 0 to 5 when m1+n is 5 or less, m2 is an integer from 0 to 4 when m2+n is 4 or less, p is an integer from 0 to 5, and q1 to q3 are each independently an integer from 0 to 5, wherein, when n is 1, Y is Si, each of $R_2$ and $R_4$ to $R_6$ is a hydrogen atom, and $R_1$ is an unsubstituted triphenylsilyl group, then $R_3$ is not a hydrogen atom, and wherein, when n is 1 and Y is Si and $R_1$ is a phenyl group, then the phenyl group is unsubstituted:

Formula H-1

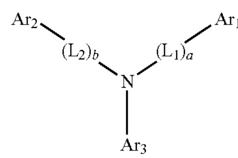

wherein, in Formula H-1, $Ar_1$ and $Ar_2$ are each independently a substituted or unsubstituted aryl group having 6 to 30 ring-forming carbon atoms, or a substituted or unsubstituted heteroaryl group having 2 to 30 ring-forming carbon atoms, and $Ar_3$ is a substituted or unsubstituted aryl group having 6 to 30 ring-forming carbon atoms, $L_1$ and $L_2$ are each independently a direct linkage, a substituted or unsubstituted arylene group having 6 to 30 ring-forming carbon atoms, or a substituted or unsubstituted heteroarylene group having 2 to 30 ring-forming carbon atoms, and a and b are each independently an integer from 0 to 10.

2. The light emitting element of claim 1, wherein $R_3$ is a hydrogen atom, a substituted or unsubstituted t-butyl group, a substituted or unsubstituted cycloalkyl group having 1 to 20 carbon atoms, or a substituted or unsubstituted adamantyl group.

3. The light emitting element of claim 1, wherein the polycyclic compound represented by Formula 1 is represented by Formula 2:

Formula 2

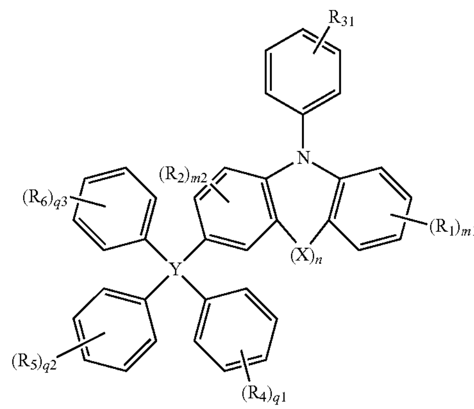

wherein, in Formula 2, $R_{31}$ is a hydrogen atom or a saturated aliphatic hydrocarbon group having 1 to 20 carbon atoms, and in Formula 2, X, Y, $R_1$, $R_2$, $R_4$ to $R_6$, n, m1, m2, and q1 to q3 are the same as defined in Formula 1.

4. The light emitting element of claim 3, wherein the polycyclic compound represented by Formula 2 is represented by Formula 2-1:

Formula 2-1

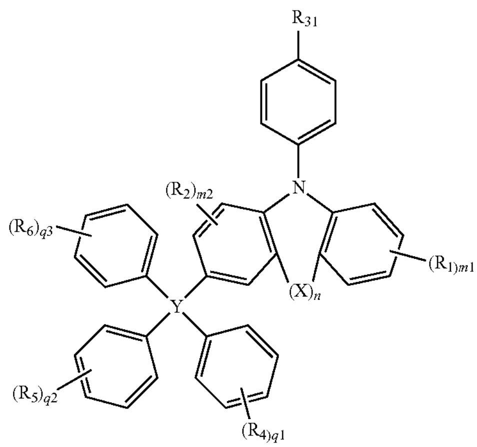

wherein, in Formula 2-1, X, Y, $R_1$, $R_2$, $R_4$ to $R_6$, n, m1, m2, and q1 to q3 are the same as defined in Formula 1, and $R_{31}$ is the same as defined in Formula 2.

5. The light emitting element of claim 3, wherein $R_{31}$ is a hydrogen atom, a substituted or unsubstituted t-butyl group, a substituted or unsubstituted cyclohexyl group, or a substituted or unsubstituted adamantyl group.

6. The light emitting element of claim 1, wherein the polycyclic compound represented by Formula 1 is represented by Formula 3-1 or Formula 3-2:

Formula 3-1

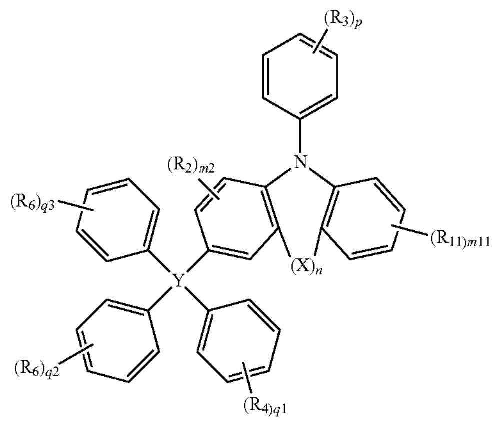

-continued

Formula 3-2

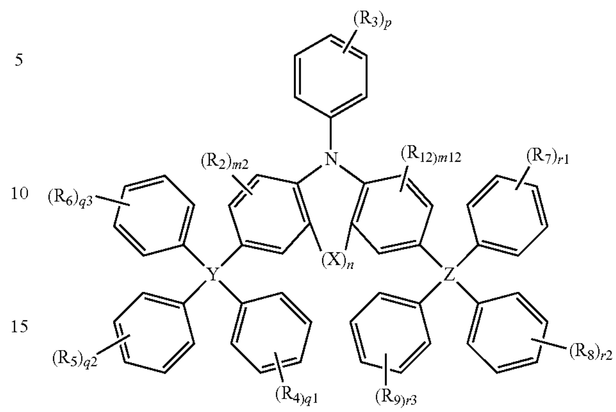

wherein, in Formula 3-1 and Formula 3-2,

Z is C or Si, $R_{11}$ and $R_{12}$ are each independently a hydrogen atom or a saturated aliphatic hydrocarbon group having 1 to 20 carbon atoms, $R_7$ to $R_9$ are each independently a hydrogen atom, a deuterium atom, a halogen atom, a substituted or unsubstituted silyl group, a substituted or unsubstituted amine group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, and/or are bonded to an adjacent group to form a ring, m11 is an integer from 0 to 5 when m11+n is 5 or less, m12 is an integer from 0 to 4 when m12+n is 4 or less, r1 to r3 are each independently an integer from 0 to 5, and in Formula 3-1 and Formula 3-2, X, Y, $R_1$ to $R_6$, n, m2, p, and q1 to q3 are the same as defined in Formula 1.

7. The light emitting element of claim 6, wherein the polycyclic compound represented by Formula 1 is represented by any one selected from among Formula 4-1 to Formula 4-6:

Formula 4-1

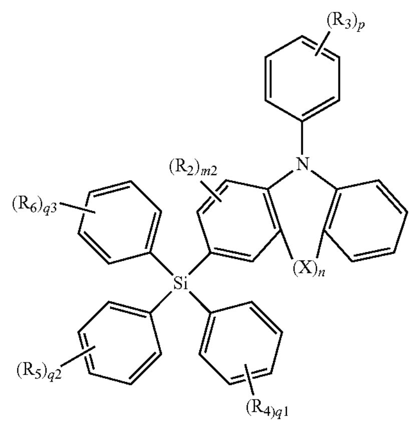

-continued

Formula 4-2

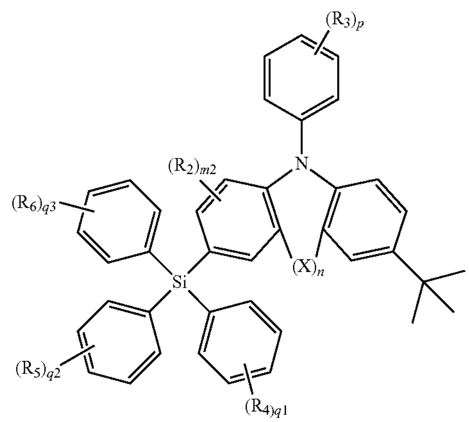

Formula 4-3

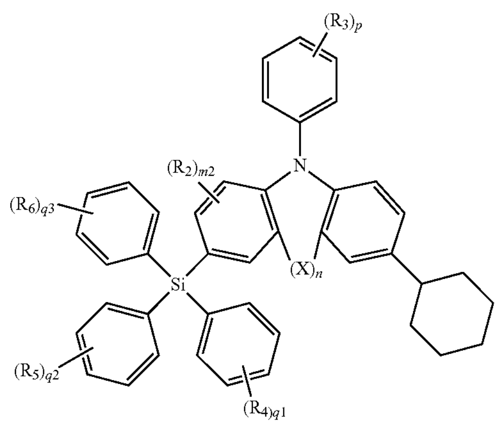

Formula 4-4

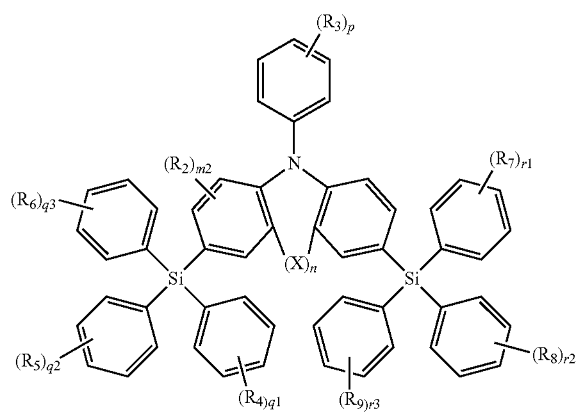

-continued

Formula 4-5

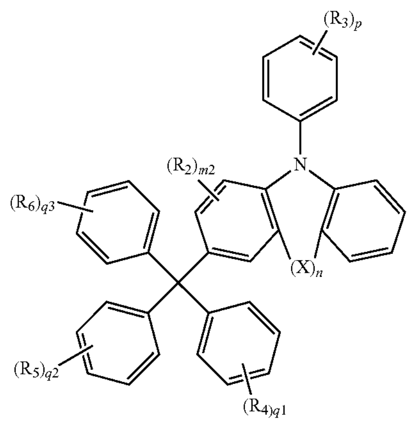

Formula 4-6

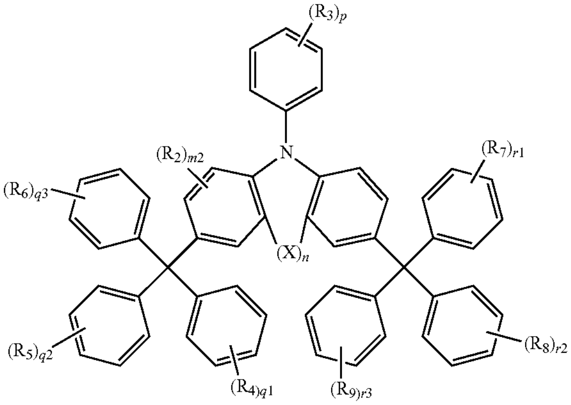

wherein, in Formula 4-1 to Formula 4-6, X, $R_2$ to $R_9$, n, m2, p, q1 to q3, and r1 to r3 are the same as defined in Formula 1, Formula 3-1, and Formula 3-2.

8. The light emitting element of claim 7, wherein each of $R_2$ to $R_9$ is a hydrogen atom.

9. The light emitting element of claim 1, wherein the polycyclic compound represented by Formula 1 is represented by one selected from among compounds in Compound Group 1:

Compound Group 1

1

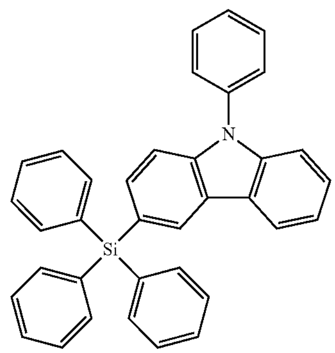

-continued
2
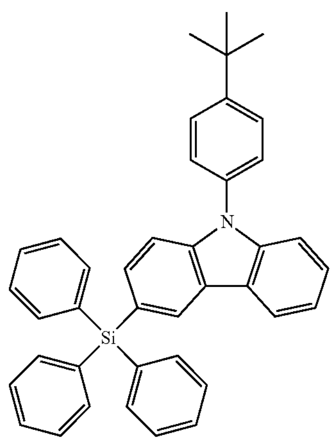
3
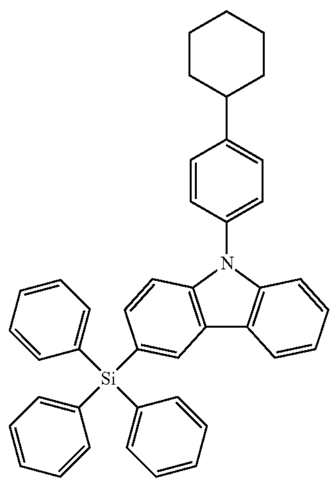
4
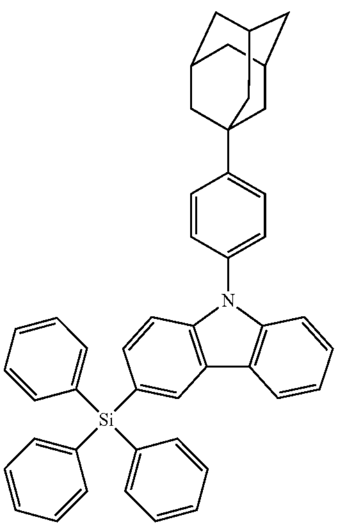
-continued
5
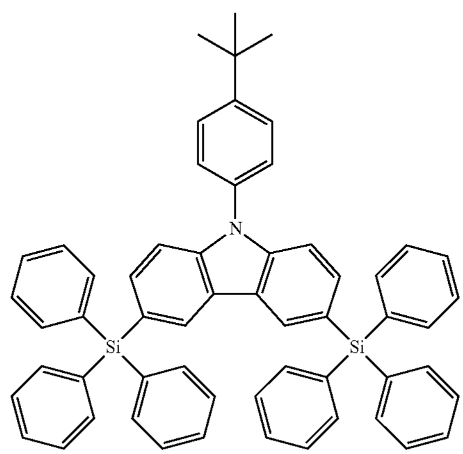
6
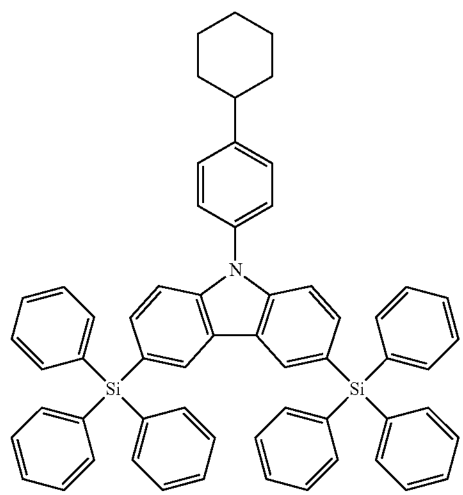
7
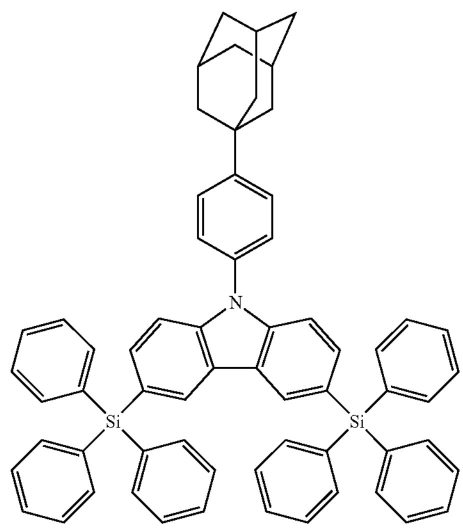

-continued
8
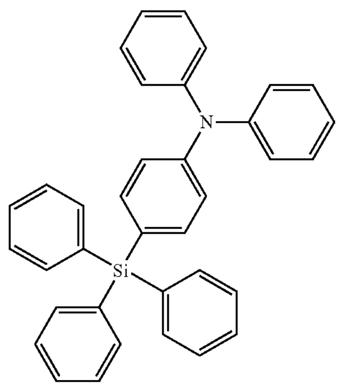
9
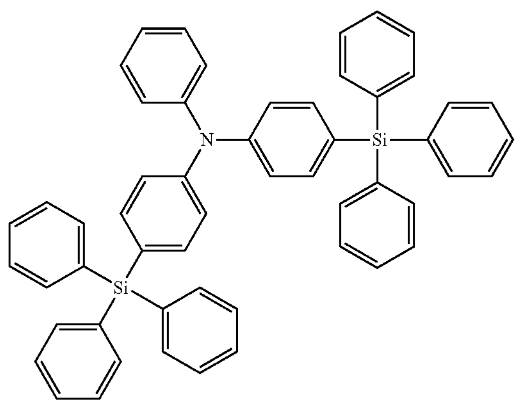
10
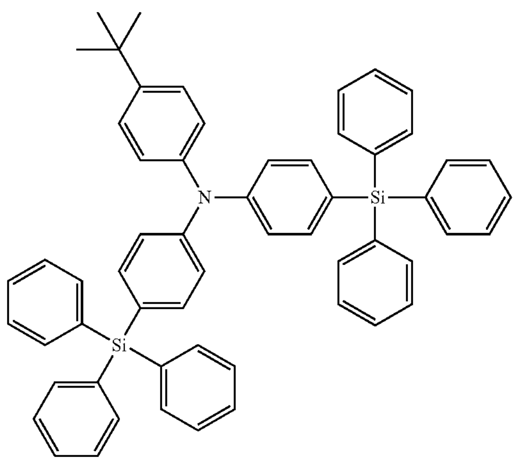
-continued
11
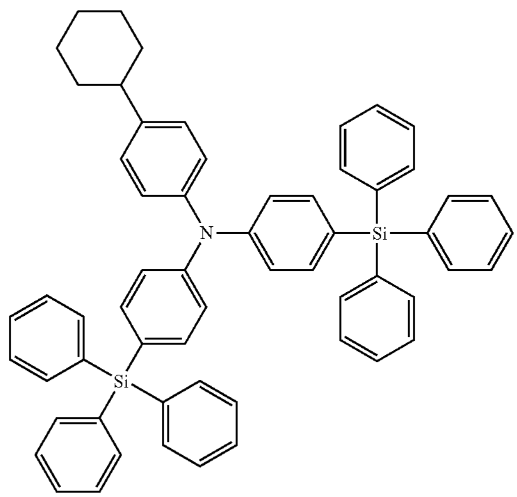
12
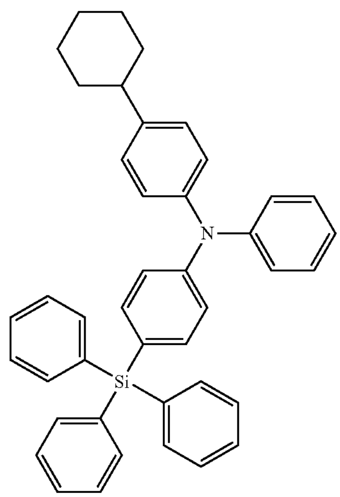
13
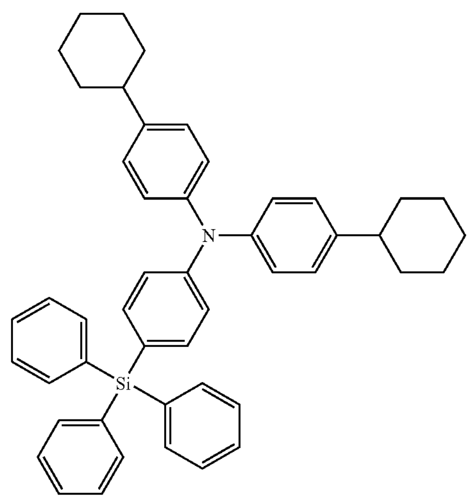

-continued
14
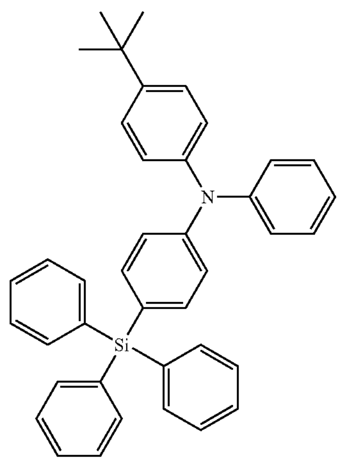
15
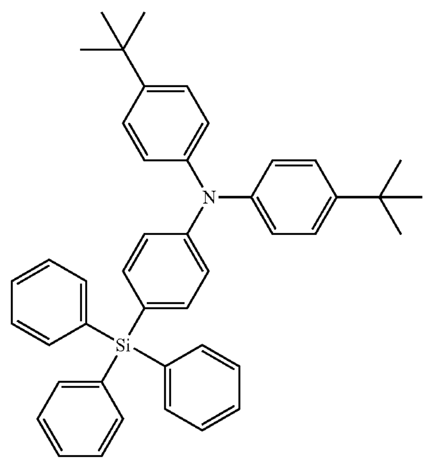
16
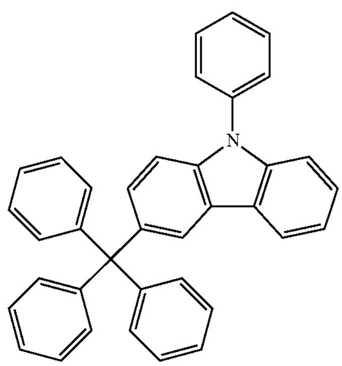
-continued
17
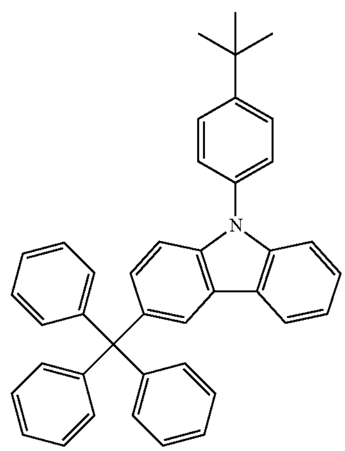
18
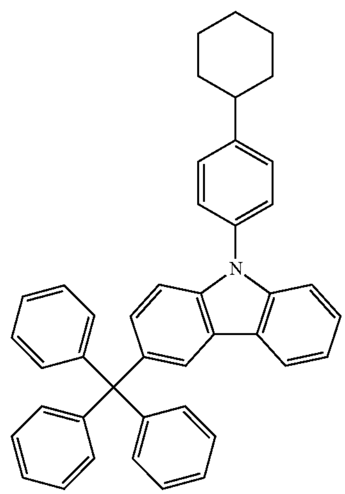
19
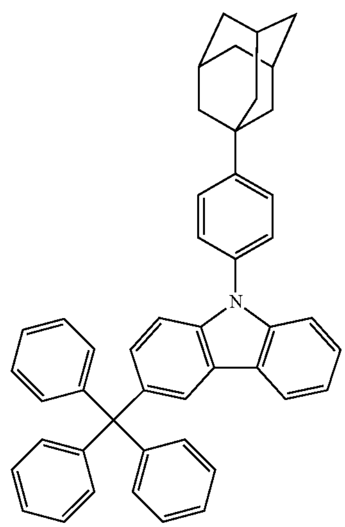

-continued
20
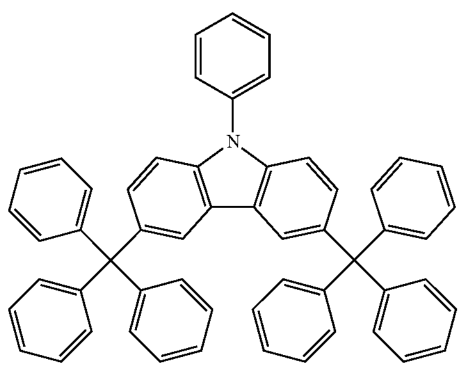
21
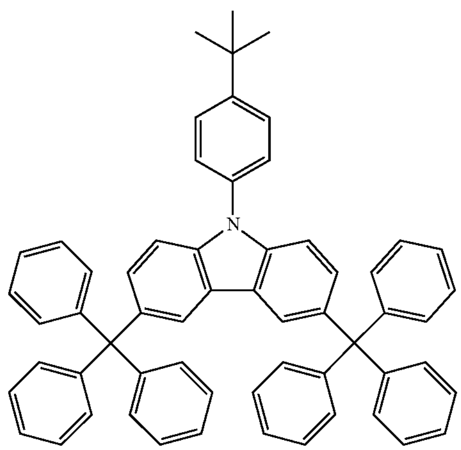
22
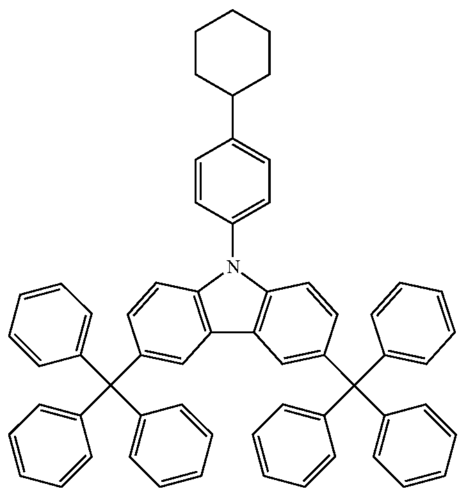
-continued
23
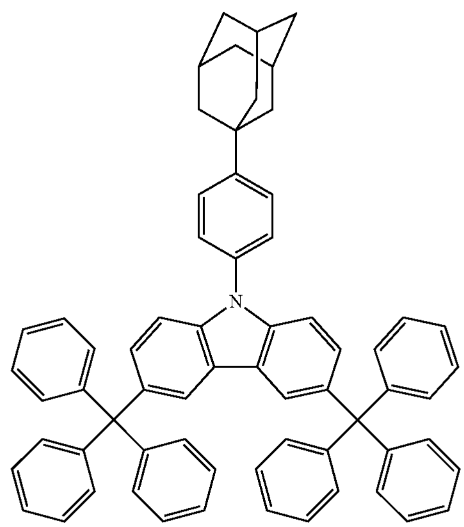
24
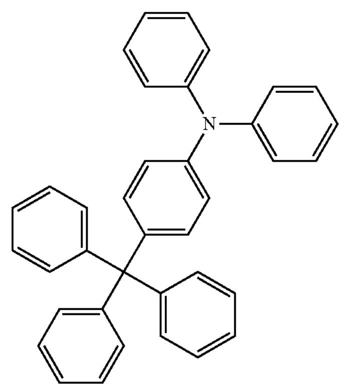
25
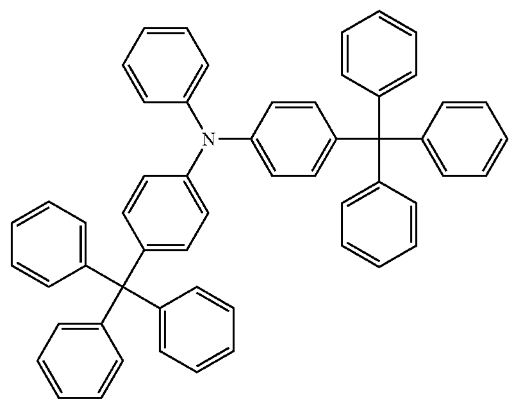

-continued

26

27

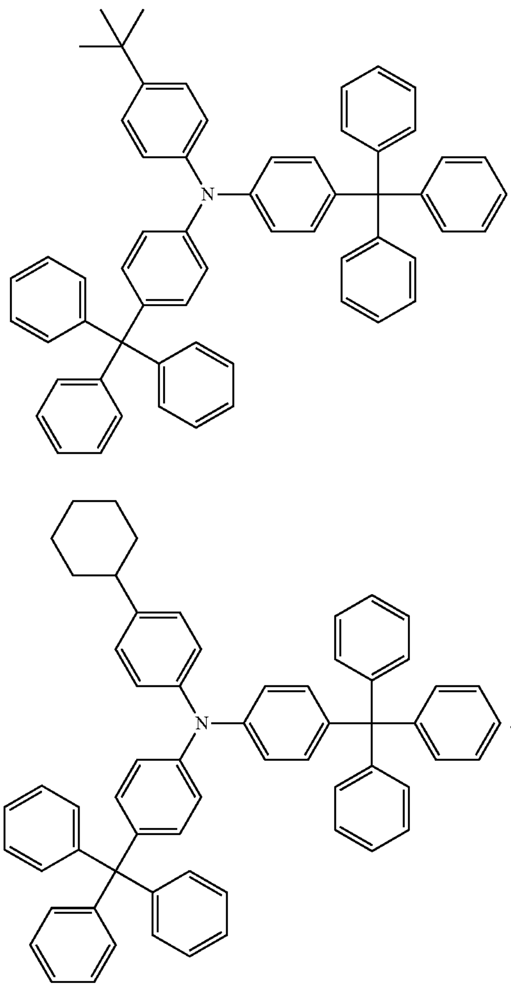

10. The light emitting element of claim 1, wherein the first hole transport region comprises a hole injection layer on the first electrode, a hole transport layer on the hole injection layer, and an electron blocking layer on the hole transport layer, and the hole transport layer comprises the polycyclic compound represented by Formula 1.

11. The light emitting element of claim 10, wherein the hole transport layer has a thickness of about 250 Å or more.

12. The light emitting element of claim 10, wherein the hole transport layer has a refractive index of less than about 1.8.

13. The light emitting element of claim 1, wherein the first emission layer is configured to emit light having a center wavelength of about 430 nm to about 470 nm.

14. The light emitting element of claim 1, further comprising:

a second hole transport region between the first electron transport region and the second electrode;

a second emission layer between the second hole transport region and the second electrode; and a second electron transport region between the second emission layer and the second electrode, wherein the second hole transport region comprises the polycyclic compound represented by Formula 1.

15. The light emitting element of claim 14, wherein the second hole transport region further comprises a compound represented by Formula H-1:

Formula H-1

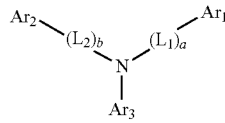

wherein, in Formula H-1, $Ar_1$ and $Ar_2$ are each independently a substituted or unsubstituted aryl group having 6 to 30 ring-forming carbon atoms, or a substituted or unsubstituted heteroaryl group having 2 to 30 ring-forming carbon atoms, $Ar_3$ is a substituted or unsubstituted aryl group having 6 to 30 ring-forming carbon atoms, $L_1$ and $L_2$ are each independently a direct linkage, a substituted or unsubstituted arylene group having 6 to 30 ring-forming carbon atoms, or a substituted or unsubstituted heteroarylene group having 2 to 30 ring-forming carbon atoms, and a and b are each independently an integer from 0 to 10.

16. A polycyclic compound represented by Formula 1:

Formula 1

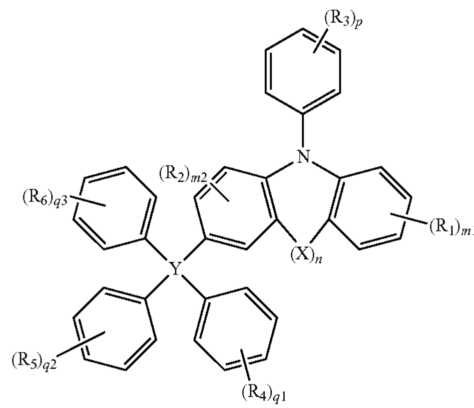

wherein, in Formula 1,

X is a direct linkage,

Y is C or Si, $R_1$ to $R_6$ are each independently a hydrogen atom, a deuterium atom, a halogen atom, a substituted or unsubstituted silyl group, a substituted or unsubstituted amine group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, and/or are bonded to an adjacent group to form a ring, at least one $R_3$ is a hydrogen atom or a saturated aliphatic hydrocarbon group having 1 to 20 carbon atoms, n is 0 or 1, m1 is an integer from 0 to 5 when m1+n is 5 or less, m2 is an integer from 0 to 4 when m2+n is 4 or less, p is an integer from 0 to 5, and q1 to q3 are each independently an integer from 0 to 5, and wherein, when n is 1, Y is Si, each of $R_2$ and $R_4$ to $R_6$ is a hydrogen atom, and $R_1$ is an unsubstituted triphenylsilyl group, then $R_3$ is not a hydrogen atom, and wherein, when n is 1 and Y is Si and $R_1$ is a phenyl group, then the phenyl group is unsubstituted.

17. The polycyclic compound of claim 16, wherein the polycyclic compound represented by Formula 1 has a refractive index of about 1.6 to about 1.76.

18. The polycyclic compound of claim 16, wherein the polycyclic compound represented by Formula 1 is represented by Formula 2:

Formula 2

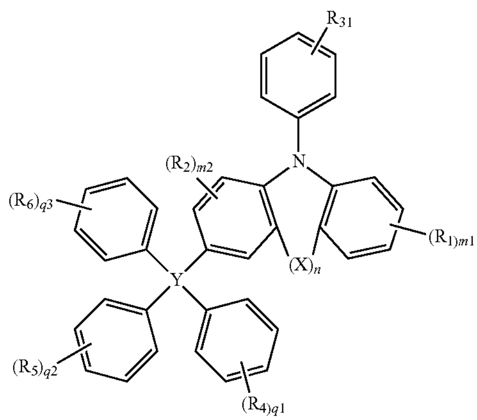

wherein, in Formula 2, $R_{31}$ is a hydrogen atom or a saturated aliphatic hydrocarbon group having 1 to 20 carbon atoms, and in Formula 2, X, Y, $R_1$, $R_2$, $R_4$ to $R_6$, n, m1, m2, and q1 to q3 are the same as defined in Formula 1.

19. The polycyclic compound of claim 16, wherein the polycyclic compound represented by Formula 1 is represented by Formula 3-1 or Formula 3-2:

Formula 3-1

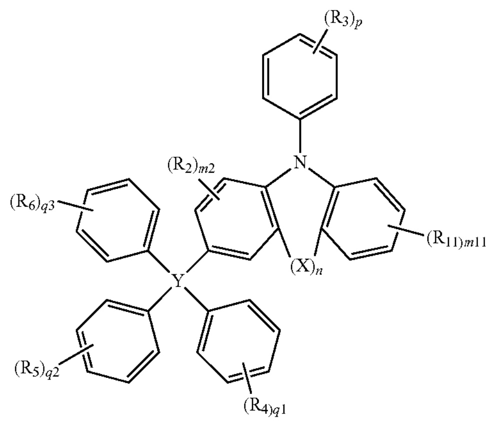

-continued

Formula 3-2

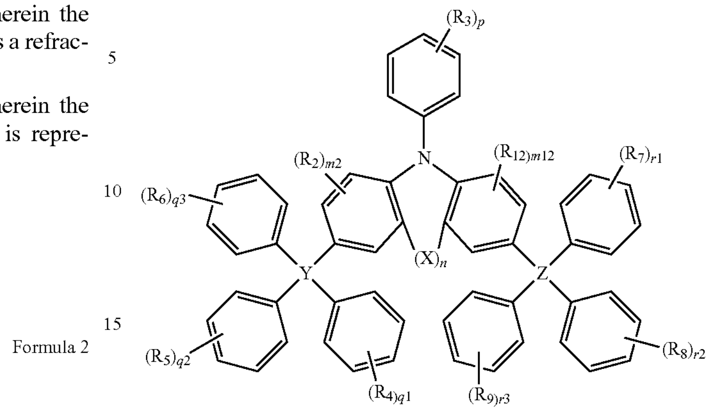

wherein, in Formula 3-1 and Formula 3-2,

Z is C or Si, $R_{11}$ and $R_{12}$ are each independently a hydrogen atom or a saturated aliphatic hydrocarbon group having 1 to 20 carbon atoms, $R_7$ to $R_9$ are each independently a hydrogen atom, a deuterium atom, a halogen atom, a substituted or unsubstituted silyl group, a substituted or unsubstituted amine group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, and/or are bonded to an adjacent group to form a ring, m11 is an integer from 0 to 5 when m11+n is 5 or less, m12 is an integer from 0 to 4 when m12+n is 4 or less, r1 to r3 are each independently an integer from 0 to 5, and in Formula 3-1 and Formula 3-2, X, Y, $R_1$ to $R_6$, n, m2, p, and q1 to q3 are the same as defined in Formula 1.

20. A display device comprising a plurality of light emitting elements, wherein each of the plurality of light emitting elements comprises:

a first electrode;

a hole transport region on the first electrode;

an emission layer on the hole transport region;

an electron transport region on the emission layer; and a second electrode on the electron transport region, wherein the hole transport region comprises a polycyclic compound represented by Formula 1 and a compound represented by Formula H-1:

Formula 1

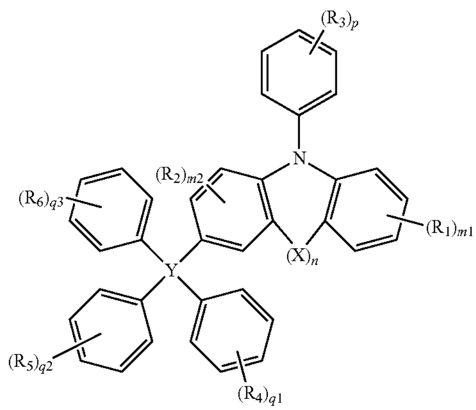

wherein, in Formula 1,

X is a direct linkage,

Y is C or Si, $R_1$ to $R_6$ are each independently a hydrogen atom, a deuterium atom, a halogen atom, a substituted or unsubstituted silyl group, a substituted or unsubstituted amine group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, and/or are bonded to an adjacent group to form a ring, at least one $R_3$ is a hydrogen atom or a saturated aliphatic hydrocarbon group having 1 to 20 carbon atoms, n is 0 or 1, m1 is an integer from 0 to 5 when m1+n is 5 or less, m2 is an integer from 0 to 4 when m2+n is 4 or less, p is an integer from 0 to 5, q1 to q3 are each independently an integer from 0 to 5, and wherein, when n is 1, Y is Si, each of $R_2$ and $R_4$ to $R_6$ is a hydrogen atom, and $R_1$ is an unsubstituted triphenylsilyl group, then $R_3$ is not a hydrogen atom, and wherein, when n is 1 and Y is Si and $R_1$ is a phenyl group, then the phenyl group is unsubstituted:

[Formula H-1]

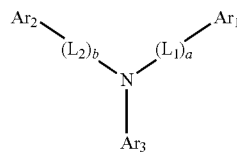

wherein, in Formula H-1, $Ar_1$ and $Ar_2$ are each independently a substituted or unsubstituted aryl group having 6 to 30 ring-forming carbon atoms, or a substituted or unsubstituted heteroaryl group having 2 to 30 ring-forming carbon atoms, $Ar_3$ is a substituted or unsubstituted aryl group having 6 to 30 ring-forming carbon atoms, $L_1$ and $L_2$ are each independently a direct linkage, a substituted or unsubstituted arylene group having 6 to 30 ring-forming carbon atoms, or a substituted or unsubstituted heteroarylene group having 2 to 30 ring-forming carbon atoms, and a and b are each independently an integer from 0 to 10.

21. The display device of claim 20, wherein the hole transport region comprises a hole injection layer on the first electrode, a hole transport layer on the hole injection layer, and an electron blocking layer on the hole transport layer, and the hole transport layer comprises the polycyclic compound represented by Formula 1.

22. The display device of claim 21, wherein the hole transport layer has a thickness of about 250 Å or more.

23. The display device of claim 21, wherein the hole transport layer has a refractive index of less than about 1.8.

24. The display device of claim 21, wherein at least one selected from among the plurality of light emitting elements is configured to emit light having a center wavelength of about 430 nm to about 470 nm.

* * * * *